United States Patent
Shino et al.

(10) Patent No.: US 7,609,551 B2
(45) Date of Patent: Oct. 27, 2009

(54) SEMICONDUCTOR MEMORY DEVICE

(75) Inventors: Tomoaki Shino, Kawasaki (JP); Akihiro Nitayama, Yokohama (JP); Takeshi Hamamoto, Yokohama (JP); Hideaki Aochi, Kawasaki (JP); Takashi Ohsawa, Yokohama (JP); Ryo Fukuda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 187 days.

(21) Appl. No.: 11/860,956

(22) Filed: Sep. 25, 2007

(65) Prior Publication Data

US 2008/0237695 A1   Oct. 2, 2008

(30) Foreign Application Priority Data

Sep. 29, 2006   (JP) .............................. 2006-268769

(51) Int. Cl.
   *G11C 14/00* (2006.01)
   *G11C 16/04* (2006.01)
(52) U.S. Cl. .............. 365/185.08; 365/149; 365/185.01
(58) Field of Classification Search ............. 365/185.08
   See application file for complete search history.

(56) References Cited

U.S. PATENT DOCUMENTS

| | | | |
|---|---|---|---|
| 6,538,916 B2 | 3/2003 | Ohsawa | |
| 6,845,034 B2 * | 1/2005 | Bhattacharyya | 365/149 |
| 6,888,200 B2 * | 5/2005 | Bhattacharyya | 257/348 |
| 6,903,969 B2 * | 6/2005 | Bhattacharyya | 365/185.08 |

FOREIGN PATENT DOCUMENTS

| | | |
|---|---|---|
| JP | 5-299616 | 11/1993 |
| JP | 9-97851 | 4/1997 |
| JP | 2002-246571 | 8/2002 |
| JP | 2002-353342 | 12/2002 |
| JP | 2006-108309 | 4/2006 |
| JP | 2008-511947 | 4/2008 |
| WO | WO 2006/026159 A1 | 3/2006 |

OTHER PUBLICATIONS

Chang Woo Oh et al, "A Novel Multi-Functional Silicon-On-ONO (SOONO) MOSFETs for SoC applications: Electrical Characterization for High Performance Transistor and Embeded Memory Applications", 2006 Symposium on VLSI Technology, Digest of Technical Papers, IEEE, Jun. 13-15, 2006, pp. 58-59 and cover page.

* cited by examiner

*Primary Examiner*—Son L Mai
(74) *Attorney, Agent, or Firm*—Oblon, Spivak, McClelland, Maier & Neustadt, L.L.P.

(57) ABSTRACT

This disclosure concerns a memory comprising a charge trapping film; a gate insulating film; a back gate on the charge trapping film; a front gate on the gate insulating film; and a body region provided between a drain and a source, wherein the memory includes a first storage state for storing data depending on the number of majority carriers in the body region and a second storage state for storing data depending on the amount of charges in the charge trapping film, and the memory is shifted from the first storage state to the second storage state by converting the number of majority carriers in the body region into the amount of charges in the charge trapping film or from the second storage state to the first storage state by converting the amount of charges in the charge trapping film into the number of majority carriers in the body region.

20 Claims, 69 Drawing Sheets

100

FIRST EMBODIMENT

SECOND EMBODIMENT

SEVENTH EMBODIMENT

EIGHTH EMBODIMENT

NINTH EMBODIMENT

TENTH EMBODIMENT

SEQUENTIAL SAVE MODE

SEQUENTIAL RETURN MODE

SEQUENTIAL RETURN MODE

FIG. 73 ERASE MODE

SEQUENTIAL SAVE MODE

FIG. 76 ERASE MODE

TWELFTH EMBODIMENT

SEMICONDUCTOR MEMORY DEVICE

CROSS-REFERENCE TO RELATED APPLICATION

This application is based upon and claims the benefit of priority from the prior Japanese Patent Application No. 2006-268769, filed on Sep. 29, 2006, the entire contents of which are incorporated herein by reference.

BACKGROUND OF THE INVENTION

1. Field of the Invention

The invention relates to a semiconductor memory device.

2. Related Art

FBC memory devices are semiconductor memory devices expected recently as alternatives to conventional DRAMs. In the FBC memory device, an FET (Field Effect Transistor) with a floating body (also referred to as body region) is formed on an SOI (Silicon On Insulator) substrate. Data "1" or "0" is stored depending on the number of majority carriers accumulated in the body region.

Meanwhile, SOONO (Silicon-On-ONO) MOSFETs have been disclosed (C. W. Oh et. al., "A Novel Multi-Functional Silicon-On-ONO(SOONO) MOSFETs for SoC Applications: Electrical Characterization for High Performance Transistor and Embedded Memory Applications", 2006 Symposium on VLSI Technology Digest of Technical Papers, pp. 58-59, hereinafter referred to as non-patent document 1). The SOONO MOSFET is an MOS transistor that an ONO film is used instead of a BOX (Buried Oxide) layer of a conventional SOI MOSFET. The non-patent document 1 describes the usual DRAM function using the SOONO MOSFET and the function as a non-volatile memory using the SOONO MOSFET. If the SOONO MOSFET is used as the non-volatile memory, charges are trapped in the ONO film. The threshold voltage of the MOSFET is varied depending on the amount of charges trapped in the ONO film. Data is distinguished by the variation in threshold voltage.

If the SOONO MOSFET is used as the non-volatile memory, however, it takes 500 microseconds (μs) to program and erase data. The time is longer than a time required for programming and erasing data in a DRAM (e.g., 30 nanoseconds (ns)). A memory cell that charges are trapped in the ONO (Oxide-Nitride-Oxide) film is used only for a ROM (Read Only Memory).

SUMMARY OF THE INVENTION

A semiconductor memory device according to an embodiment of the present invention comprises a semiconductor layer; a charge trapping film provided on a first surface of the semiconductor layer; a gate insulating film provided on a second surface opposing the first surface of the semiconductor layer; a back gate provided on the charge trapping film; a front gate provided on the gate insulating film; a source and a drain formed in the semiconductor layer; and a body region which is provided between the drain and the source, the body region being in an electrically floating state, wherein the semiconductor memory device includes a first storage state for storing data depending on the number of majority carriers in the body region and a second storage state for storing data depending on the amount of charges in the charge trapping film, and the semiconductor memory device is shifted from the first storage state to the second storage state by converting the number of majority carriers in the body region into the amount of charges in the charge trapping film or from the second storage state to the first storage state by converting the amount of charges in the charge trapping film into the number of majority carriers in the body region.

A semiconductor memory device according to an embodiment of the present invention comprises a semiconductor layer; a charge trapping film provided on a first surface of the semiconductor layer; a gate insulating film provided on a second surface opposing the first surface of the semiconductor layer; a back gate provided on the charge trapping film; a front gate provided on the gate insulating film; a source and a drain formed in the semiconductor layer; and a body region which is provided between the drain and the source, the body region being in an electrically floating state, wherein the semiconductor memory device includes a first storage state for storing data depending on the number of majority carriers in the body region and a second storage state for storing data depending on the amount of charges in the charge trapping film, and the data is stored in both states of the first storage state and the second storage state.

DETAILED DESCRIPTION OF THE INVENTION

Embodiments of the present invention will be explained below with reference to the accompanying drawings. The present invention is not limited to the embodiments.

First Embodiment

A memory cell according to a first embodiment of the present invention is configured by an MISFET formed on a silicon layer on a charge trapping film. A memory made up of such memory cells is a RAM which holds data dynamically depending on the number of majority carriers in the body region when a power supply is turned on. When the power supply is off, the RAM holds data depending on the amount of charges in the charge trapping film.

Figure 1:
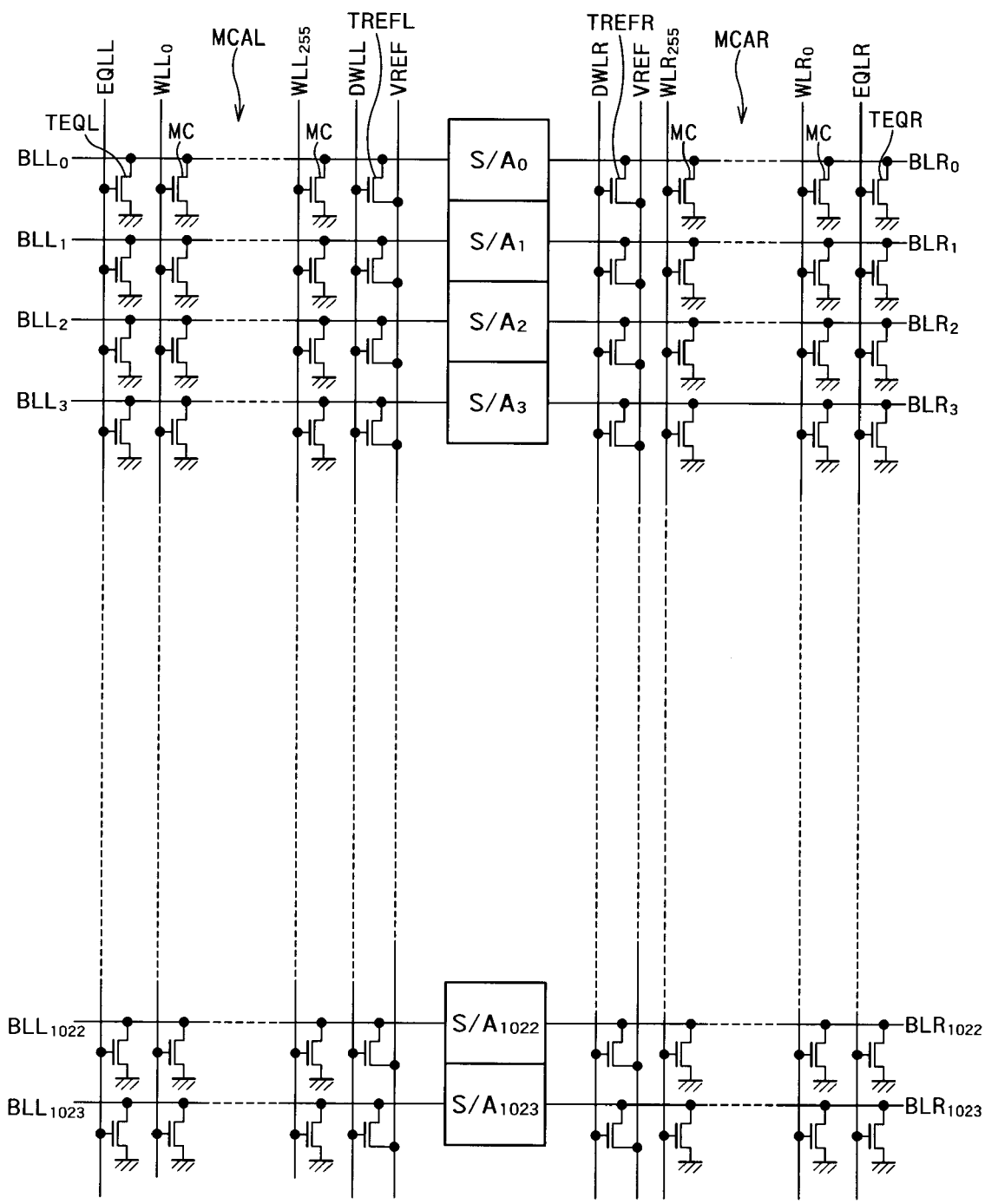
FIG. 1 is a schematic circuit diagram of an FBC memory device 100 according to the first embodiment.

FIG. 1 is a schematic circuit diagram of an FBC memory device 100 according to the first embodiment. The FBC memory device 100 includes memory cells MC, word lines WLLi, WLRi (i is an integer) (also referred to as WL), bit lines BLLi, BLRi (also referred to as BL), sense amplifiers S/Ai (also referred to as S/A), dummy word lines DWLL, DWLR, reference potential lines VREF, reference transistors TREFL, TREFR, equalizing transistors TEQL, TEQR, and equalizing lines EQLL, EQLR.

The memory cells MC are arranged in a matrix to configure memory cell arrays MCAL and MCAR (also referred to as MCA). The word line WL is extended in a row direction so as to be connected to the gate of the memory cell MC. The word line WL is perpendicular to the bit line BL and the memory cell MC is provided at the intersection of these lines. The row direction and the column direction are interchangeable.

The reference transistor TREFL, TREFR connects the reference potential VREF to the bit line BL under control of the dummy word line DWLL, DWLR. The equalizing transistor TEQL, TEQR connects the bit line BL to ground before a reading/writing operation so that the potential of each bit line BL is equal to the ground potential.

The sense amplifier S/A has, e.g., a cross coupled dynamic latch circuit to store data read from the memory cell MC or data received from a DQ buffer (not shown).

Figure 2:
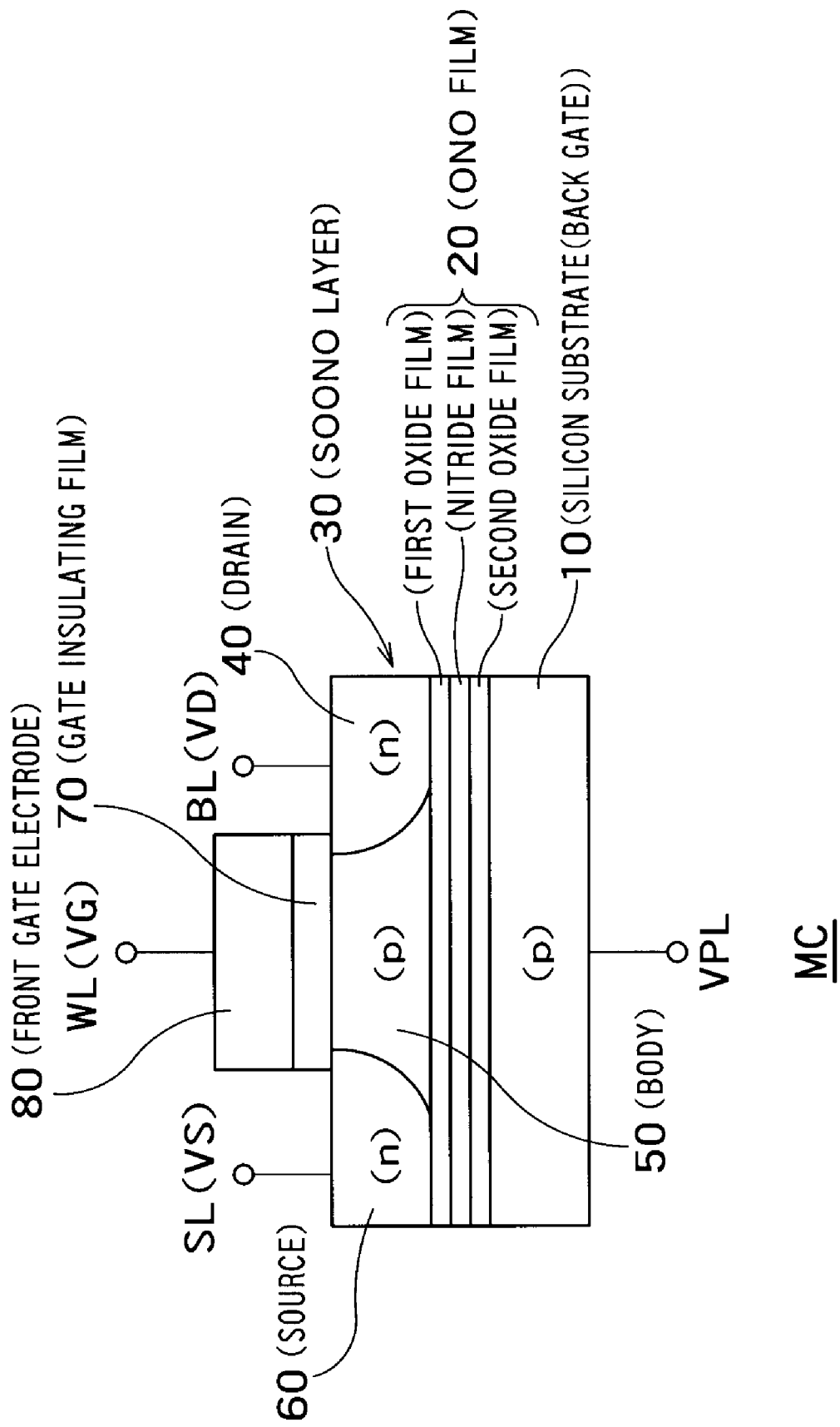
FIG. 2 is a cross-sectional view of the memory cell MC according to the first embodiment.

FIG. 2 is a cross-sectional view of the memory cell MC according to the first embodiment. The memory cell MC is provided on an SOONO substrate which includes a silicon substrate 10, an ONO film 20 serving as the charge trapping film, and an SOONO layer 30. The ONO film 20 is provided on the silicon substrate 10. The bottom surface of the SOONO layer 30 provides a first surface which is in contact with the ONO film 20. The ONO film 20 is in contact with a back gate formed at the silicon substrate 10. A source 60 and a drain 40 are provided in the SOONO layer 30. A floating body (hereinafter, "body") 50 is provided in the SOONO layer 30 between the source 60 and the drain 40. The body 50 is a semiconductor with opposite conductivity to that of the source 60 and the drain 40. The drain 40 is connected to the bit line BL, a front gate electrode 80 to the word line WL, and the source 60 to the source line SL. A gate insulating film 70 is provided on the body 50. The front gate electrode 80 is provided on the gate insulating film 70. The top surface of the SOONO layer 30 serves as a second surface which is in contacts with the gate insulating film 70. The gate insulating film 70 is in contact with the front gate electrode.

In the first embodiment, the FBC memory consists of an N-type FET. The body 50 is in an electrically floating state because it is surrounded by the source 60, the drain 40, the ONO film 20, the gate insulating film 70, and an STI (Shallow Trench Isolation) (not shown). The FBC memory stores data dynamically depending on the number of majority carriers accumulated in the body 50, which is the usual storage operation for the FBC memory and called "first storage state".

A state distinguished by the logical value (0 or 1) of information stored in a memory cell is called a "data state" or simply "data". A state distinguished by the location of stored data (body or charge trapping film) is called a "storage state". For example, assume that the memory cell MC is an N-type MISFET. The state that many holes are accumulated in the body 50 is defined as data "1" (also referred to as data state "1"), while the state that less holes are accumulated is defined as data "0" (also referred to as data state "0"). To program the data "1" in the memory cell MC in the first storage state, the memory cell MC is operated in a saturation region. For example, the word line WL is biased to 1.5 V, while the bit line BL to 1.5 V. The source is biased to ground GND (0 V). Impact ionization then occurs around the drain and a large amount of electron-hole pairs are generated. While electrons generated by impact ionization flow in the drain, holes are accumulated in the body with lower potential. When the current flowing at the time of generation of holes because of impact ionization is balanced with the forward current at the body-source pn junction, the body voltage reaches a steady state. The steady-state body potential is about 0.7 V.

When the data "0" is programmed, the voltage of the bit line BL is decreased to negative values. For example, the voltage of the bit line BL is decreased to −1.5 V. The pn junction between the body 50 and the drain 40 is biased greatly in the forward direction. The holes accumulated in the body 50 are discharged in the drain 40 and the data "0" is stored in the memory cell MC.

In the data reading operation, the word line WL is made to be active as in the data programming operation. The voltage of the bit line BL is set to be lower than that of programming of the data "1". For example, the voltage of the word line WL is 1.5 V, while the voltage of the bit line BL is 0.2 V. The memory cell MC is operated in a linear region. The threshold voltage of the memory cell MC storing the data "0" is different from that of the memory cell MC storing the data "1" because of the difference in the number of holes accumulated in the body 50. By detecting the difference in threshold voltage, the data "1" is distinguished from the data "0". The voltage of the bit line BL is low at the time of reading. This is because if the voltage of the bit line BL is set to be high to bias the memory cell MC toward the saturation region, at the time of reading the data "0", the data "0" may be changed to the data "1" because of impact ionization.

Figure 3:
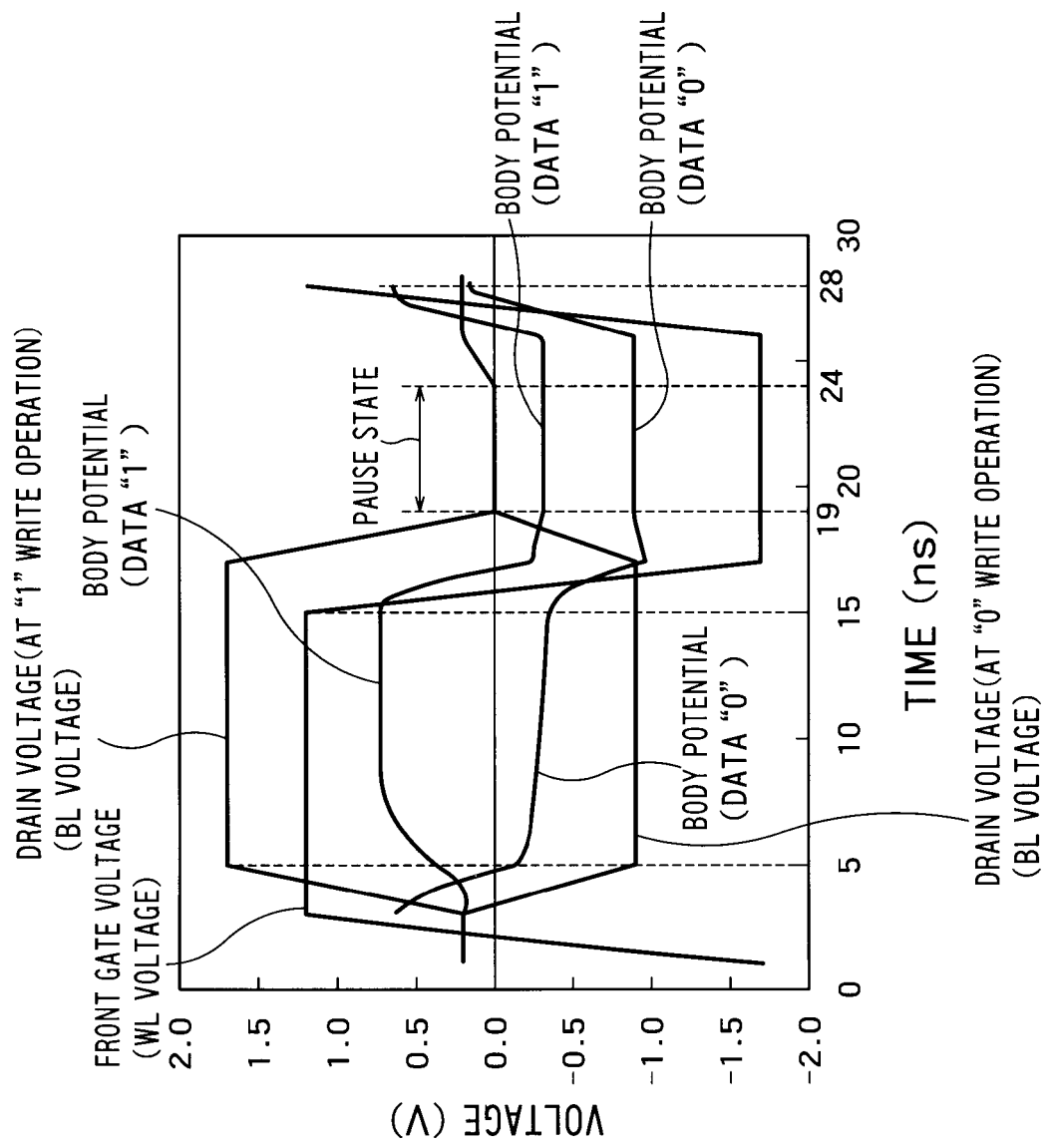
FIG. 3 is a timing diagram of signals for driving the FBC memory in the first storage state.

FIG. 3 is a timing diagram of signals for driving the FBC memory in the first storage state. A memory cell MC utilized in the simulation has a front gate length of 75 nm. The front gate oxide film has a thickness of 5.2 nm. The thickness of the SOI layer is 21 nm. The thickness of a first silicon dioxide film in the ONO film 20 is 3 nm. A silicon nitride film in the ONO film 20 has a thickness of 6 nm. A second silicon dioxide film in the ONO film 20 has a thickness of 6 nm. The operation of the FBC memory in the first storage state is the same as the reading/writing operation for conventional FBC memories.

In the first storage state, the voltage VS of the source 60 is maintained at 0 V, while the voltage VPL of the back gate at −3 V. The back gate contains an N-type impurity with a density of $3 \times 10^{17}$ cm$^{-3}$. The body 50 contains a P-type impurity with a density of $1 \times 10^{17}$ cm$^{-3}$.

The data programming operation is performed from 5 to 15 ns. When the data "0" is programmed, the voltage VG of the front gate electrode 80 (word line WL) is set to 1.2 V, while the voltage VD of the drain 40 (bit line BL) to −0.9 V. Holes are thus removed from the body 50. When the data "1" is programmed, the front gate voltage VG is set to 1.2 V, while the drain voltage VD to 1.7 V. The memory cell MC is operated in the saturation region and the holes are accumulated in the body 50 by impact ionization.

The data holding operation is performed from 19 to 24 ns. To hold data, the front gate voltage VG is set to −1.7 V and the drain voltage VD to 0 V. The state that the data is held at the drain voltage VD of 0 V is called a pause state. The body potential of the memory cell MC storing the data "0" ("0" cell) is lower than that of the memory cell MC storing the data "1" (also referred to as "1" cell). The difference in body potential between the "0" cell and "1" cell is caused by the difference in the number of majority carriers accumulated in the body 50. In the pause state, a reverse bias is applied to the PN junction between the body 50 and the source 60 and to the PN junction between the body 50 and the drain 40 in both the "0" cell and the "1" cell.

The data reading operation starts from 28 ns onward. When the data is read, the drain voltage VD is set to 0.2 V, while the front gate voltage VG to 1.2 V. There is a difference in threshold voltage between the "0" cell and "1" cell based on the difference in body potential between the cells. The difference $\Delta V_{th}$ in threshold voltage at the time of reading the data is about 0.45 V. The sense amplifier S/A distinguishes the data "0" from the data "1" based on the difference $\Delta V_{th}$ in threshold voltage.

According to the memory cell in the first storage state, the number of majority carriers in the body 50 varies dynamically over time because of the leak currents between the body and the source and between the body and the drain. After a long period of time, the number of majority carriers of the "0" cell is substantially the same as that of the "1" cell, so that distinguishing of the data is impossible. The sense amplifier S/A distinguishes the data by reading the drain current of the FET (memory cell) at regular time intervals and programs (restores) the data back in the same memory cell. That operation is called a refresh operation.

Figure 4:
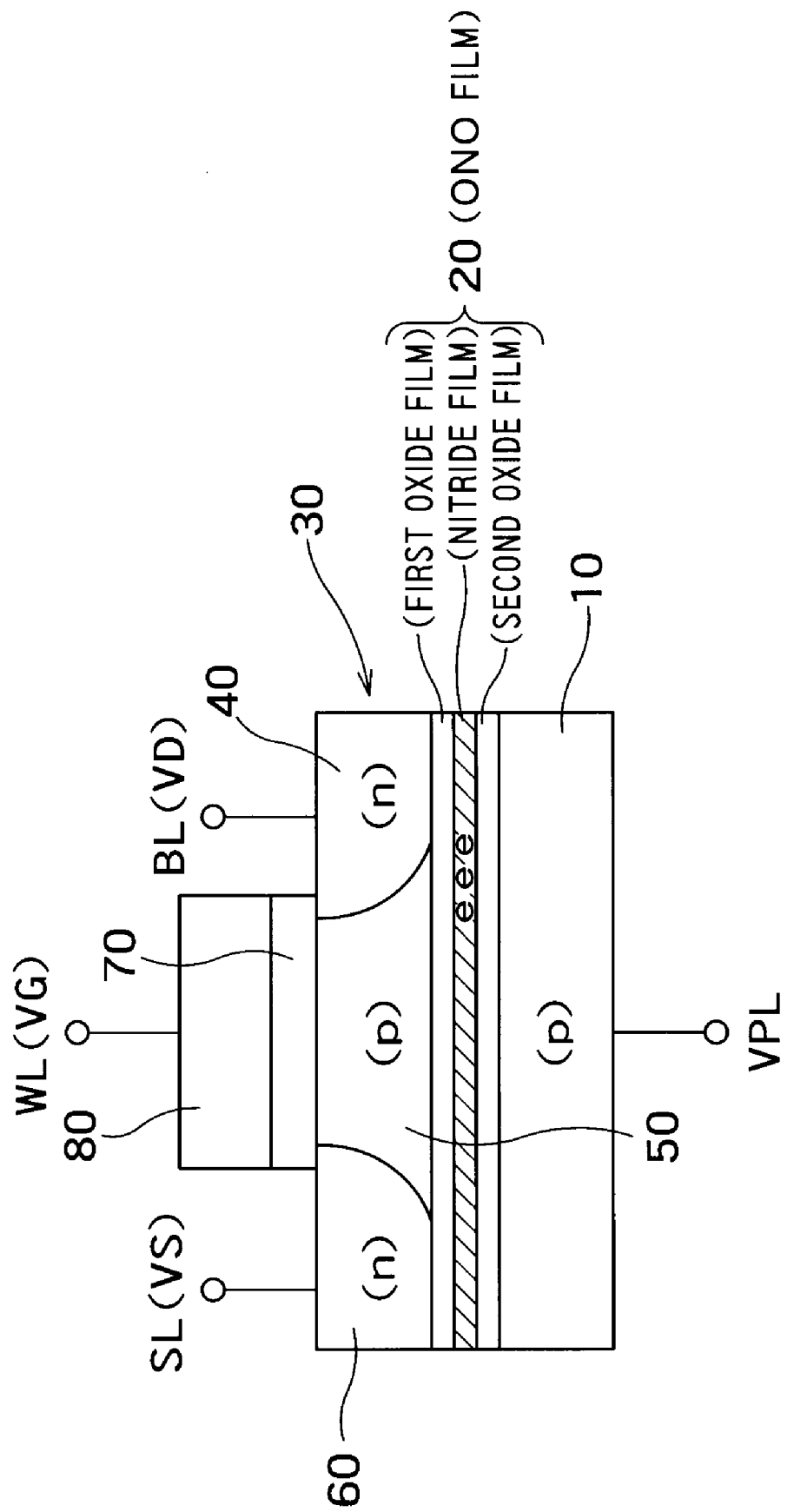
FIG. 4 is a conceptual diagram when the FBC memory of the first embodiment functions as a non-volatile memory.

FIG. 4 is a conceptual diagram when the FBC memory of the first embodiment functions as a non-volatile memory. The ONO film 20 traps charges as the charge trapping film. The charges trapped in the ONO film 20 (also referred to as trapped charges) are remained even though power is not supplied to the memory device. Namely, even though the front gate voltage VG, the drain voltage VD, the source voltage VS, and the back gate voltage VPL are 0 V or in a floating state, the trapped charges in the ONO film 20 are not erased. That proves that the FBC memory of the first embodiment functions as the non-volatile memory. Such an operational state is called a "second storage state". That function of the FBC memory is called a "non-volatile data holding function".

With reference to FIG. 4, electrons "e" are trapped in the silicon nitride film of the ONO film 20. The data programming operation for the memory cell MC in the second storage state will be described later.

Figure 5:
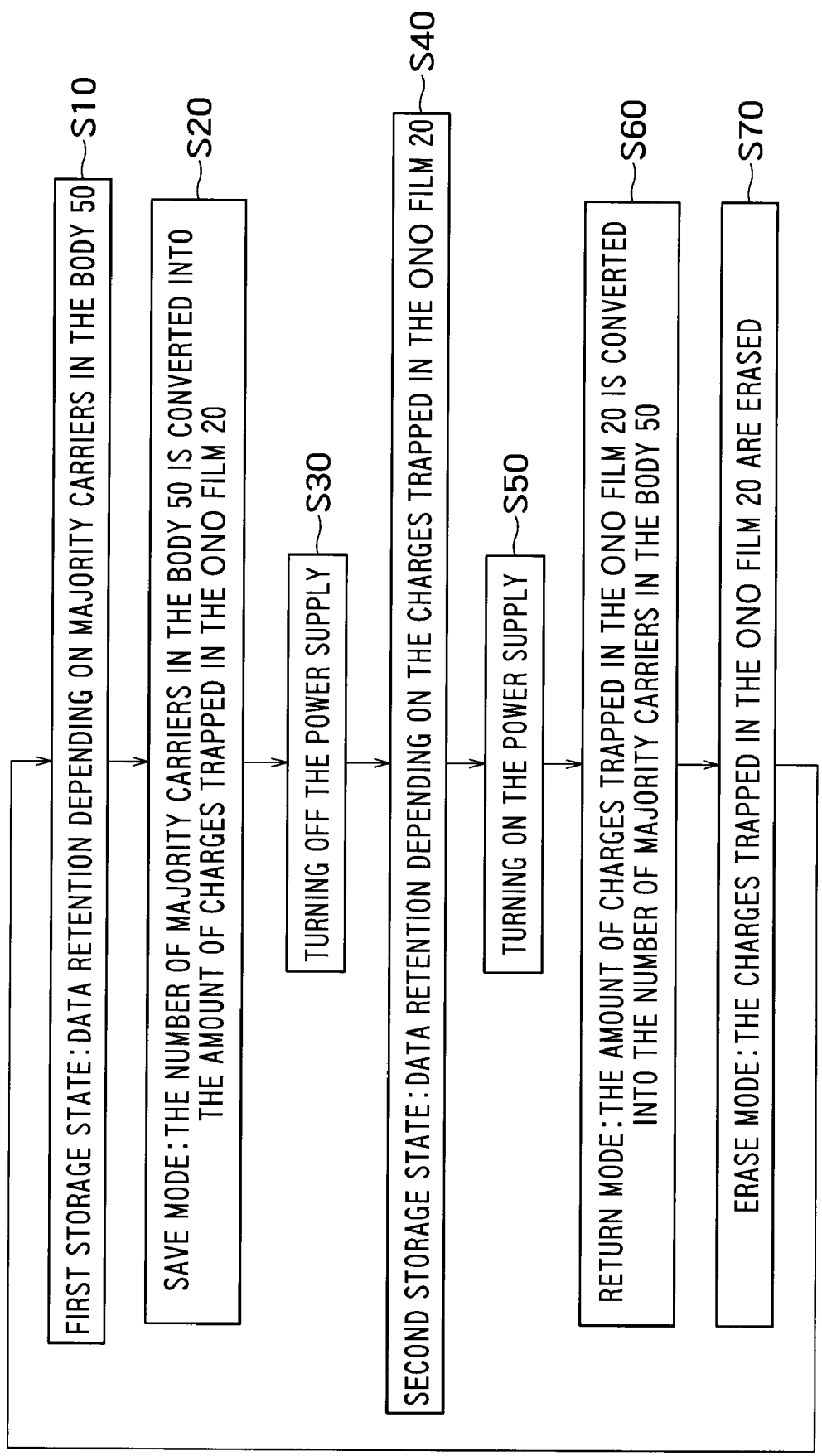
FIG. 5 is a flowchart showing a save mode and a return mode.

FIG. 5 is a flowchart showing a save (or backup) mode and a return (or recall) mode. The FBC memory is in the first storage state (S10). In the first storage state, the FBC memory holds data depending on majority carriers in the body 50. The save mode is then performed (S20). The first storage state is shifted to the second storage state in the save mode. Specifically, the number of majority carriers in the body 50 is converted into the amount of charges trapped in the ONO film 20 in the save mode. The data state (0 or 1) depending on the majority carriers in the body 50 is reflected in the data state (0 or 1) depending on the charges trapped in the ONO film 20 in the save mode. Specific processes of the save mode will be described later. The save mode changes the dynamic (volatile) FBC memory to the non-volatile memory. Even if the power supply of the memory device is turned off (S30), the data in the memory cell MC is held. While the power supply is off, the FBC memory maintained at the second storage state (S40).

When the power supply is turned on (S50), the return mode is performed (S60). In the return mode, the second storage state is shifted to the first storage state. Specifically, the amount of charges trapped in the ONO film 20 is converted into the number of majority carriers in the body 50 in the return mode. The data state (0 or 1) depending on the charges trapped in the ONO film 20 is reflected in the data state (0 or 1) depending on the majority carriers in the body 50 in the return mode. Specific processes of the return mode will be described later. The return mode allows the FBC memory which functions as the non-volatile memory to function as the dynamic volatile memory (DRAM). The data is thus read from or written in the memory cell MC at high speed.

Even if the return mode is performed after the save mode, the charges trapped in the ONO film 20 are not erased. To perform the save mode again, the charges trapped in the ONO film 20 are erased (S70).

Figure 6:
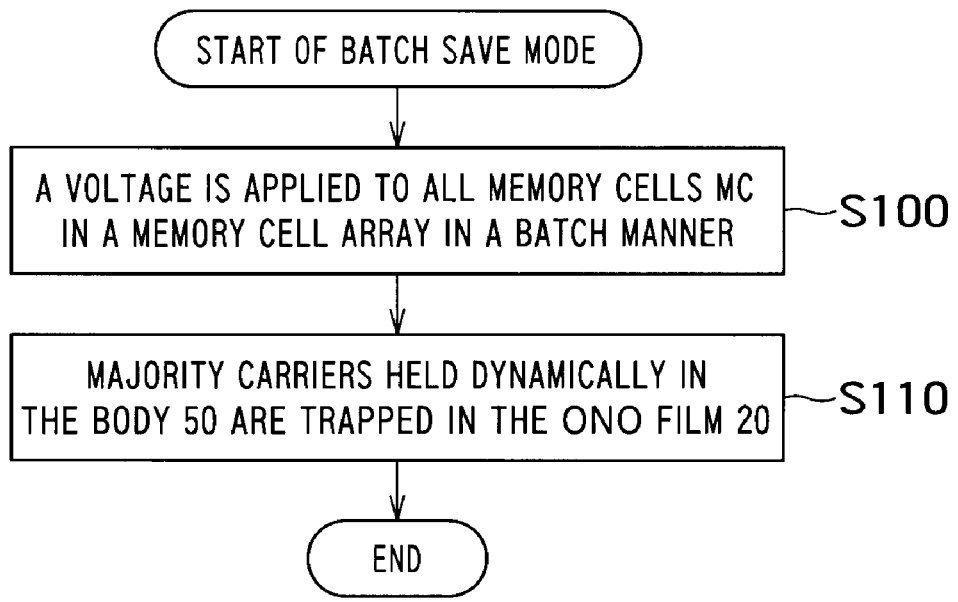
FIG. 6 is a flowchart of the batch save mode.
Figure 11:
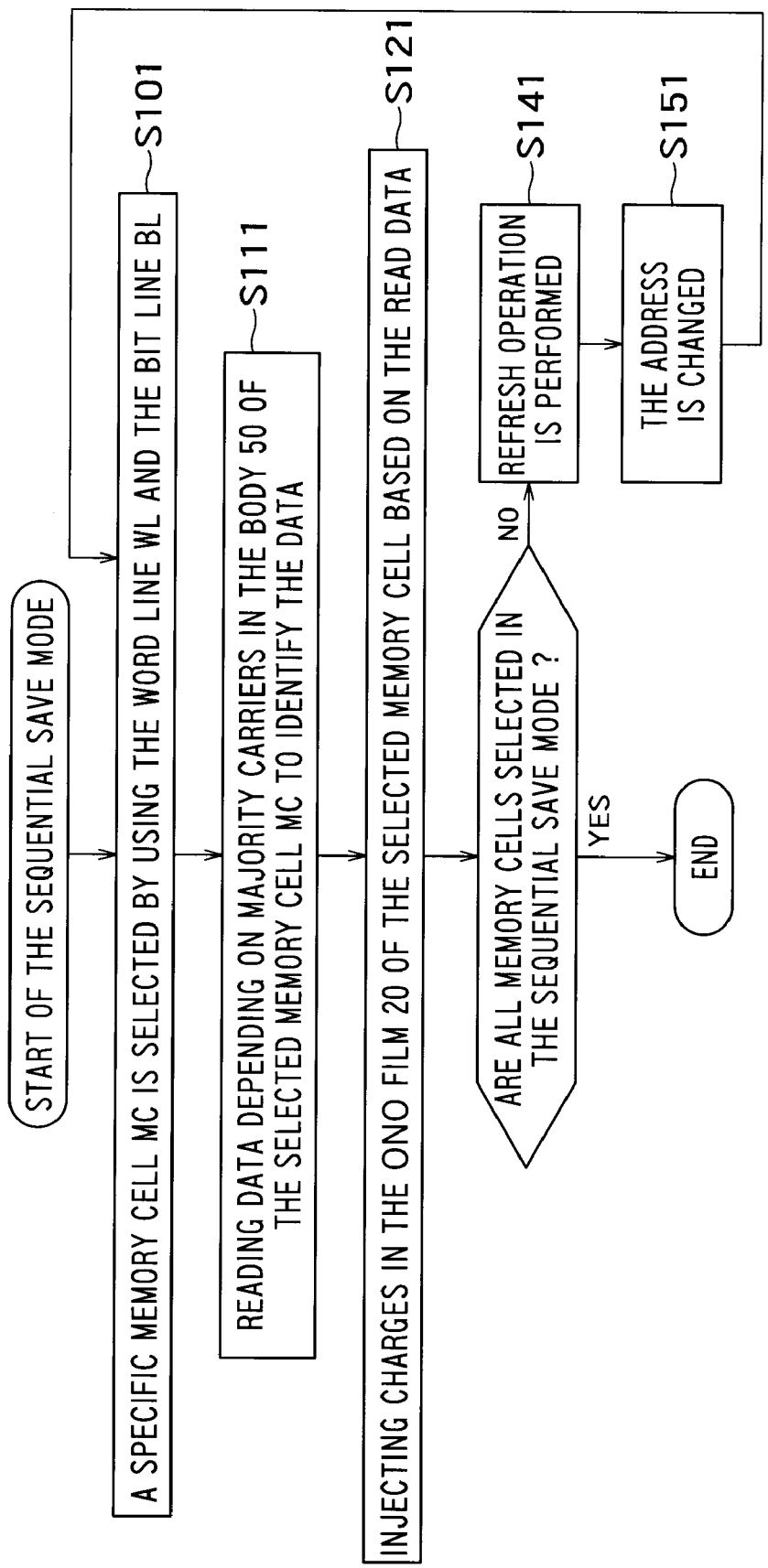
FIG. 11 is a flowchart of the sequential save mode.

The save mode is classified into a batch save mode and a sequential save mode (see FIG. 11). FIG. 6 is a flowchart of the batch save mode. According to the batch save mode, a voltage is applied to all memory cells MC in a memory cell array at the same time (S100). All memory cells MC are thus shifted from the first storage state to the second storage state in a batch manner. Majority carriers held dynamically in the body 50 are trapped in the ONO film 20 (S110). For example, when a large number of holes are in the body 50 (data "1"), relatively large number of holes are trapped in the ONO film 20. When a small number of holes are in the body 50 (data "0"), the number of holes trapped in the ONO film 20 is relatively small. Because the FBC memory is non-volatile after the save mode, the data is held even if the power supply is turned off.

Figure 7:
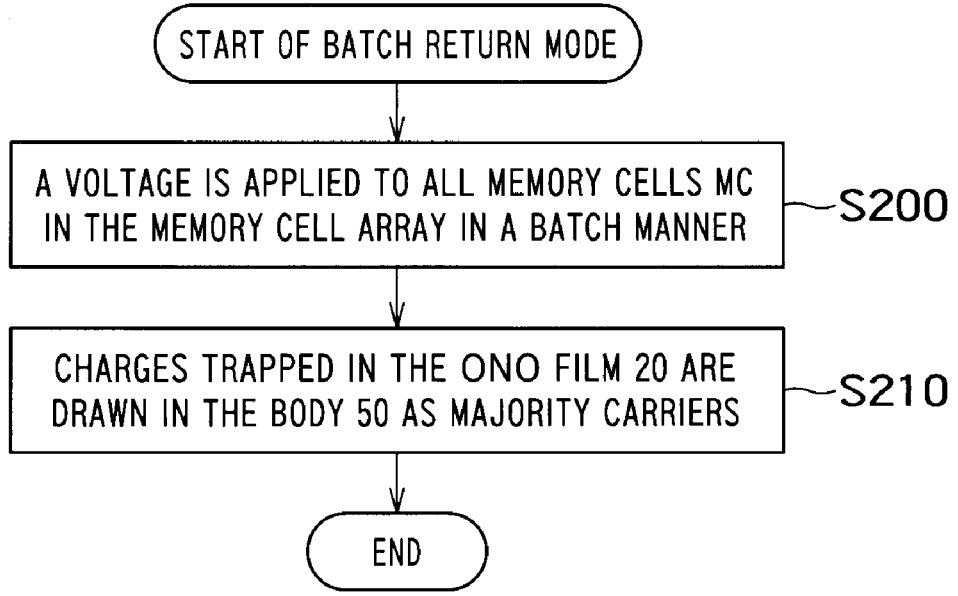
FIG. 7 is a flowchart of the batch return mode.
Figure 12:
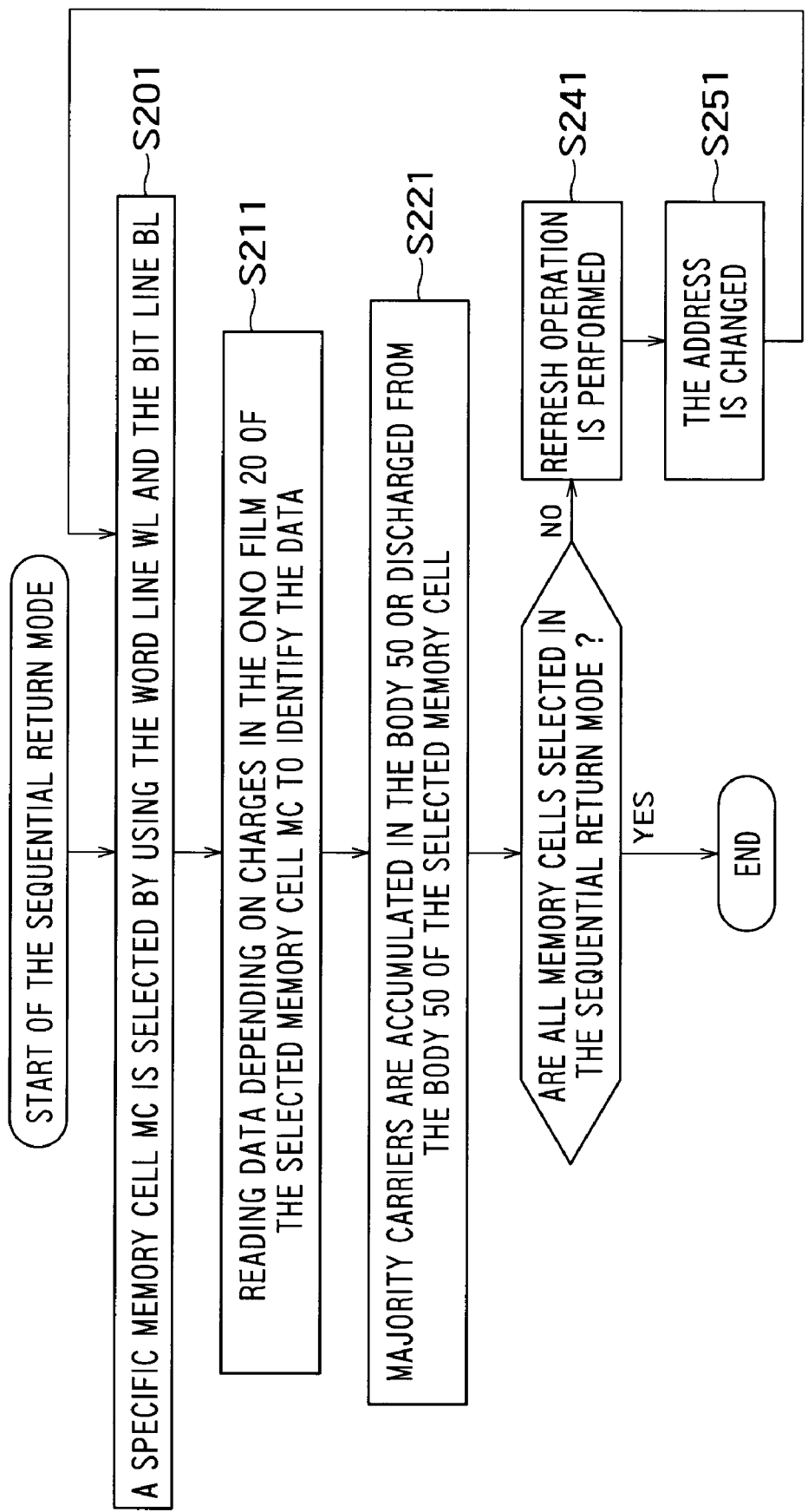
FIG. 12 is a flowchart of the sequential return mode.

The return mode is also classified into a batch return mode and a sequential return mode (see FIG. 12). FIG. 7 is a flowchart of the batch return mode. In the batch return mode, a voltage is applied to all memory cells MC in the memory cell array in a batch manner (S200). All memory cells MC are shifted from the second storage state to the first storage state in a batch manner. Charges trapped in the ONO film 20 are drawn and transferred to the body 50 as majority carriers (S210). For example, when a large number of holes are trapped in the ONO film 20 (data "1"), relatively many holes are drawn and transferred to the body 50. When the number of holes trapped in the ONO film 20 is small (data "0"), relatively small number of holes are drawn and transferred to the body 50. After the return mode, the FBC memory holds data dynamically depending on the number of majority carriers in the body region.

The FBC memory according to the first embodiment holds data dynamically depending on the number of majority carriers in the body 50 in the first storage state and traps charges in the ONO film 20 in the second storage state so as to have the non-volatile data holding function. In the first storage state, the time required for reprogramming data in memory cells is equal to or shorter than 10 ns. When the power supply is on, the FBC memory according to the first embodiment is used as a RAM. In the second storage state, the data in the FBC memory is non-volatile. When the power supply is off, the data in the FBC memory according to the first embodiment is maintained. The FBC memory according to the first embodiment functions as a RAM with the non-volatile data holding function.

The techniques described in the non-patent document 1 merely disclose the method for utilizing an SOONO MOSFET as a DRAM and the method for utilizing the SOONO MOSFET as a non-volatile memory separately. According to the FBC memory of the first embodiment, the location where charges are stored is changed between the first storage state where the FBC memory is operated as a RAM and the second storage state where the FBC memory has the non-volatile data holding function. Namely, according to the FBC memory, the region where charges are stored is changed in the same memory cell MC. According to the first embodiment, the FBC memory functions as the RAM with the non-volatile data holding function.

When the data "1" is programmed, ordinary FBC memories utilize impact ionization to increase their programming speeds. The data "1" can be programmed utilizing so-called GIDL (Gate Induced Drain Leakage) in the first embodiment. To program the data "1" in the memory cell MC by utilizing GIDL, for example, the word line WL is biased to −3 V and the bit line BL to 1.5 V. The source is set to ground GND (0 V). The electric field around the drain is increased, impact ionization or band-to-band tunneling occurs, and a large quantity of electron-hole pairs are generated around the drain. Electrons generated are flown in the drain, while holes are accumulated in the body with lower potential.

Figure 8:
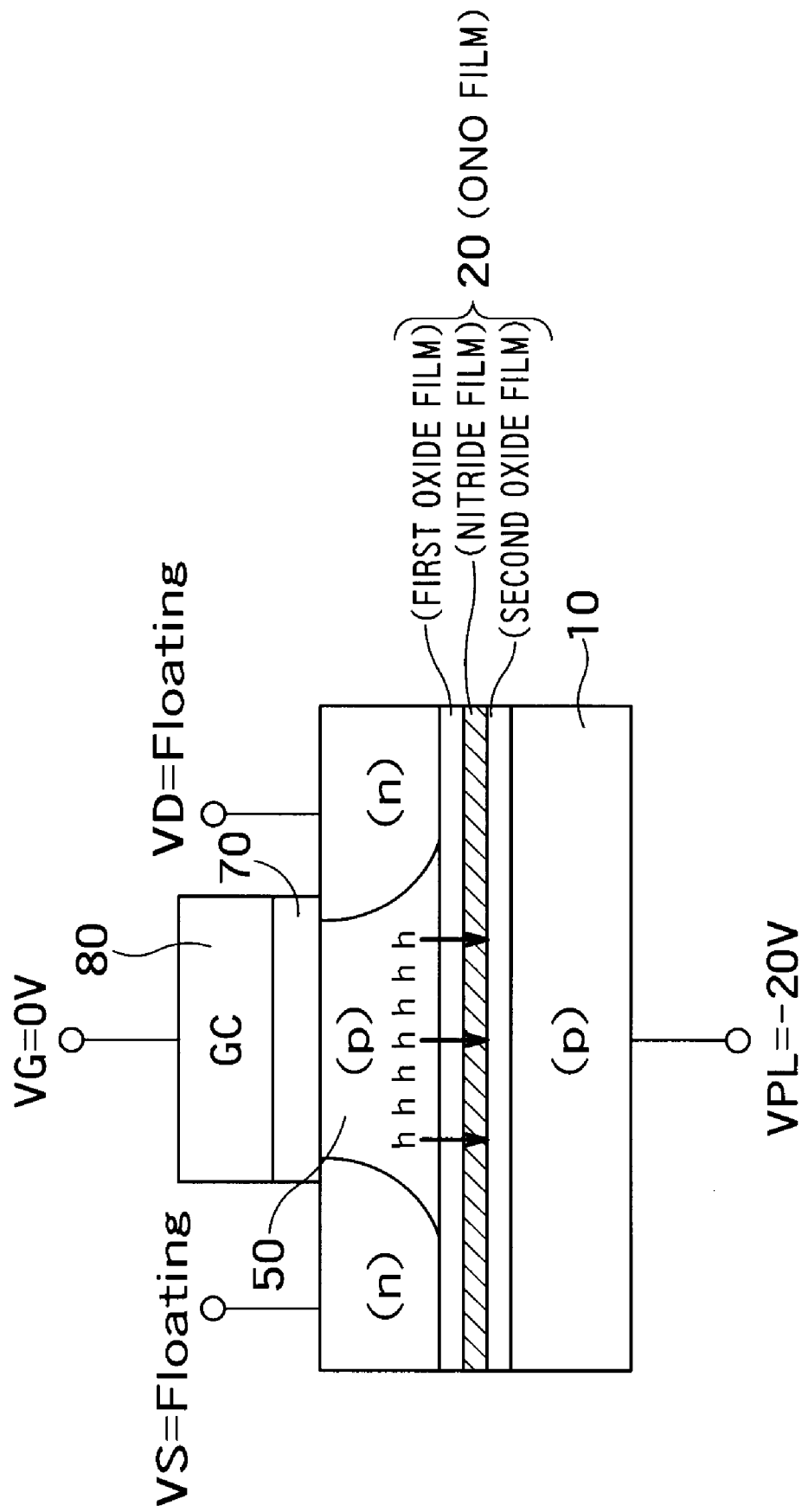
FIG. 8 is a conceptual cross-sectional view showing a method for injecting charges in the ONO film 20.

FIG. 8 is a conceptual cross-sectional view showing a method for injecting charges in the ONO film 20. In the batch save mode, holes in the body 50 are injected in the ONO film 20. While the source potential VS and the drain potential VD are floating, the difference in potential is made between the front gate 80 and the back gate 10. FN (Fowler-Nordheim) tunneling thus occurs and holes are injected from the body 50 in the ONO film 20.

The difference in potential between the front gate and the back gate depends on the thicknesses of the gate insulating film 70 and the ONO film 20. EOT (Equivalent Oxide Thickness) of the ONO film 20 is indicated by Tono and EOT of the gate insulating film 70 is indicated by Tox. The potential Vbody of the body 50 is substantially equal to VPL×Tox/(TONO+Tox). For example, assuming TONO=Tox=10 nm and Vg=0 V is applied to the front gate and VPL=−20 V to the back gate, Vbody is about −10 V. When Vbody is −10 V, holes at the bottom of the body 50 pass through the first silicon dioxide film by FN tunneling to be trapped in the silicon nitride film.

If −20 V of the potential is applied to the source and the drain, body-source and body-drain PN junctions are biased forward. The potential of the body 50 is then decreased to about −20 V. If a potential which is equal to the back gate potential VPL is applied to the source and the drain, holes are not injected in the ONO film 20.

If the back gate is a P-type semiconductor with an impurity density of $1 \times 10^{18}$ cm$^{-3}$ or less, an inversion layer is formed on the surface of the back gate. When the inversion layer is formed on the surface of the back gate, electrons are injected from the back gate in the ONO film 20 to recombine with holes in the silicon nitride film or to eliminate positive charges from the holes in the silicon nitride film. This may extend the time for programming in the ONO film 20 or make programming in the ONO film 20 impossible. To avoid formation of the inversion layer on the surface of the back gate, the density of the P-type impurity in the back gate is preferably equal to or higher than $1 \times 10^{20}$ cm$^{-3}$.

When a large number of holes are in the body 50 (when data "1" is stored), the body potential is high. The difference in potential between the body and the back gate is thus large and an FN tunneling current is increased. When a small number of holes are in the body 50 (when data "0" is stored), the body potential is low. The difference in potential between the body and the back gate is thus small and the FN tunneling current is decreased. In the batch save mode, charges corresponding to the number of majority carriers in the body 50 are trapped in the ONO film 20 using the FN tunneling current.

Figure 9:
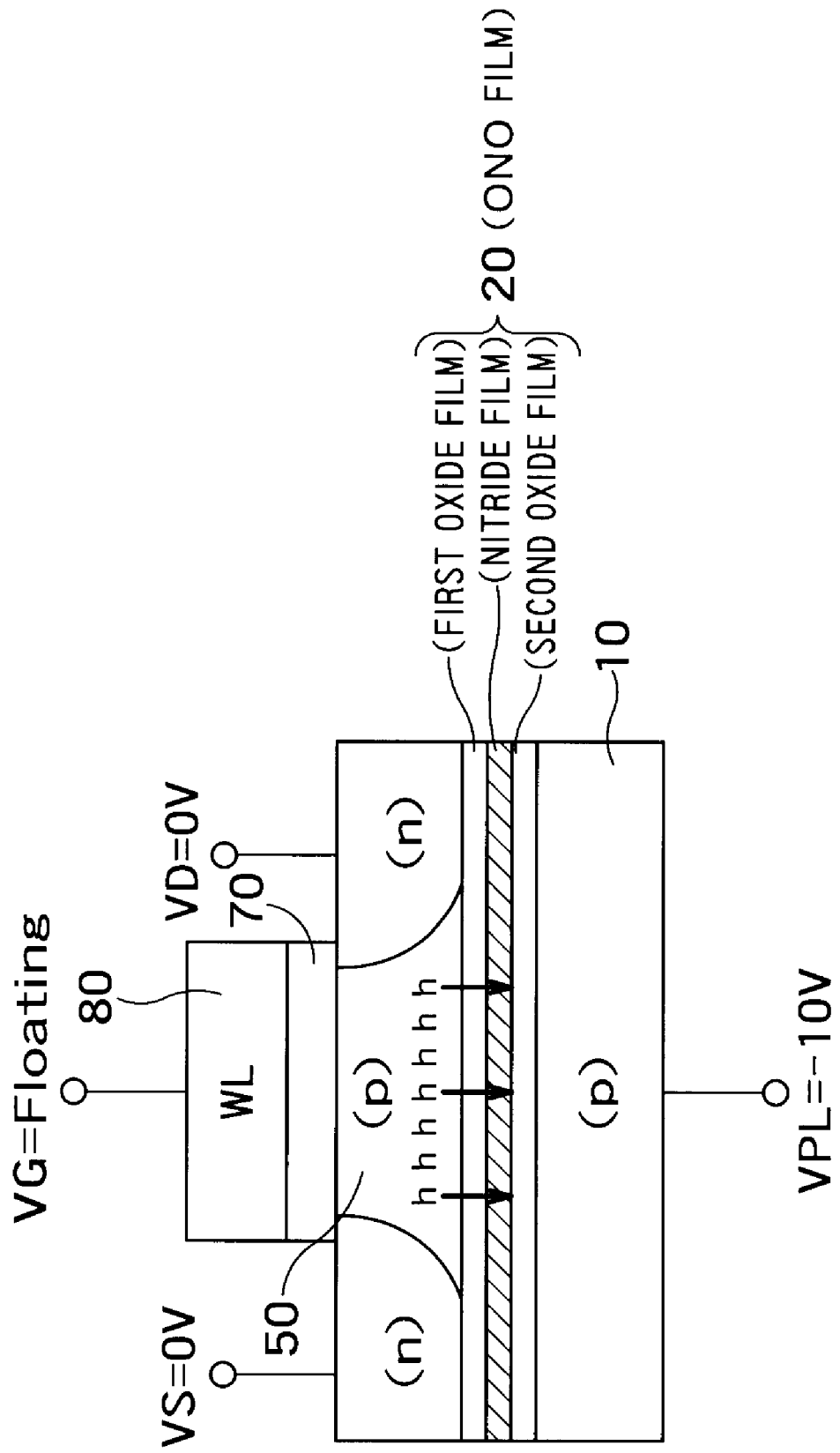
FIG. 9 is a conceptual cross-sectional view showing another method for injecting charges in the ONO film 20.

FIG. 9 is a conceptual cross-sectional view showing another method for injecting charges in the ONO film 20. According to this method, a voltage is applied between the source and the back gate and between the drain and the back gate in order to generate FN tunneling. The front gate potential VG is floating. For example, in the memory cell MC with the configuration described in the FIG. 8, the source potential VS and the drain potential VD are 0 V while the back gate potential VPL is −10 V. Band-to-band tunneling occurs near the source and the drain at the bottom of the body 50. Holes are thus generated in the valence band of the body 50. These holes are trapped in the silicon nitride film of the ONO film 20 by FN tunneling.

The charge injection method shown in FIG. 9 has the following advantages over the charge injection method shown in FIG. 8. Firstly, because a current does not need to be flown in the gate insulating film 70, the save mode shown in FIG. 9 avoids degradation of reliability of the gate insulating film 70. Secondly, the save mode shown in FIG. 9 decreases the back gate potential VPL more considerably than the charge injection method shown in FIG. 8. Power consumption in the charge injection method shown in FIG. 9 is relatively reduced.

However, the charge injection method shown in FIG. 9 has the following disadvantage over the charge injection method shown in FIG. 8. According to the charge injection method shown in FIG. 9, new holes are generated by band-to-band tunneling. If the number of holes generated by band-to-band tunneling is larger than the difference in the number of holes accumulated in the body 50 (difference in the number of holes between the data "0" and "1"), the data in the body 50 is not converted correctly to data in the ONO film 20. When excess holes are generated by band-to-band tunneling, the method shown in FIG. 9 is not preferable as the batch save mode.

According to the charge injection utilizing FN tunneling, the electric field in the ONO film 20 is varied over time by trapped charges and the charge injection speed is gradually reduced. After voltages are applied to the terminals as shown in FIGS. 8 and 9, charges are not injected excessively, so that the amount of charges in the ONO film 20 approaches a certain value.

Holes are injected uniformly in the body 50 in a self-alignment manner by the methods of FIGS. 8 and 9. These methods accomplish a fixed amount of charges in the ONO film 20.

Second Embodiment

In a second embodiment of the present invention, an FBC memory device is shifted from the first storage state to the second storage state by the sequential save mode and from the second storage state to the first storage state by the sequential return mode. In the sequential save mode, a specific memory cell MC in the first storage state is selected by the word line WL and the bit line BL. The sense amplifier S/A reads the data stored in the memory cell MC (also referred to as selected memory cell MC). The sense amplifier S/A injects charges in the ONO film 20 based on the data. According to the sequential save mode, data is read from a selected memory cell MC in the first storage state. Data is programmed in the selected memory cell MC based on the read data. The memory cell MC is then shifted to the second storage state. These operations are performed sequentially upon all memory cells MC.

Figure 10:
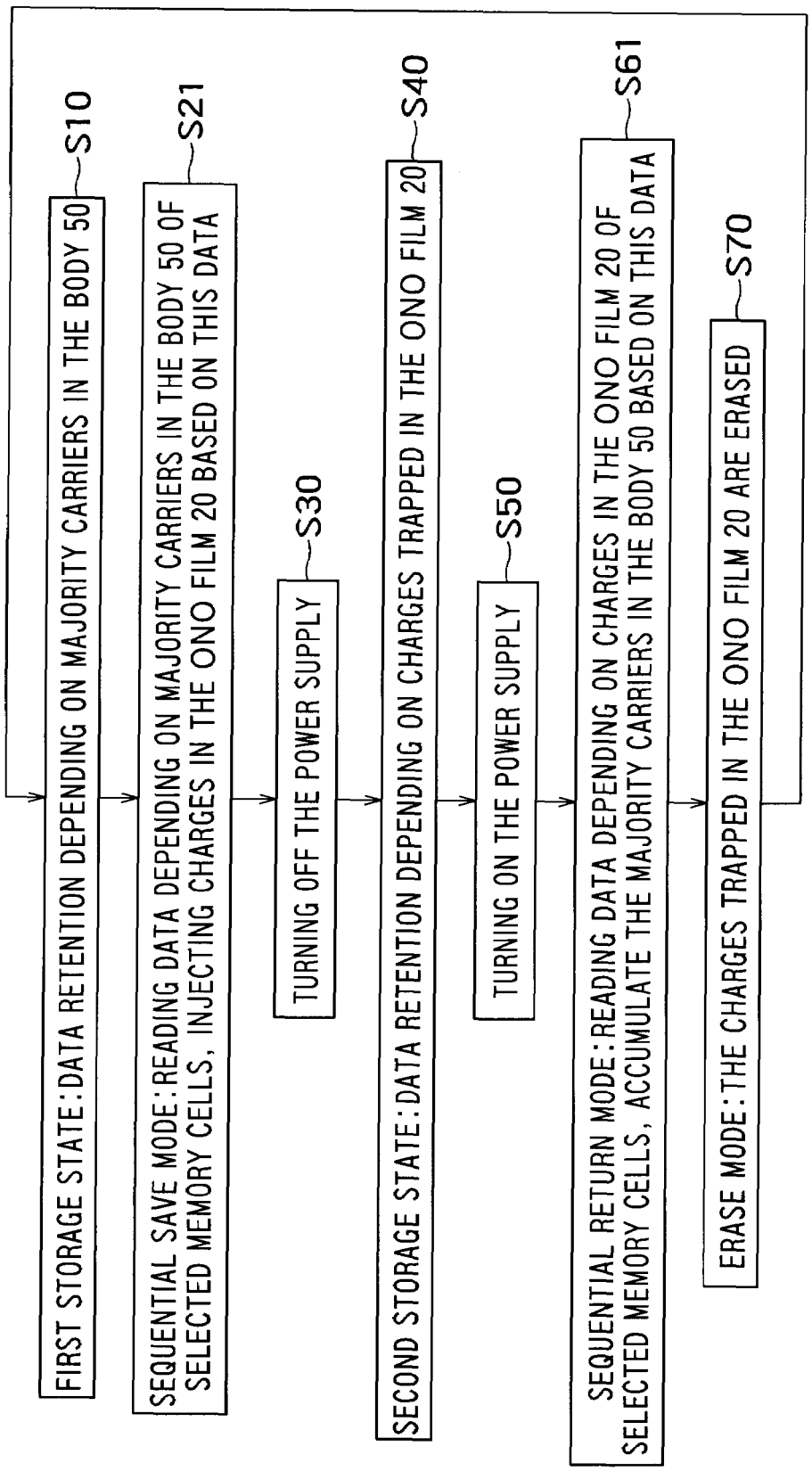
FIG. 10 is a flowchart of the sequential save mode and the sequential return mode.

FIG. 10 is a flowchart of the sequential save mode and the sequential return mode. An FBC memory is in the first storage state (S10). In the first storage state, the FBC memory holds data depending on majority carriers in the body 50. The sequential save mode is then performed (S21). In the sequential save mode, for example, memory cells MC are selected in the order of address and the sense amplifier S/A reads the data in the selected memory cells MC. The reading operation is the same as the operation for reading data from ordinary FBC memories. The sense amplifier S/A applies voltages to the selected memory cell MC based on the data latched therein in order to inject charges in the ONO film 20. A specific method for applying voltages will be described later with reference to FIGS. 13 to 16. By injecting charges in the ONO film 20, the storage state of the selected memory cell MC is shifted from the first storage state to the second storage state. The dynamic FBC memory becomes non-volatile by the sequential save mode. If the power supply for the memory device is turned off after the sequential save operation is performed for all memory cells MC (S30), the data in the memory cells MC is maintained. While the power supply is off, the FBC memory maintains the second storage state (S40).

When the power supply is turned on (S50), the sequential return mode is performed (S61). In the sequential return mode, for example, the memory cells MC are selected in the order of address and the sense amplifier S/A reads the data in the selected memory cells MC. According to the reading operation, the data depending on the amount of charges trapped in the ONO film 20 is read. The sense amplifier S/A applies voltages to the selected memory cell MC based on the data latched therein. When the data "1" is programmed, for example, the data "1" programming voltage indicated at 5 to 15 ns in FIG. 3 is applied to the front gate and the drain to accumulate holes generated by impact ionization in the body 50. When the data "0" is programmed, for example, the data "0" programming voltage indicated at 5 to 15 ns in FIG. 3 is applied to the front gate and the drain to extract holes from the body 50. The storage state of the selected memory cell MC is thus shifted from the second storage state to the first storage state. The sequential return mode allows the FBC memory which functions as a non-volatile memory to function as a dynamic volatile memory. The data is read from or written in the memory cell MC at high speed.

Even if the return mode is performed after the save mode, charges trapped in the ONO film 20 are not erased. To perform the save mode again, the charges trapped in the ONO film 20 are erased (S70). The erase operation is performed by extracting the charges trapped in the ONO film 20 or injecting charges with opposite polarity in the ONO film 20. The memory cells MC are selected in the order of address to be subjected to the erase operation utilizing appropriately charge injection methods for the sequential save mode and the sequential return mode.

While a data state depending on trapped charges in the ONO film 20 is maintained, data depending on the number of majority carriers accumulated in the body 50 can be held dynamically, read, and reprogrammed independently of the data state based on trapped charges. The data in the first storage state is read and reprogrammed while the data in the second storage state is maintained. In this state, the FBC memory device stores the data in both states of the first storage state and the second storage state simultaneously in each single memory cell. The erase mode can be performed just before the sequential save mode. Alternatively, the erase operation can be part of the sequential save mode or the sequential return mode. This state is called "the first storage state maintaining the second storage state".

FIG. 11 is a flowchart of the sequential save mode. A specific memory cell MC is selected by using the word line WL and the bit line BL (S101). Memory cells MC are selected in the order of address. The sense amplifier S/A reads data depending on majority carriers in the body 50 of the selected memory cell MC to identify the data (S111). As described above, the sense amplifier S/A has the latch function for storing the data temporarily. The sense amplifier S/A applies voltages to the selected memory cell MC based on the latched data. Charges are then injected in the ONO film 20 of the selected memory cell (S121). While holes in the body 50 are injected in the ONO film 20 in the batch save mode, either holes or electrons are injected in the ONO film 20 because the sense amplifier S/A latches the data temporarily in the sequential save mode. The charges injected in the ONO film 20 at step S121 can be holes or electrons. Step S121 shifts the selected memory cell MC from the first storage state to the second storage state.

The refresh operation is performed before the next address is selected (S141). While charges are injected in the ONO film 20 of one memory cell, the other memory cell holds dynamically data depending on majority carriers in the body region 50. Voltages at the terminals of the memory cell that holds the data depending on the majority carrier are in a pause state, a bit line disturbance state, or a word line disturbance state. Under such states, the data is changed gradually over time or depending on the frequency of disturbances to be incorrect data, which is called "data loss". To avoid such data loss, the refresh operation is performed.

The pause state, the bit line disturbance state, and the word line disturbance state mentioned above will be described next. In the pause state, 0 V is applied to the source and the drain, −1.7 V to the front gate, and −3 V to the back gate. As described in the first embodiment, because the number of holes in the body region 50 of the "0" cell is gradually increased because of reverse leak currents (mainly thermal generation currents) at body-source and body-drain pn junctions, the data "0" is changed to the data "1". In order to deal with that, negative voltages are applied to the front gate and the back gate, so that the interfaces between the front gate oxide film and the body region and between the back gate insulating film and the body region are preferably in an accumulated state. When the interface is depleted, a leak current through the interface state is added to the reverse leak current at the pn junction, so that the number of holes in the "0" cell is increased at a higher speed. When the interface is in the accumulated state, however, the leak current through the interface state is suppressed, so that the speed of accumulating holes in the "0" cell is reduced. The interface under the accumulated state prolongs the data retention time for the "0" cell.

In the word line disturbance state, for example, 0 V is applied to the source and the drain, 1.2 V to the front gate, and −3 V to the back gate. If the memory cell is turned on under such a state, part of electrons in the inversion layer are trapped in the interface state at the interface between the gate oxide film and the body region. Holes accumulated in the body region recombine with the trapped electrons so as to be annihilated, which allows a charge pumping current to flow. If an unselected memory cell connected to a selected word line WL is turned on and off repeatedly, holes accumulated in the body region of the unselected "1" cell are decreased gradually by the charge pumping current. The data in the unselected "1" cell is changed to the data "0". Such a phenomenon is called word line disturbance.

The bit line disturbance is classified into a bit line high disturbance and a bit line low disturbance. In the bit line high disturbance, for example, 0 V is applied to the source, 1.7 V to the drain, −1.7 V to the front gate, and −3 V to the back gate. Because of high voltage applied to the drain, the leak current in high electric field region around the drain, so-called GIDL current is increased. The number of holes in the body region of the "0" cell is increased faster than that of the pause state. Such a phenomenon is called the bit line high disturbance. In the bit line low disturbance, for example, 0 V is applied to the source, −0.9 V to the drain, −1.7 V to the front gate, and −3 V to the back gate. In the "1" cell, the number of holes is decreased gradually by the forward bias current at the drain pn junction, so that the data "1" is changed to the data "0". Such a phenomenon is the bit line low disturbance.

The voltage required for reprogramming the data depending on trapped charges in the ONO film 20 in the sequential save mode is higher than the voltage required for reprogramming the data depending on majority carriers in the body 50. The time required for reprogramming the data depending on trapped charges in the ONO film 20 in the sequential save mode is longer than the time required for reprogramming the data depending on majority carriers in the body 50. The possibility that data loss occurs in the sequential save mode is higher than that of the usual operation.

Since the refresh operation is included in the sequential save mode, even though higher voltage than that of the usual operation for the FBC memory is applied to the bit line BL and the word line WL, the sequential save mode is performed while data loss is avoided. In the sequential save mode, random access performed in the usual operation is forbidden and only the charge injection operation for the ONO film 20 and the refresh operation are performed.

After the refresh operation, the address is changed and the next memory cell is selected (S151). Steps S101 to S151 are repeated until the save operation is performed upon all memory cells MC. When all memory cells MC are in the second storage state, the sequential save mode ends. High voltages as in the sequential save mode are applied to the bit line BL and the word line WL in the erase mode. The refresh operation is preferably included in the erase mode.

FIG. 12 is a flowchart of the sequential return mode. A specific memory cell MC is selected by using the word line WL and the bit line BL (S201). Memory cells MC are selected in the order of address. The sense amplifier S/A reads data depending on trapped charges in the ONO film 20 of the selected memory cell MC and identifies the data (S211). The data identification utilizes a variation in threshold voltage of the memory cell MC depending on the amount of charges trapped in the ONO film 20. The data is identified utilizing a variation in current flowing in the selected memory cell MC. The reading operation will be described later. The sense amplifier S/A identifies the data by the difference in current and latches the data. The sense amplifier S/A applies voltages to the selected memory cell MC based on the latched data. Holes serving as majority carriers are accumulated in the body 50 of the selected memory cell. Alternatively, holes are discharged from the body 50 of the selected memory cell (S221). While holes in the ONO film 20 are removed in the body 50 in the batch return mode, the sense amplifier S/A accumulates holes in the body 50 or discharges holes from the body 50 based on the latched data in the sequential return mode. Step S221 enables the selected memory cell MC to be shifted from the second storage state to the first storage state.

The refresh operation is performed before the next address is specified (S241). This is done in order to avoid the data loss. In the sequential return mode, random access performed in the usual operation is forbidden and only the writing operation and the refresh operation are preferably performed upon the body region 50. After the refresh operation, the address is changed and the next memory cell is selected (S251). Steps S201 to S251 are repeated until the return operation is performed upon all memory cells MC. When all memory cells MC are in the first storage state, the sequential return mode ends.

According to the batch save mode of the first embodiment, not all holes are trapped from the body 50 in the ONO film 20 and a part of them flow in the back gate. If only a small number of holes is trapped in the ONO film 20, the sense amplifier S/A may not identify data.

According to the second embodiment, the sense amplifier S/A reads data temporarily from the memory cell MC in the first storage state and injects charges in the ONO film 20 based on the data. Once the data is read temporarily, the number of holes in the body 50 can be varied. The voltage and the time which are effective for injecting charges in the ONO film 20 are thus set. The amount of charges trapped in the ONO film 20 is increased significantly and the sense amplifier S/A reads the data depending on trapped charges in the ONO film 20 correctly. Because of such reasons, the sequential save mode is preferable to the batch save mode. The sequential return mode is preferable to the batch return mode because of the same reasons.

Specific methods for injecting charges in the ONO film 20 in the sequential save mode or the erase operation will be described next. The method shown in FIG. 9 can be used. Charge injection is performed upon a memory cell MC selected by the source, the drain, and the back gate. In the sequential save mode, a voltage applied to the "0" cell is set to be different from a voltage applied to the "1" cell. Holes are generated by band-to-band tunneling only in the "1" cell. The difference in the number of holes in the ONO film 20 between the "0" cell and the "1" cell becomes large. Data identification at the time of reading is thus easy.

Figure 13:
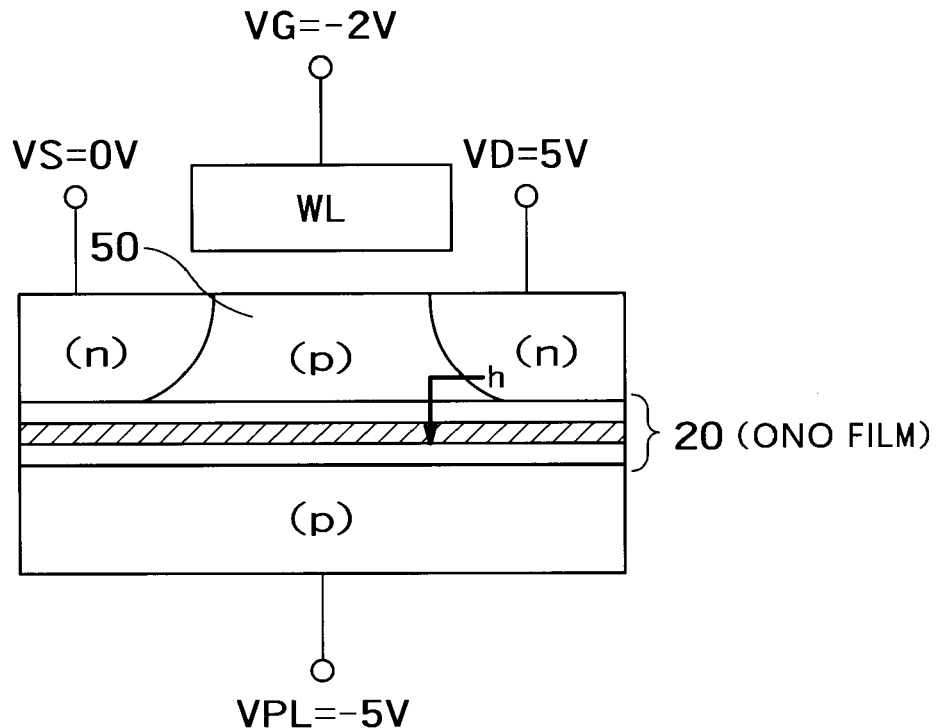
FIG. 13 is a conceptual cross-sectional view showing another method for injecting holes in the ONO film 20 in the sequential save mode or the erase operation.

FIG. 13 is a conceptual cross-sectional view showing another method for injecting holes in the ONO film 20 in the sequential save mode or the erase operation. A first voltage (e.g., 5 V) is applied between the drain and the source and a second voltage (e.g., −5 V) between the back gate and the source. Band-to-band tunneling hot hole injection thus occurs and holes are injected in the ONO film 20.

For example, assume that the front gate potential VG of a selected memory cell MC is −2 V, the source potential VS 0 V, the drain potential 5 V, and the back gate potential VPL −5 V. Band-to-band tunneling thus occurs at the bottom of the body 50 near the drain. Holes generated in the valence band are accelerated in the source direction by the horizontal electric field between the body and the drain. The holes obtain energy to cross the barrier of the first silicon dioxide film. The holes are then injected in the SiN film. According to this method, as well as the drain-back gate voltage or the front gate-back gate voltage, the drain-source voltage is used to apply sufficient energy for crossing the barrier of the first silicon dioxide film to holes. Holes are injected in the ONO film 20 by a voltage (5 V) whose absolute value is smaller than that of the back gate voltage (−20 V or −10 V) generated by FN tunneling shown in FIGS. 8 and 9. The efficiency of hole injection according to the method shown in FIG. 13 is higher than that of the methods shown FIGS. 8 and 9 and the save mode and the erase operation are completed in a shorter time. Because programming in the ONO film 20 is accomplished by voltages with smaller absolute value, power consumption is reduced. According to the method shown in FIG. 13, the region subjected to hole injection is limited to the vicinity of the body-drain PN junction. To inject holes near the body-source PN junction, the relationship between the source potential VS and the drain potential VD is reversed.

The front gate voltage VG is set so that channels are not formed on the top surface of the body 50. Power consumption during the save mode or the erase operation is thus reduced. As compared to the methods shown in FIGS. 8 and 9, the method shown in FIG. 13 accomplishes reduced power consumption and higher injection efficiency. The save mode is completed in a shorter time.

Figure 14:
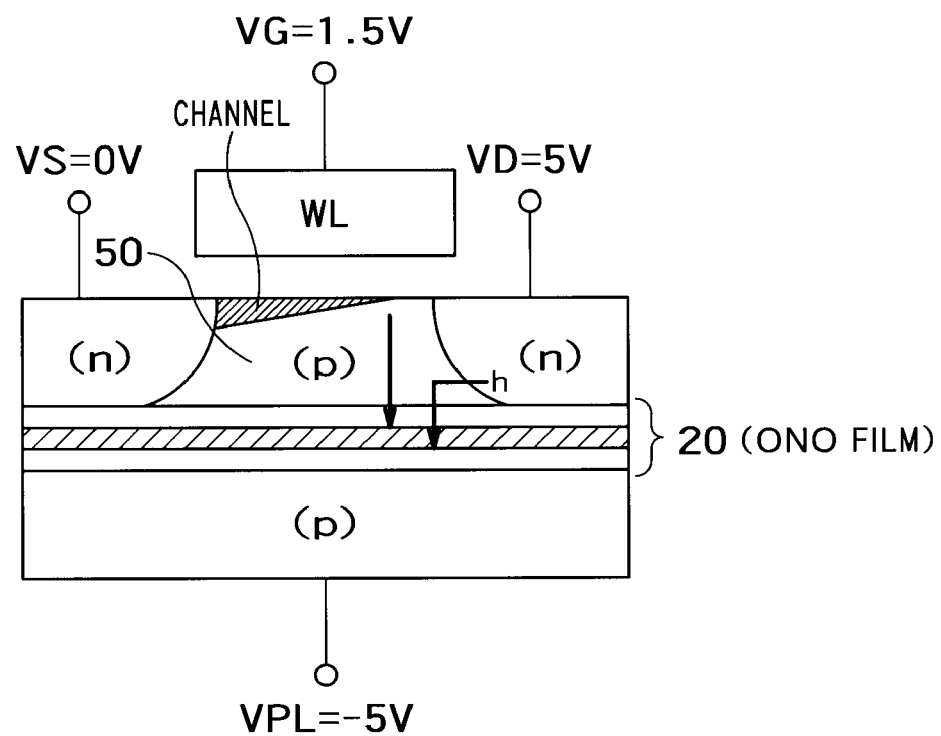
FIG. 14 is a conceptual cross-sectional view showing yet another method for injecting holes in the ONO film 20 in the sequential save mode or the erase operation.

FIG. 14 is a conceptual cross-sectional view showing yet another method for injecting holes in the ONO film 20 in the sequential save mode or the erase operation. The method shown in FIG. 14 is different from that of FIG. 13 in that a positive potential is applied as the front gate potential VG.

According to the method shown in FIG. 14, a channel is formed on the top surface of the body 50 and holes are generated by impact ionization. Such holes are accelerated in the vertical electric field of the body 50 so as to be injected in the ONO film 20. The thickness of the body 50, i.e., the thickness of the SOI film is preferably small. The density of an acceptor impurity is reduced so that the body 50 is fully depleted. A large vertical electric field is thus generated in the body 50. Because the method shown in FIG. 14 generates holes by impact ionization, higher hole injection efficiency is accomplished as compared to the method shown in FIG. 13. While the method shown in FIG. 14 consumes much power as compared to the method shown in FIG. 13, higher injection efficiency is realized and the save mode and the erase operation are completed in a short time.

According to a modified example of the method shown in FIG. 14, negative values are set to the front gate voltage VG. Band-to-band tunneling occurs close to the top surface of the body 50 near the body-drain junction and holes are generated. The vertical electric field in the body 50 must be large. The method accomplishes high hole injection efficiency without increasing power consumption.

Figure 15:
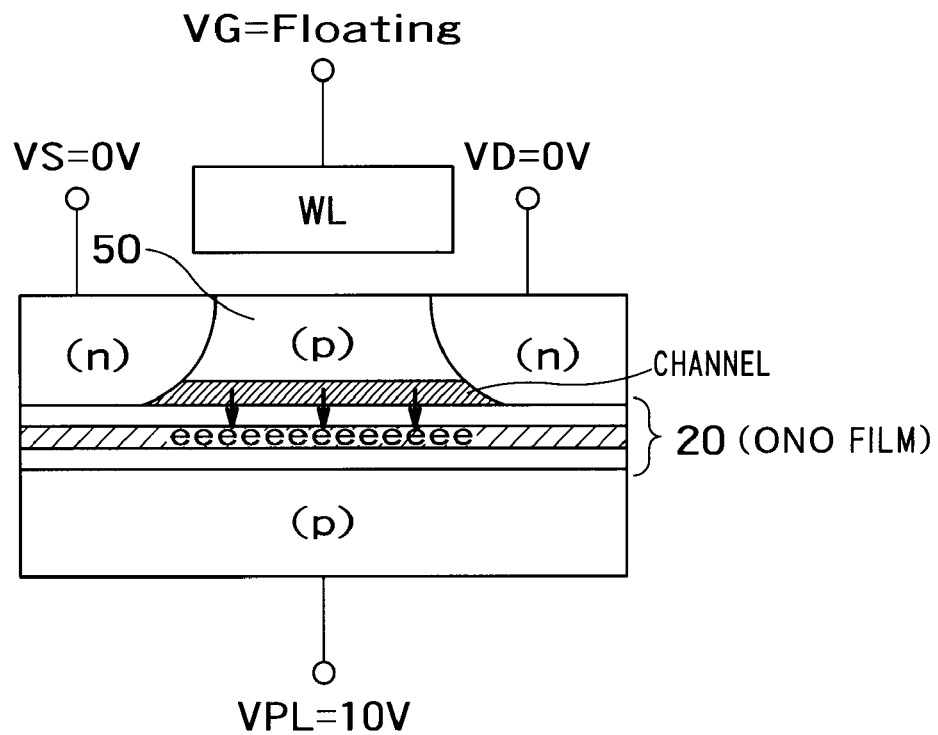
FIG. 15 is a conceptual cross-sectional view showing a method for injecting electrons in the ONO film 20 in the sequential save mode or the erase operation.

FIG. 15 is a conceptual cross-sectional view showing a method for injecting electrons in the ONO film 20 in the sequential save mode or the erase operation. According to the method shown in FIG. 15, a voltage is applied between the front gate and the back gate in order to inject electrons in the ONO film 20 utilizing FN tunneling. For example, while the front gate potential VG is floating, the back gate potential VPL is set to 10 V, the source potential VS and the drain potential VD to 0 V. A back channel is thus formed at the bottom of the body 50 and electrons "e" are injected from the back channel in the ONO film 20.

In charge injection utilizing FN tunneling, the height of barrier of the first silicon dioxide film in the case of electron is lower than that of hole. When the voltage of the body is equal to that of the back gate in view of absolute value, the electron injection efficiency is higher than the hole injection efficiency. When charges are injected by FN tunneling, the speed of programming electrons in the ONO film 20 is faster than that of hole programming.

Figure 16:
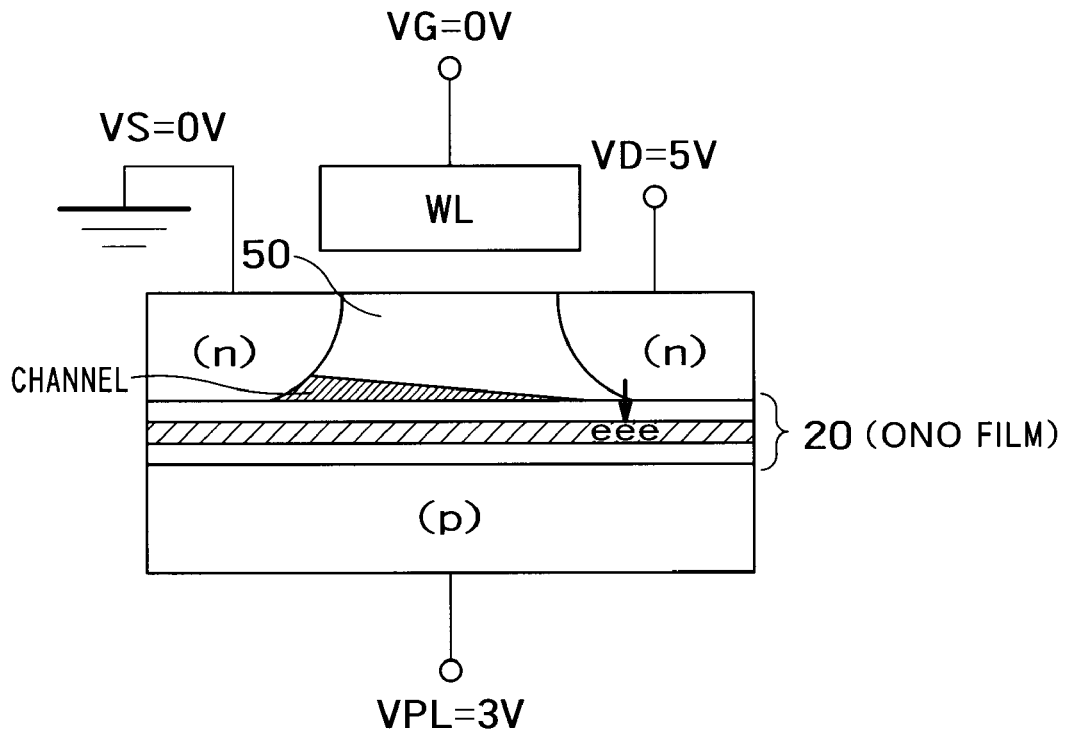
FIG. 16 is a conceptual cross-sectional view showing another method for injecting electrons in the ONO film 20 in the sequential save mode or the erase operation.

FIG. 16 is a conceptual cross-sectional view showing another method for injecting electrons in the ONO film 20 in the sequential save mode or the erase operation. According to the method shown in FIG. 16, a first voltage is applied between the drain and the source and a second voltage between the back gate and the source. A back channel is formed at the bottom of the body 50 and hot electrons are generated near the drain-body junction. Such hot electrons are injected in the ONO film 20. For example, the front gate potential VG is set to 0 V, the back gate potential VPL to 3 V, the source potential VS to 0 V, and the drain potential VD to 5 V. A selected memory cell MC is operated in the saturation region and a high electric field region is formed near the body-drain junction. Electrons obtain sufficient energy for crossing the barrier of the first silicon dioxide film by the high electric field to be injected in the ONO film 20. As described above, channel hot electron injection enables faster programming at lower voltages as compared to injection utilizing FN tunneling.

According to the method shown in FIG. 16, electrons are injected locally near the body-drain PN junction. To inject holes in the body-source PN junction, the relationship between the source potential VS and the drain potential VD is reversed.

A method for reading data depending on the amount of charges in the ONO film 20 effectively will be described next.

Figure 17:
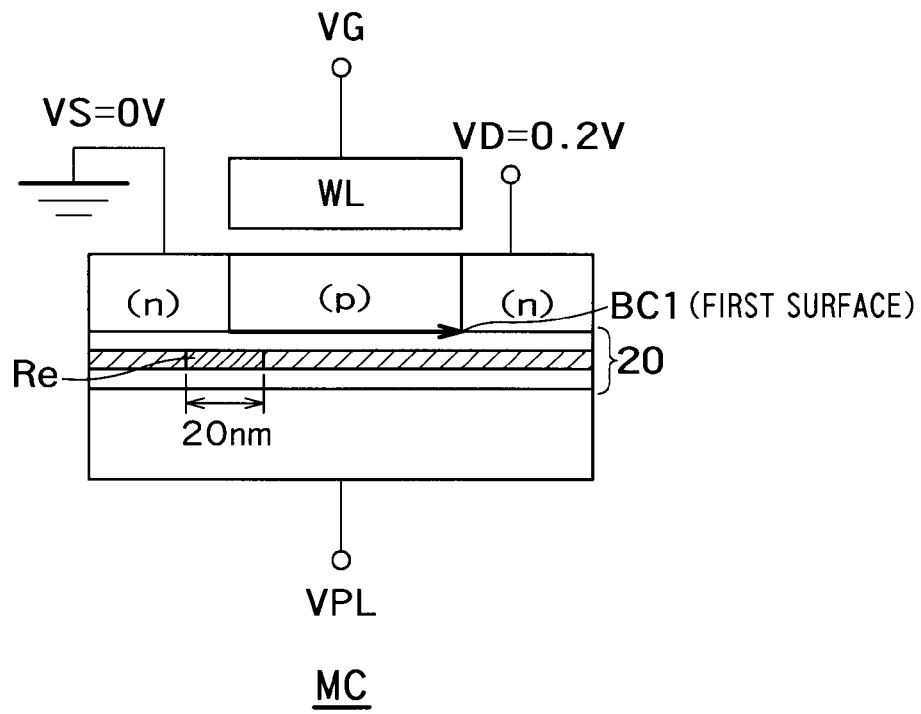
FIG. 17 is a cross-sectional view of a memory cell showing a read operation of a data state depending on the amount of charges in the ONO film 20.

To read a data state depending on the amount of charges in the ONO film 20 of a memory cell MC, as shown in FIG. 17, a current is made to flow in a back channel (first surface) BC1. The difference in threshold voltage in the back channel (difference in threshold voltage between data "1" and "0") depends greatly on the amount of charges in the ONO film 20 as compared to that of a front channel (second surface) BC2 shown in FIG. 18. The sense amplifier S/A identifies the data relatively easy by using the back channel BC1. The threshold voltage is influenced greatly around the region Re where electrons are injected. An electron flowing direction is set to the direction indicated by the arrow in FIG. 17. The difference in current between the data "1" and "0" becomes large and the data identification capability is improved.

The phenomenon that a substrate voltage influences the threshold voltage of a front channel in an MISFET is called a substrate bias effect or a body effect. When the thickness of an SOI film is large or the density of an acceptor impurity in the SOI film is high, an SOI-MOSFET operates in a partially depleted mode. While a front gate voltage influences the front channel of the SOI layer (body 50) greatly, it has an insignificant effect on the back channel of the body 50. In contrast, while a back gate voltage influences the back channel of the body 50 greatly, it has an insignificant effect on the front channel of the body 50. When the SOI-MOSFET is operated in a fully depleted mode, the front gate voltage and the back gate voltage influence greatly both the front channel and the back channel of the body 50.

Figure 18:
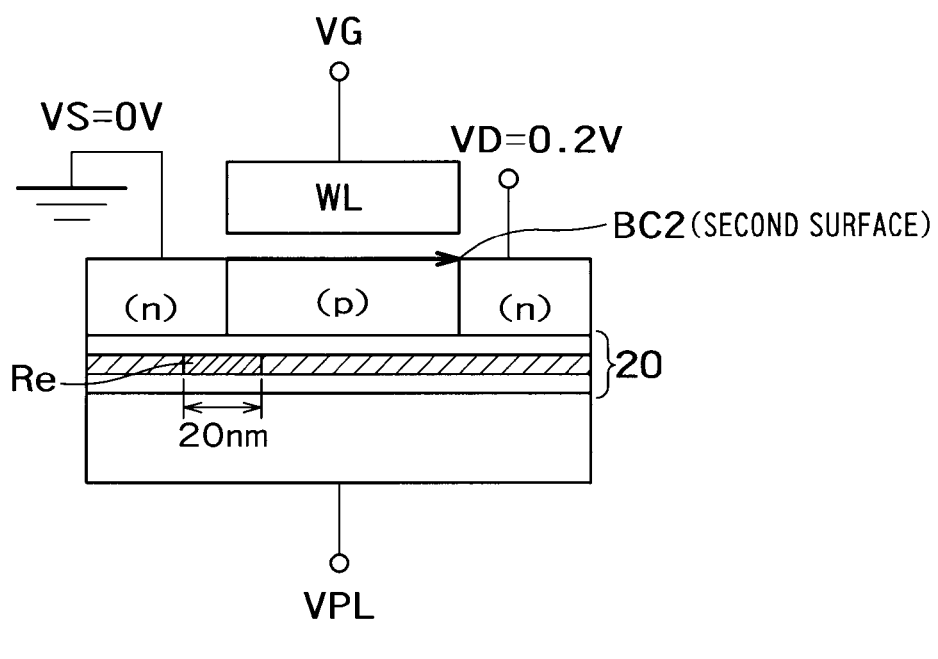
FIG. 18 is a cross-sectional view of a memory cell showing a read operation of a data state depending on the amount of charges in the ONO film 20.

According to the second embodiment, memory cells are preferably operated in the fully depleted mode. The thickness of the body 50 is preferably as small as possible and the acceptor impurity density is as low as possible. When memory cells are operated in the fully depleted mode, both the front channel and the back channel can be used in the reading operation of data based on the second storage state. Both of the reading operations shown in FIGS. 17 and 18 are used. As mentioned above, the difference in threshold voltage between data "1" and "0" is large when a channel (inversion layer) is formed in the first surface which is in contact with the charge trapping film. However, some electrons in the channel are injected to the charge trapping film in the read operation, and data is gradually changed over time, and eventually the data is lost. To prevent this read disturbance, it is desirable that data in the second storage state is read by forming a channel in the opposite surface, that is the second surface. For the same reason, it is desirable that data in the first storage state is read by forming a channel in the second surface.

In a third embodiment of the present invention (described later), when the amount of charges trapped in the ONO film 20 is read, the threshold voltage of the front channel (second surface) is modulated based on the body effect by the back gate voltage and the back gate voltage blocking effect by the trapped charge. The difference in threshold voltage between the data "0" and the data "1" becomes larger as the thickness of the body 50 (SOONO film) is small.

Even in the fully depleted mode, if the back gate voltage is low and the bottom surface of the body (first surface) is in an accumulated state, the body effect is weakened. A voltage is applied to the back gate BG so that the bottom surface (first surface) of the body 50 is depleted. If the back gate is an N-type, 0 V is applied to the back gate. If the back gate is a P-type, 1 V is applied to the back gate. Alternatively, to deplete the back surface of the body 50 (first surface), a forward bias is applied between the body and the drain to remove holes in the body 50 so as to deplete the body. A current is then flown to the front channel (second surface) in a transient state.

Figure 19:
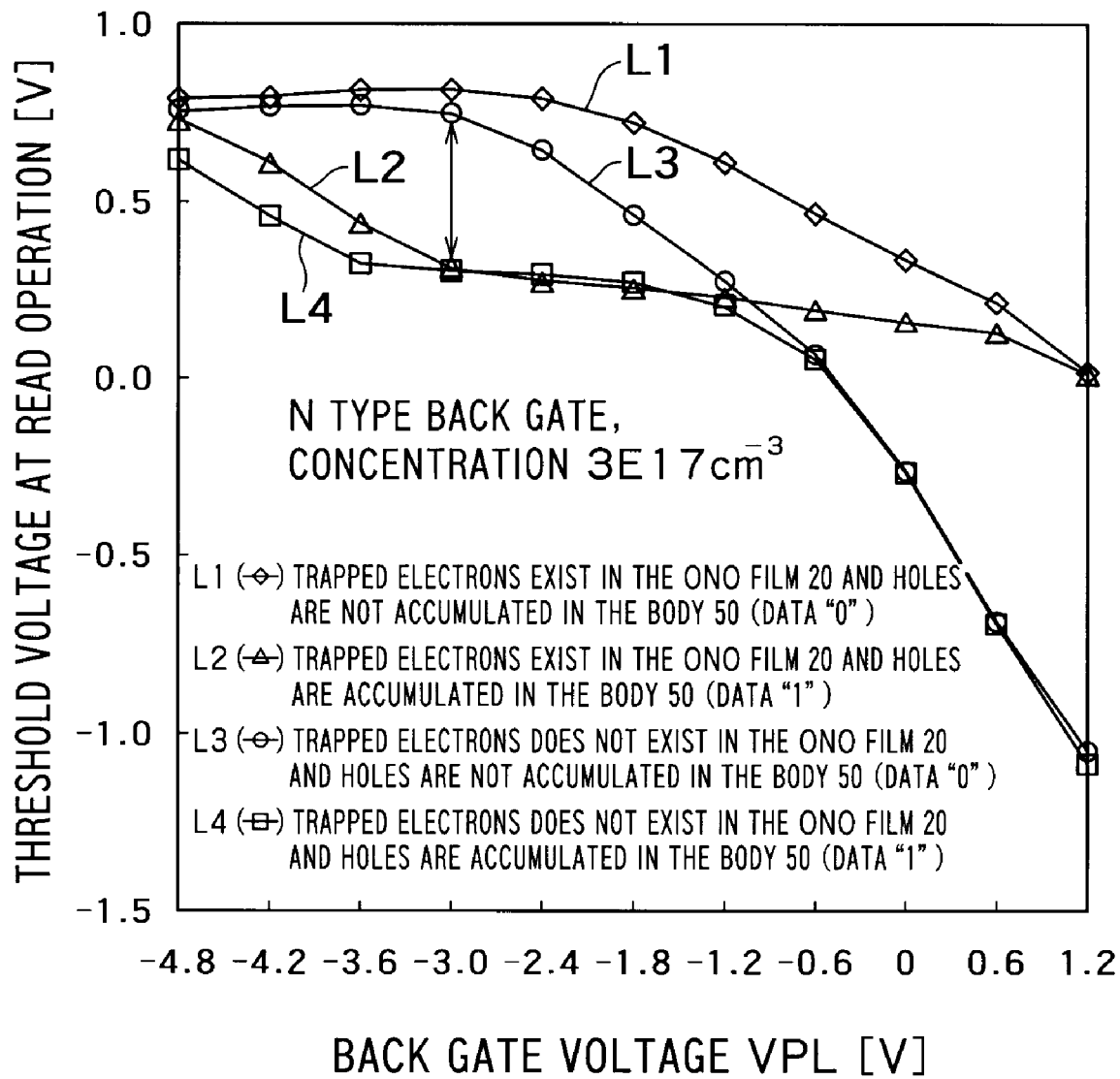
FIG. 19 is a graph showing threshold voltages of the front channel calculated by using input waveforms.

FIG. 19 is a graph showing threshold voltages of the front channel (second surface) calculated by using input waveforms shown in FIG. 3. The configuration of a memory cell is the same as in the first embodiment. The graph shown in FIG. 19 utilizes an N-type back gate with an impurity density of $3 \times 10^{17}$ cm$^{-3}$. Lines L1 and L2 indicate the state that trapped electrons exist in the ONO film 20 near the source-body PN junction. The width of part of the ONO film 20 with trapped electrons is about 20 nm and its area density of charges is about $1 \times 10^{13}$ cm$^{-2}$. Line L1 indicates the state that holes are not accumulated in the body 50 (data "0"). Line L2 indicates the state that holes are accumulated in the body 50 (data "1"). Lines L3 and L4 indicate the state that the ONO film 20 does not have any trapped electrons near the source-body PN junction. Line L3 indicates the state that holes are not accumulated in the body 50 (data "0"). Line L4 indicates the state that holes are accumulated in the body 50 (data "1"). The horizontal axis indicates the back gate voltage. The vertical axis indicates the threshold voltage at the time of reading.

When comparing the cases that many holes are in the body (Lines L2 and L4) at −3 V of the back gate voltage, the threshold voltage of the front channel in Line L4 is 0.299 V while the threshold voltage in Line L2 is 0.310 V. A variation in threshold voltage caused by trapped electrons is small. When comparing the cases that a small number of holes are in the body (Lines L1 and L3), the threshold voltage of the front channel in Line L3 is 0.749 V while the threshold voltage in Line L1 is 0.811 V. The threshold voltage is increased by 66 mV by trapped electrons.

When comparing the cases that trapped electrons do not exist (Lines L3 and L4) at −3 V of the back gate voltage, the difference ΔVth in threshold voltage of the front channel between the data "0" and "1" is about 0.45 V. When comparing the cases that trapped electrons exist (Lines L1 and L2), the difference ΔVth in threshold voltage of the front channel between the data "0" and "1" is about 0.501 V.

0 V is applied to the source, a negative voltage (e.g., −3 V) is applied to the back gate so that the bottom surface of the body 50 (first surface) is in the accumulated state, and the memory cell is operated in the linear region (e.g., 0.2 V is applied to the drain). The usual data reading operation is performed in the FBC memory regardless of the existence of trapped electrons. That means the above described "the first storage state maintaining the second storage state" is accomplished. Effects of trapped charges on the second surface can be weakened by making the first surface in the accumulation state, and strengthened by making the first surface in the depletion state.

At 0 V of the back gate voltage, when comparing the "1" cells, the threshold voltage is −0.27 V in the case that trapped electrons do not exist (L4), while the threshold voltage is 0.16 V in the case that trapped electrons exist (L2). Namely, trapped electrons decrease substantially the back gate voltage. The threshold voltage of the front channel is increased by the existence of the trapped electrons. The difference in threshold voltage is 0.43 V.

0 V is applied to the source, the back gate voltage is set so that the bottom surface of the body 50 is depleted (e.g., 0 V or higher), and the memory cell is operated in the linear region (e.g., 0.2 V is applied to the drain). The data state depending on the amount of trapped electrons in the ONO film 20 is identified more easily. For example in FIG. 19, as the back gate voltage is increased from 0 V, the difference in threshold voltage (the difference between Lines L2 and L4) is increased. According to the second embodiment, control of the back gate voltage enables the sense amplifier S/A to read the data state depending on trapped electrons in the ONO film correctly.

If the thickness of the body 50 (SOONO film) is small, the difference in threshold voltage is increased when the data depending on majority carriers in the body 50 is read. The difference in threshold voltage is also increased when the data depending on trapped charges in the ONO film 20 is read.

Comparing the "0" cells (lines L1 and L3), the difference in threshold voltage is about 0.59 V at around 0 V of the back gate voltage. In the memory cell storing the data "0", the difference in threshold voltage is about 0.59 V depending on the presence of trapped electrons in the ONO film 20. If the body 50 is depleted and a current is flown in the front channel in the transient state, the difference in threshold voltage depending on the amount of trapped electrons in the ONO film 20 is increased.

Figure 20:
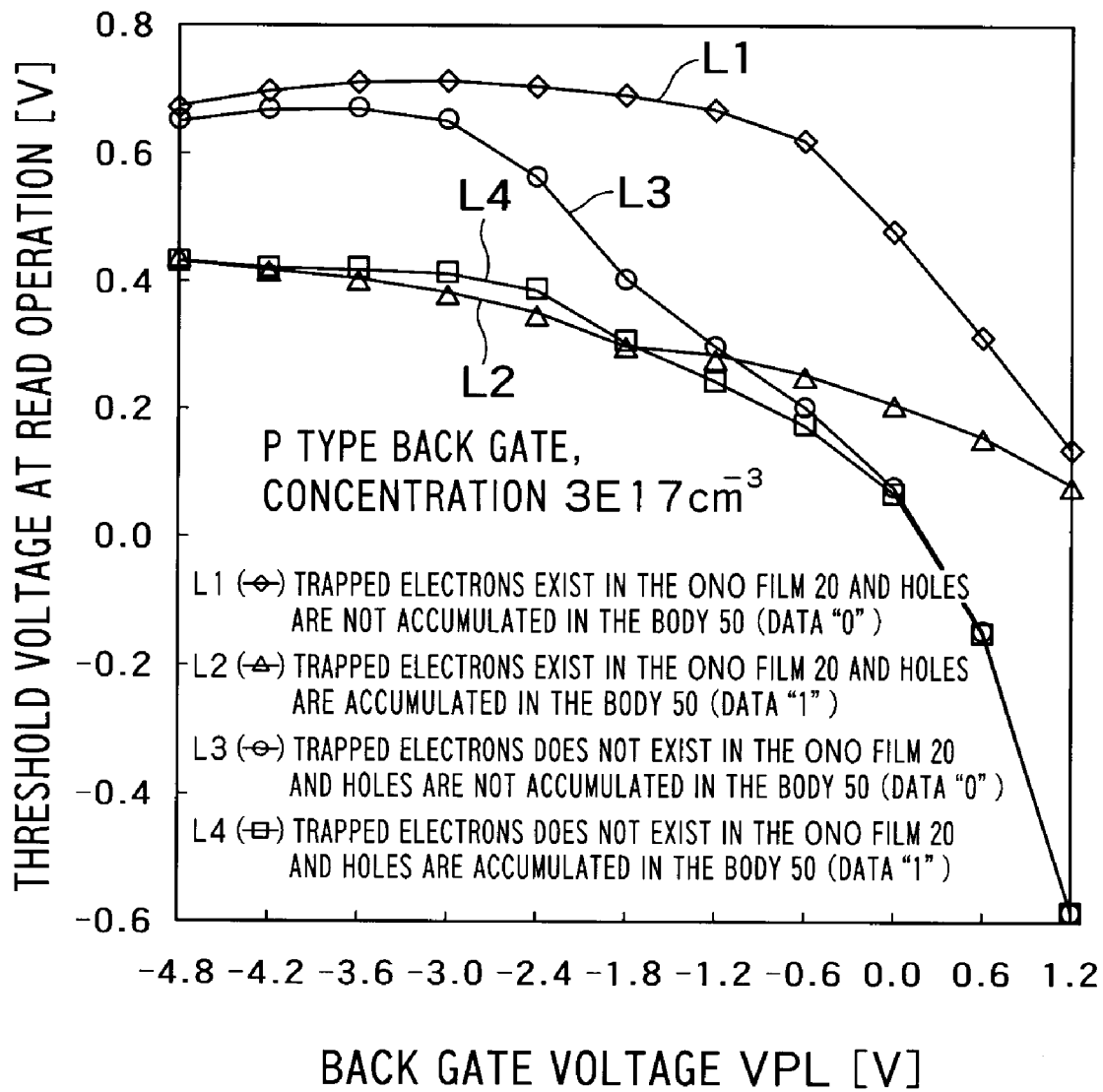
FIG. 20 is a graph of the difference in threshold voltage using a P-type back gate.

FIG. 20 is a graph of the difference in threshold voltage using a P-type back gate with an impurity density of $3 \times 10^{17}$ cm$^{-3}$. To read data in the first storage state, the back gate voltage is set to, e.g., −3.6 V. Comparing cases that trapped electrons do not exist (Lines L3 and L4), the difference in threshold voltage ΔVth of the front channel between the data "0" and "1" is about 0.26 V at a maximum. Comparing cases that trapped electrons exist (Lines L1 and L2), the difference in threshold voltage ΔVth of the front channel between the data "0" and "1" is about 0.31 V. The difference in threshold voltage ΔVth of the memory cell with the N-type back gate is larger than that of the memory cell with the P-type back gate. The memory cell with the N-type back gate achieves easier data identification in the first storage state as compared to the memory cell with the P-type back gate.

Figure 21:
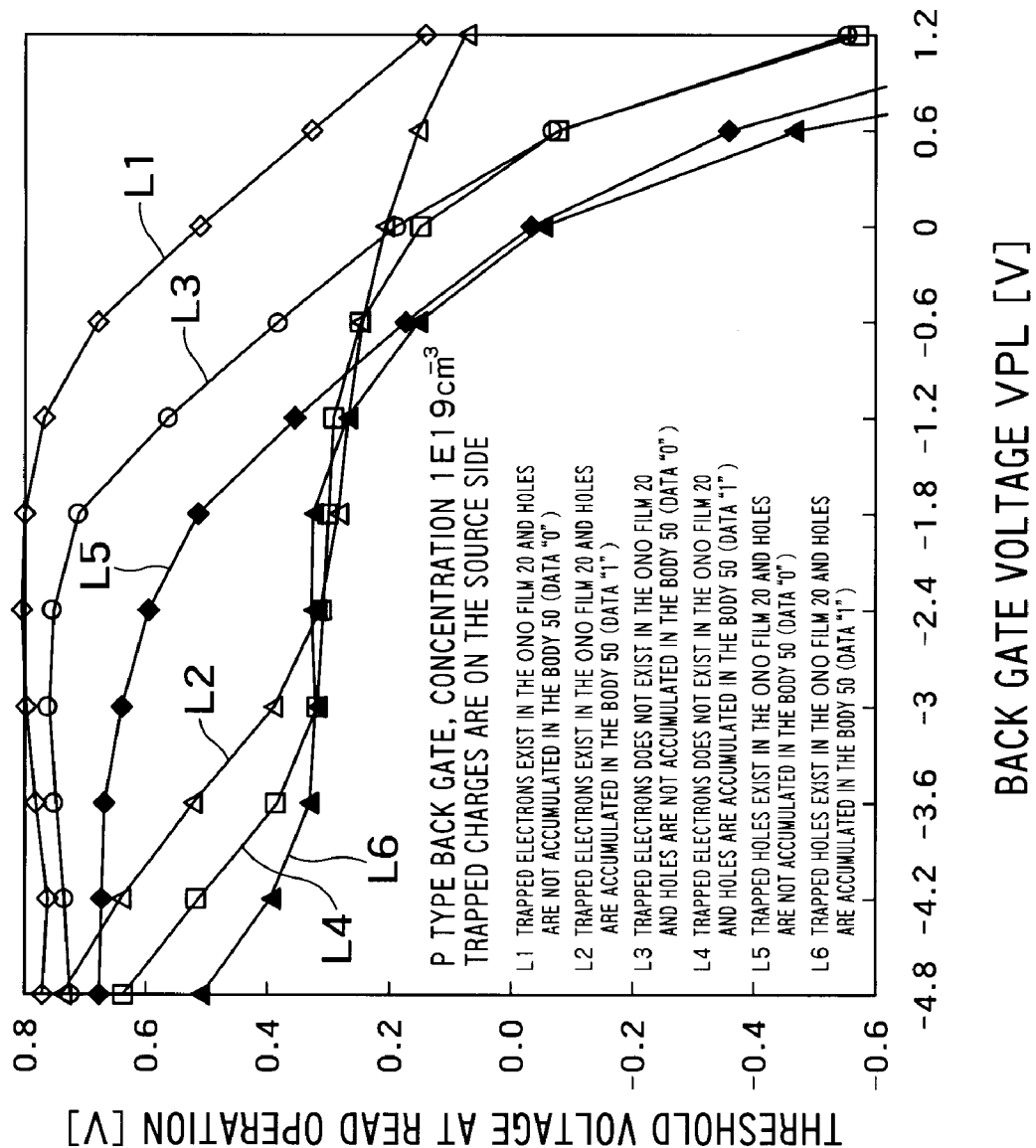
FIG. 21 is a graph of the difference in threshold voltage using a P-type back gate.

FIG. 21 is a graph of the difference in threshold voltage using a P-type back gate with an impurity density of $1 \times 10^{19}$ cm$^{-3}$. To read data in the first storage state, the back gate voltage is set to, e.g., −2.4 V. Comparing cases that trapped electrons do not exist (Lines L3 and L4), the difference in threshold voltage ΔVth of the front channel between the data "0" and "1" is about 0.445 V at a maximum. Comparing cases that trapped electrons exist (Lines L1 and L2), the difference in threshold voltage ΔVth of the front channel is about 0.492 V. By increasing the impurity density in the P-type back gate, depletion of the back gate surface is suppressed. The difference in threshold voltage which is substantially the same as in the N-type back gate is thus provided.

Holes can be injected as trapped charges. Comparing the "1" cells (Lines L2, L4, and L6) at a back gate voltage of −2.4 V, the threshold voltage of the front channel in line L6 is 0.330 V, the threshold voltage in line L4 0.305 V, and the threshold voltage in line L2 0.314 V. A variation in threshold voltage caused by trapped electrons and holes is small. Comparing the "0" cells (Lines L1, L3, and L5), the threshold voltage of the front channel in line L5 is 0.594 V, the threshold voltage in line L3 0.751 V, and the threshold voltage in line L1 0.806 V. Comparing cases that trapped holes exist (Lines L5 and L6), the difference in threshold voltage ΔVth of the front channel between the data "0" and "1" is about 0.264 V. When trapped electrons are in the ONO film instead of trapped holes, the threshold voltage of the data "0" is increased, so that the difference in threshold voltage between the data "0" and the data "1" is increased. The data in the first storage state is thus identified easily.

Figure 22:
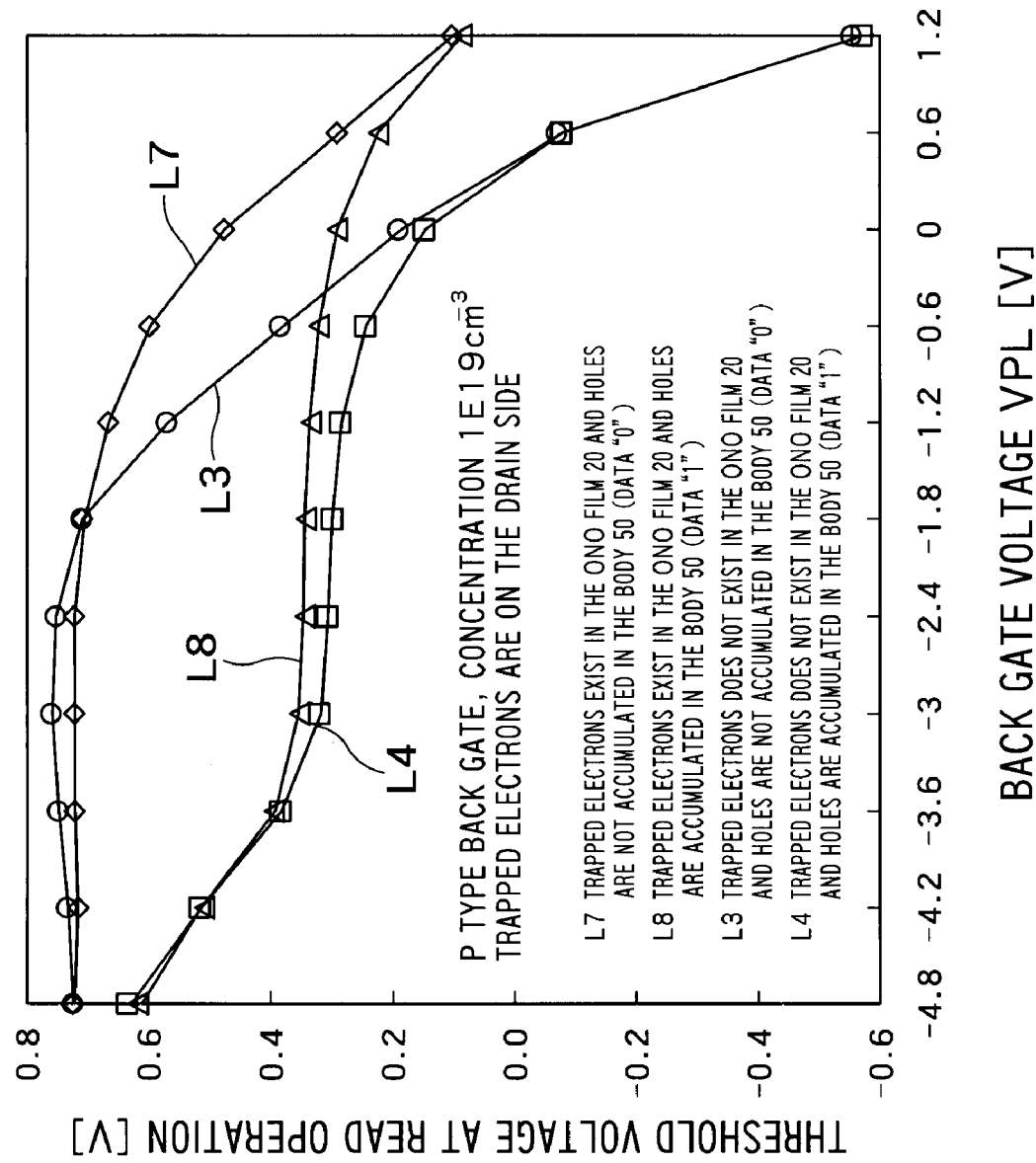
FIG. 22 is a graph of the difference in threshold voltage using a P-type back gate.

FIG. 22 is a graph showing a case that a P-type back gate with an impurity density of $1 \times 10^{19}$ cm$^{-3}$ is used and electrons are placed on the drain side. To read data in the first storage state, the back gate voltage is set to, e.g., −2.4 V. Comparing cases that trapped electrons exist (Lines L7 and L8), the difference in threshold voltage ΔVth of the front channel between the data "0" and "1" is about 0.374 V. When trapped electrons are on the source side, the difference in threshold voltage is 0.445 V. When the data in the first storage state is read, trapped electrons preferably exist on the source side.

Comparing the "0" cells (Lines L7 and L3) at a back gate voltage of 0.6 V, in the case that trapped electrons do not exist (L3), the threshold voltage is −0.072 V. In the case that trapped electrons exist (L7), the threshold voltage is 0.293 V. The difference in threshold voltage depending on the presence of trapped electrons in the ONO film 20 is about 0.365 V. As shown in FIG. 21, when electrons are injected in the source, the threshold voltage is 0.328 V in the case that trapped electrons exist (L1). The difference in threshold voltage depending on the presence of electrons in the ONO film is 0.4 V. When data in the second storage state is read, trapped electrons preferably exist in the source.

Third Embodiment

Figure 23:
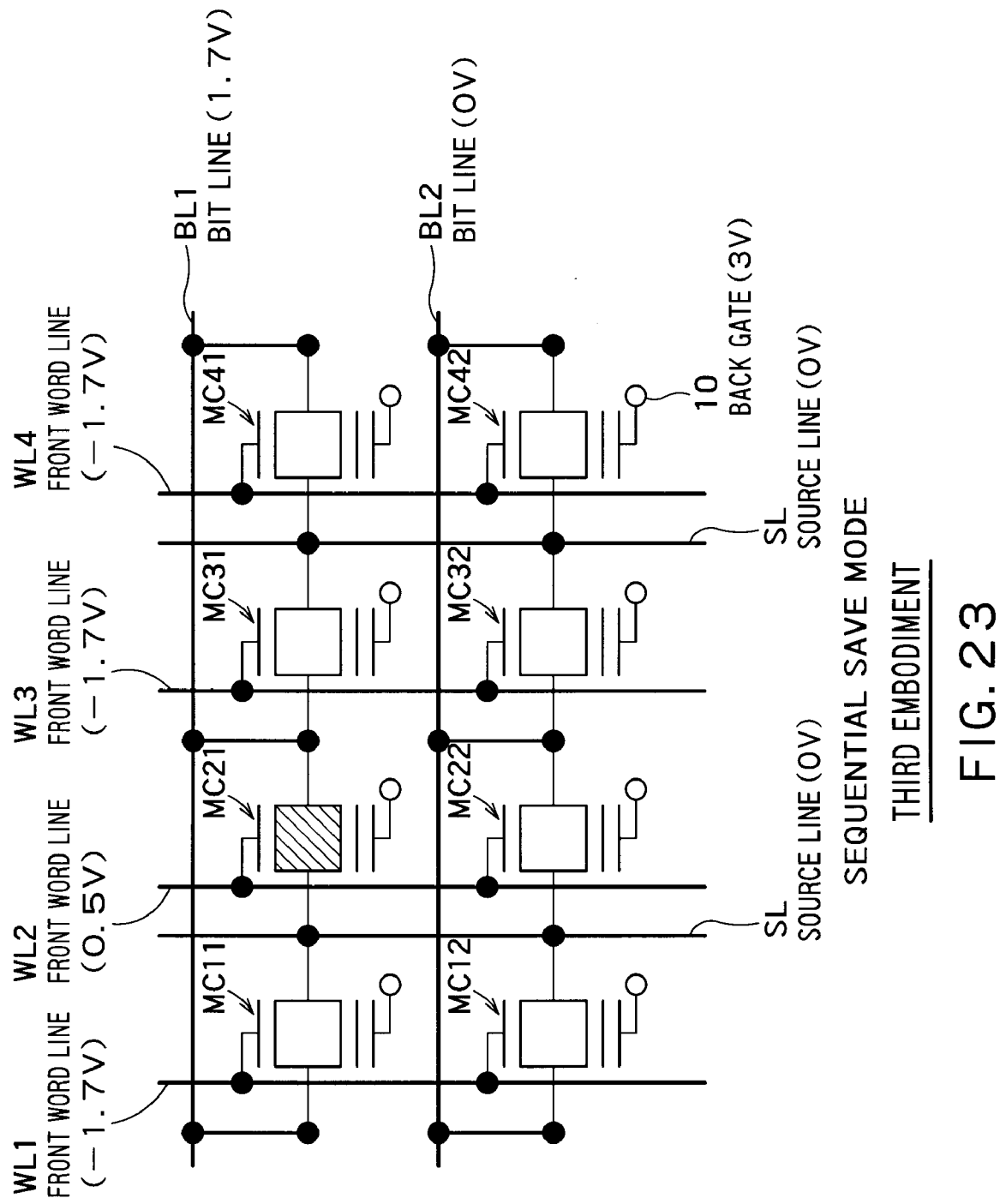
FIG. 23 shows a memory cell array of an FBC memory according to the third embodiment.

FIG. 23 shows a memory cell array of an FBC memory according to the third embodiment. In the third embodiment, memory cells MC11 to MC42 have the same configuration as the memory cell MC in the first or second embodiment. The memory cells MC11 to MC42 are arranged in a matrix. An alphabetical character i in MCij indicates a row number, while j a column number. In the third embodiment, the direction that the bit line extends corresponds to the column direction and the direction that the word line extends corresponds to the row direction.

The gate electrodes of memory cells arranged on the same row are connected to the same front word line. For example, memory cells MC1j are connected to a word line WL1, memory cells MC2j to a word line WL2, memory cells MC3j to a word line WL3, and a memory cell MC4j to a word line WL4. The drains of memory cells arranged on the same column are connected to the same bit line. For example, memory cells MCi1 are connected to a bit line BL1 and memory cells MCi2 to a bit line BL2. A source line SL is common to all memory cells MC11 to MC42. A back gate BG is also common to all memory cells MC11 to MC42.

According to the third embodiment, memory cells connected to a bit line are connected to different word lines. In contrast, memory cells connected to a word line is connected to different bit line. With this configuration, by applying voltages to a word line and a bit line, memory cells MC connected to these lines are driven selectively.

In FIG. 23, the memory cell MC21 is a selected memory cell and other memory cells are unselected memory cells. To trap electrons in the ONO film 20, a first voltage (e.g., 0 V) is applied to the source line SL common to memory cells. A second voltage lower than the first voltage (e.g., −1.7 V) is applied to unselected front word lines. A third voltage higher than the second voltage (e.g., 0.5 V) is applied to the front word line WL2 (selected front word line) connected to the selected memory cell. A fourth voltage higher than the third voltage (e.g., 3 V) is applied to the back gate BG common to the memory cells. A fifth voltage lower than the first voltage (e.g., −1.7 V) is applied to the bit line BL1 (selected bit line) to which the selected memory cell is connected and the first voltage is applied to other unselected bit line BL2. A current is flown in the back channel of the selected memory cell (first surface) and the resulting hot electrons are injected in the ONO film 20.

The memory cells MC11, MC31, and MC41 are unselected memory cells connected to the bit line on the same column as the selected memory cell MC21. The memory cell MC22 is an unselected memory cell connected to the front word line on the same row as the selected memory cell MC21. The memory cells MC12, MC32, and MC42 are unselected memory cells connected to the bit line on the different column from the selected memory cell MC21 and to the front word lines on the different rows from the selected memory cell MC21. A voltage of −1.7 V is applied between the drains and the sources of the memory cells MC11, MC21, MC31, and MC41 while a voltage of 3 V between the back gates and the sources. 0.5 V is applied only to the front word line WL2 to which the memory cell MC21 is connected, while −1.7 V to other front word lines. By varying the front gate voltage, threshold voltages at the bottom surfaces of bodies 50 of the unselected memory cell MC11, MC31, and MC41 are higher than a threshold voltage at the bottom surface of body 50 of the selected memory cell MC21. Because a large current flows in the selected memory cell MC21, electrons are injected in the ONO film 20 of the selected memory cell MC21. Because small currents flow in the unselected memory cells MC11, MC31, and MC41, electrons are not injected in their ONO films 20. Because the drain-source voltages of the unselected memory cells MC 12, MC22, MC32, and MC42 are 0 V, electrons are not injected in the ONO films 20 of the unselected memory cells MC 12, MC22, MC32, and MC42. Memory cells storing the data "1" in the memory cell array are selected successively and electrons are injected to their ONO films 20. The entire memory cell array is thus injected.

As mentioned above with reference to FIG. 23, only the memory cell MC21 is the selected memory cell and one memory cell is selected at a time. However, all memory cells MC2j connected to the front word line WL2 can be selected. Among all bit lines (1024 lines in the example of FIG. 1) connected to the front word line WL2, −1.7 V is applied to bit lines to which memory cells with the data "1" are connected while 0 V to bit lines to which memory cells with the data "0" are connected. The memory cell MC22 shown in FIG. 23 is the selected memory cell in this case and the data "0" is programmed. Data are thus programmed at the same time in the ONO films 20 of all memory cells connected to the front word line WL2. The back gate BG voltage is then returned to −3 V. A series of such operations is repeated sequentially upon all front word lines in the memory cell array. Electrons are thus injected in all memory cells storing the data "1" in the memory cell array in a short time.

The memory cells connected to the front word line WL2 are all connected to the same source line. Currents flow in a plurality of memory cells programming the data "1" in the same direction. According to the third embodiment, electrons flow from the drain 40 to the source 60. Electrons are injected in the ONO film 20 near the source 60. By realizing the currents flowing in the same direction at the time of programming, positions where electrons are injected are aligned and a variation in threshold voltage becomes small.

When electrons are injected in the ONO film in the third embodiment, the absolute value of drain-source voltage of the selected memory cell is 1.7 V, which is smaller than 5 V shown in FIG. 16. It takes a longer time for injecting electrons. The voltage applied to the selected bit line BL1 (−1.7 V) is lower than −0.9 V shown in FIG. 3. Bit line low disturbance occurs in "1" cells connected to the selected bit line BL1 more frequently than the usual operation. To avoid data loss caused by the bit line low disturbance, intervals between the refresh operations are preferably shortened (frequency of refresh operation is increased) in the third embodiment.

In the third embodiment, the thickness of the SOONO film 30 is preferably small. The body 50 is thus fully depleted and the body effect is improved. To fully deplete the body 50, the impurity density of the body 50 is decreased and the thickness of the gate insulating film 70 is made to be small. When electrons are injected in the ONO film 20 of the selected memory cell, the threshold voltage of the back channel is modulated by the body effect caused by a selected front gate voltage. As the thickness of SOONO film 30 of the body 50 is small, the difference in threshold voltage between the memory cell connected to the selected word line and the memory cell connected to the unselected word line becomes large.

In a memory cell with its word line having low potential, the surface of the body 50 in contact with the gate is in an accumulated state and the body effect is weakened. In order to inject electrons from the back channel of the body 50 (first surface) into the ONO film 20, relatively high potential is applied to the selected front word line and the corresponding surface of the body 50 (second surface) is depleted. Relatively low potential is applied to the unselected front word line and the corresponding surface of the body 50 (second surface) is in the accumulated state.

Figure 24:
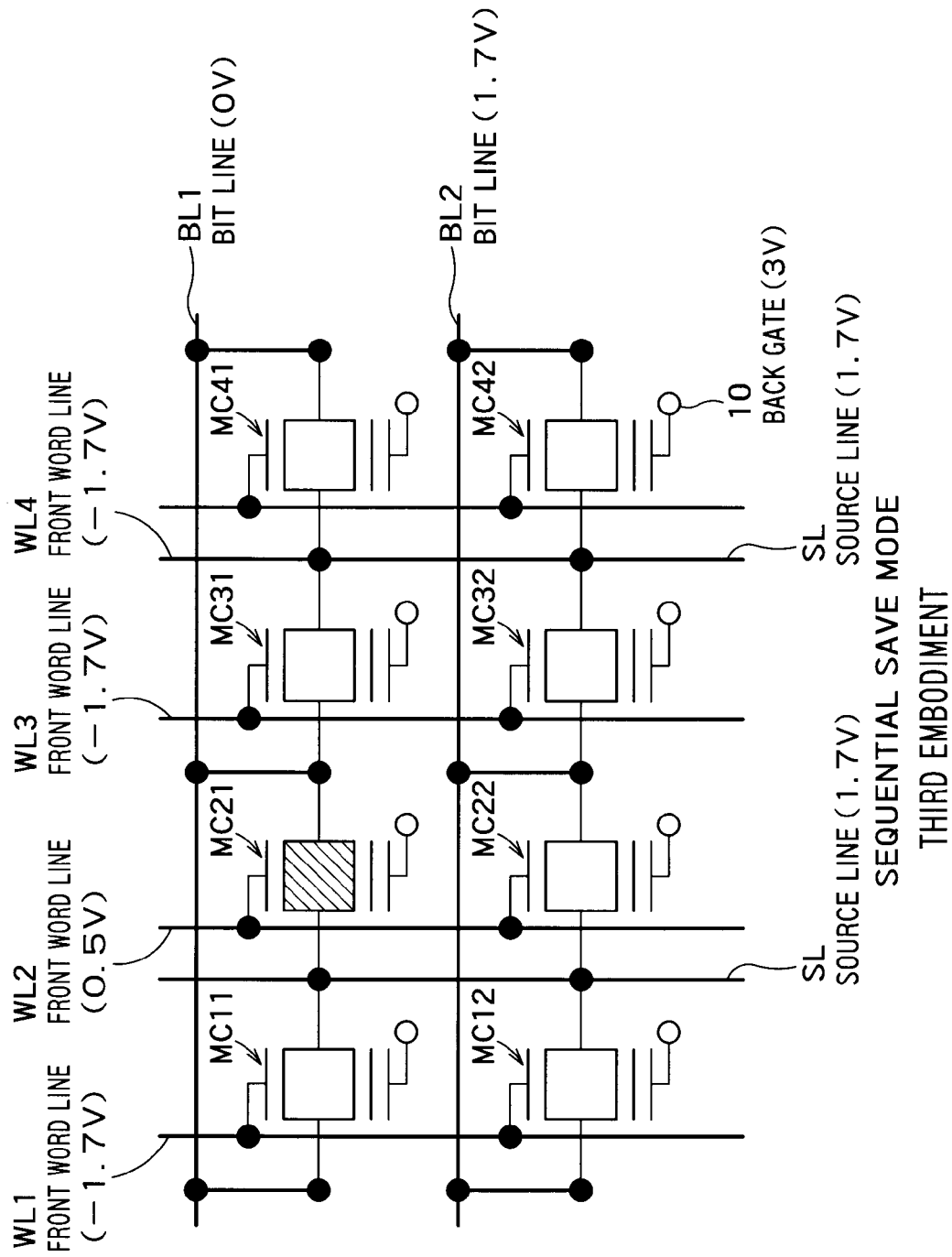
FIG. 24 shows a memory cell array of an FBC memory according to the third embodiment.

With reference to FIG. 24, 0 V is applied to the bit line BL1, 1.7 V to the bit line BL2 and the source line SL. Under such a voltage state, electrons are injected selectively in the ONO film 20 near the source 60 of the memory cell MC21. The absolute value of drain-source voltage of the selected memory cell is 1.7 V, which is smaller than 5 V shown in FIG. 16. It takes a longer time for injecting electrons. 1.7 V is applied to the sources of memory cells connected to the selected bit line BL1 and 0 V to the drains. A memory cell that holds data depending on majority carriers in the body 50 is in a bit line high disturbance state during the usual operation. 1.7 V is applied to the sources and the drains of memory cells connected to the unselected bit line BL2. A leak current in the memory cell that holds the data depending on majority carriers in the body 50 is twice as that of the usual operation. To avoid data loss caused by the bit line high disturbance, intervals between the refresh operations are preferably shortened. The operations shown in FIGS. 23 and 24 enable dynamic volatile data stored in the body 50 to be converted in nonvolatile data depending on trapped charges in the ONO film 20.

Modified Example of Third Embodiment

Figure 25:
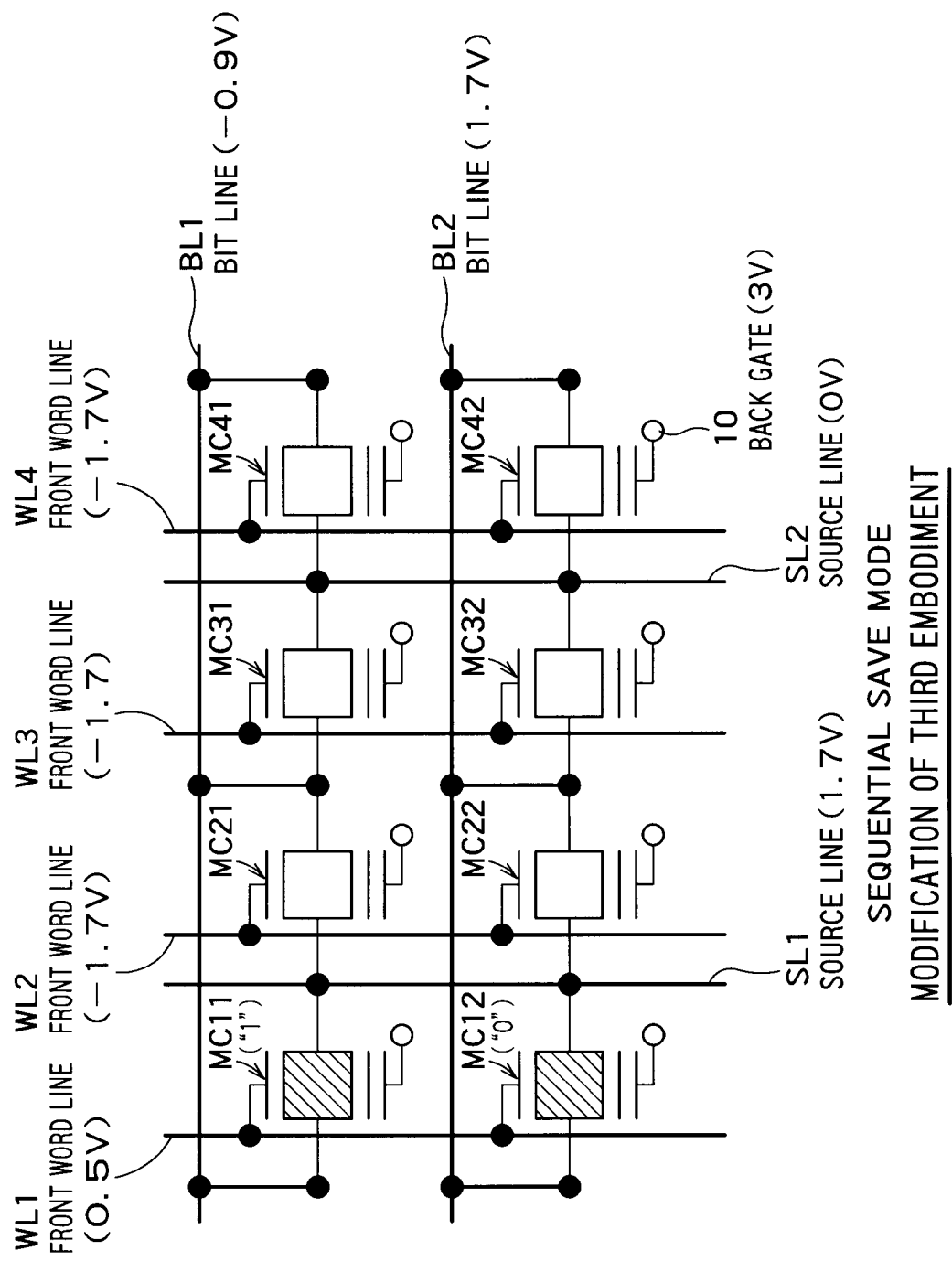
FIG. 25 shows a memory cell array according to a modified example of the third embodiment.

FIG. 25 shows a memory cell array according to a modified example of the third embodiment. The modified example is different from the third embodiment in that the source line is driven selectively. FIG. 25 shows the voltage relationship when electrons are injected selectively in the ONO film 20 in the sequential save mode. In the modified example, a memory cell MC11 storing the data "1" and a memory cell MC 12 storing the data "0" are selected. A first voltage (e.g., 0 V) is applied to an unselected source line SL2. A second voltage which is higher than the first voltage (e.g., 1.7 V) is applied to a selected source line SL1. A third voltage which is lower than the first voltage (−1.7 V) is applied to unselected front word lines WL2 to WL4. A fourth voltage which is higher than the third voltage (e.g., 0.5 V) is applied to a selected front word line WL1. A fifth voltage which is higher than the fourth voltage (e.g., 3 V) is applied to the back gate BG common to all memory cells. A sixth voltage which is lower than the first voltage (e.g., −0.9 V) is applied to a bit line BL1 used for programming the data "1". The second voltage is applied to a bit line BL2 used for programming the data "0". Under such a voltage relationship, electrons are injected in the ONO film 20 of the memory cell MC11. Because the source voltage of the memory cell MC11 (1.7 V) is higher than the drain voltage (−0.9 V), electrons flow from the drain 40 to the source 60. Electrons are thus injected in the ONO film 20 near the body-source PN junction. The data "1" is programmed in the memory cell MC11. The source voltage of the memory cell MC 12 (1.7 V) is equal to the drain voltage (1.7 V). Electrons are not injected in the ONO film 20 of the memory cell MC 12. The memory cell MC 12 stores the data "0". After the data are programmed, −3 V is applied to the back gate BG. Such selective electron injection is repeated sequentially for all front word lines in the memory cell array.

The absolute value of drain-source voltage of the selected memory cell MC11 is 2.6 V, which is larger than 1.7 V shown in FIGS. 23 and 24. "1" or "0" cells connected to the front word lines WL3 and WL4 and holding data depending on majority carriers in their body regions are in the bit line disturbance state as in the usual operation. In the memory cells MC21 and MC22 connected to the front word line WL2, because 1.7 V is applied to the selected source line SL1, a voltage which is different from 0 V is applied to their sources and drains. Leak currents in the memory cells MC21 and MC22 are different from that of the usual operation. Because the save operation is performed for the memory cells connected to the front word line WL2 immediately after the save operation is performed for the memory cells connected to the front word line WL1, the risk of data loss of the memory cells sharing the selected source line is reduced. The modified example thus decreases the possibility of data loss.

In the sequential save mode of the third embodiment and its modified example, when the save operation is performed for memory cells connected to a selected word line, the back gate BG is changed from 3 V to −3 V and common to all memory cells. In memory cells connected to an unselected front word line and holding data depending on the number of majority carriers in the body 50, the bottom surface of the body is changed between the inverted state, the depleted state, and the accumulated state. A leak current is thus generated through the interface state of bottom surface of the body. Data loss is more significant than the usual operation. To avoid such data loss, intervals between the refresh operations are preferably shortened in the third embodiment.

Figure 26:
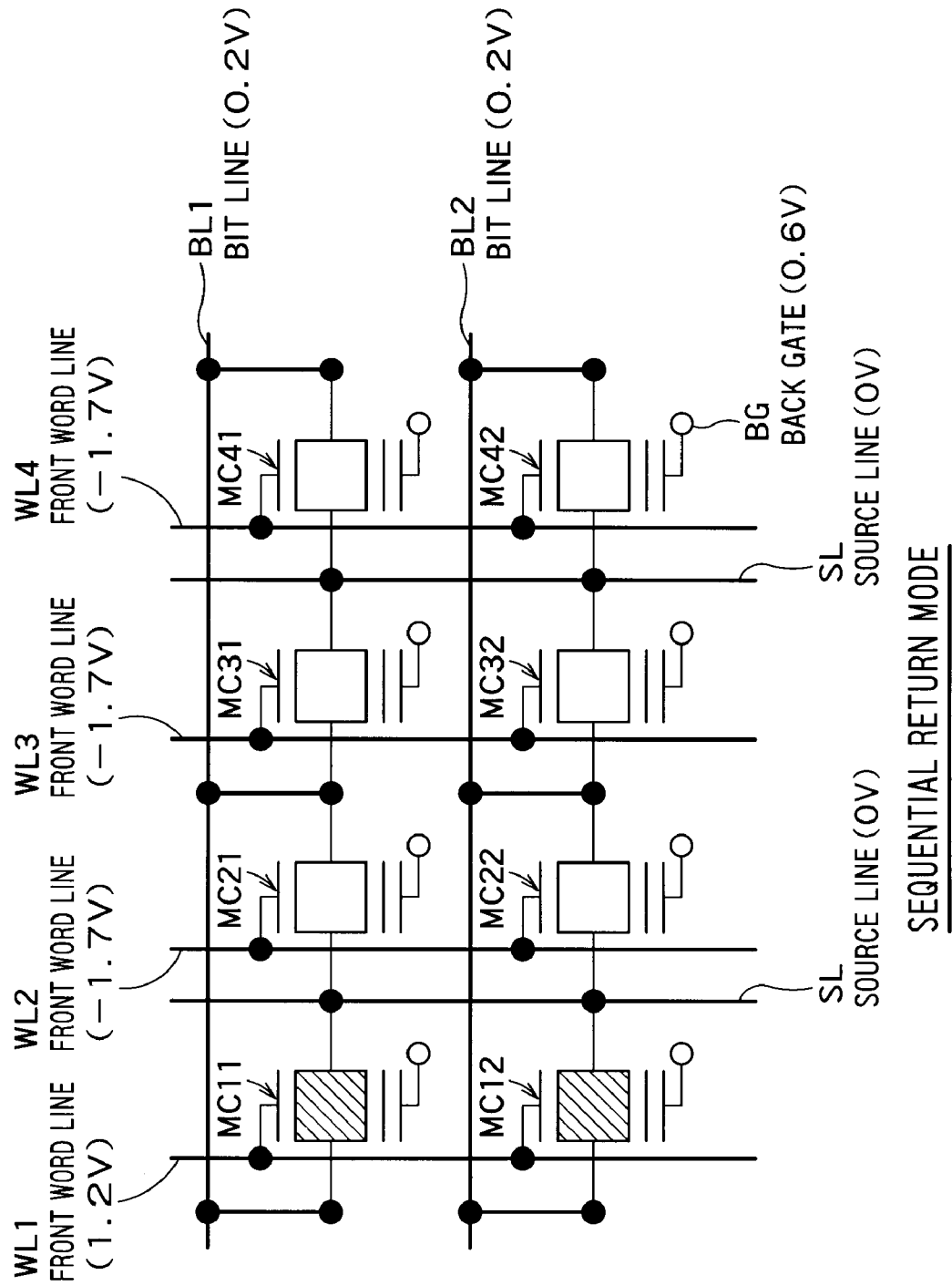
FIG. 26 shows the voltage state when the second storage state is read in the sequential return mode.

FIG. 26 shows the voltage state when the second storage state is read in the sequential return mode. A first voltage (e.g., 0 V) is applied to all source lines SL. A second voltage lower than the first voltage (e.g., −1.7 V) is applied to unselected word line WL2 to WL4. A third voltage higher than the second voltage (e.g., 1.2 V) is applied to a selected word line WL1. A back gate BG is common to all memory cells and a fourth voltage (e.g., 0.6 V) is applied thereto. A fifth voltage which is different from the first voltage (e.g., 0.2 V) is applied to bit lines BL1 and BL2. Voltages are applied as described. Memory cells MC11 and MC12 connected to the selected word line WL1 are selected and the data depending on trapped charges in the respective ONO films 20 of the memory cells MC11 and MC12 are read at the same time. The sense amplifier S/A reads the data in the memory cell array at high speed.

The sense amplifier S/A reads the data depending on electrons in the ONO films 20 of the memory cells MC11 and MC12 and latches the data. If the data is "0", the sense amplifier S/A injects electrons in the ONO film 20 of the corresponding memory cell. If the data is "1", the sense amplifier S/A does not inject electrons because trapped electrons have already been injected in the ONO film 20. Electrons are injected using the methods described with reference to FIGS. 23 to 25. After electrons are injected, the back gate is set to −3 V.

The sense amplifier S/A programs the latched data back in the bodies 50 of the memory cells MC11 and MC12. The method for programming back is the same as in conventional FBC memories. After the return operation is performed for memory cells connected to a front word line, the refresh operation is performed. The refresh operation is performed for memory cells holding data depending on majority carriers in the body 50 (in the first storage state) like the memory cells MC11 and MC12. A series of such operations is performed for all front word lines and the sequential return mode is then completed.

In the erase mode, the source line SL1 is selected so that a pair of front word lines WL1 and WL2 is selected. The sense amplifier S/A reads the data in the respective bodies 50 in all of memory cells MC11, MC 12, MC21, and MC22 connected to the front word lines WL1 and WL2. The read data is stored temporarily in a data holding circuit which is different from the sense amplifier S/A.

Figure 27:
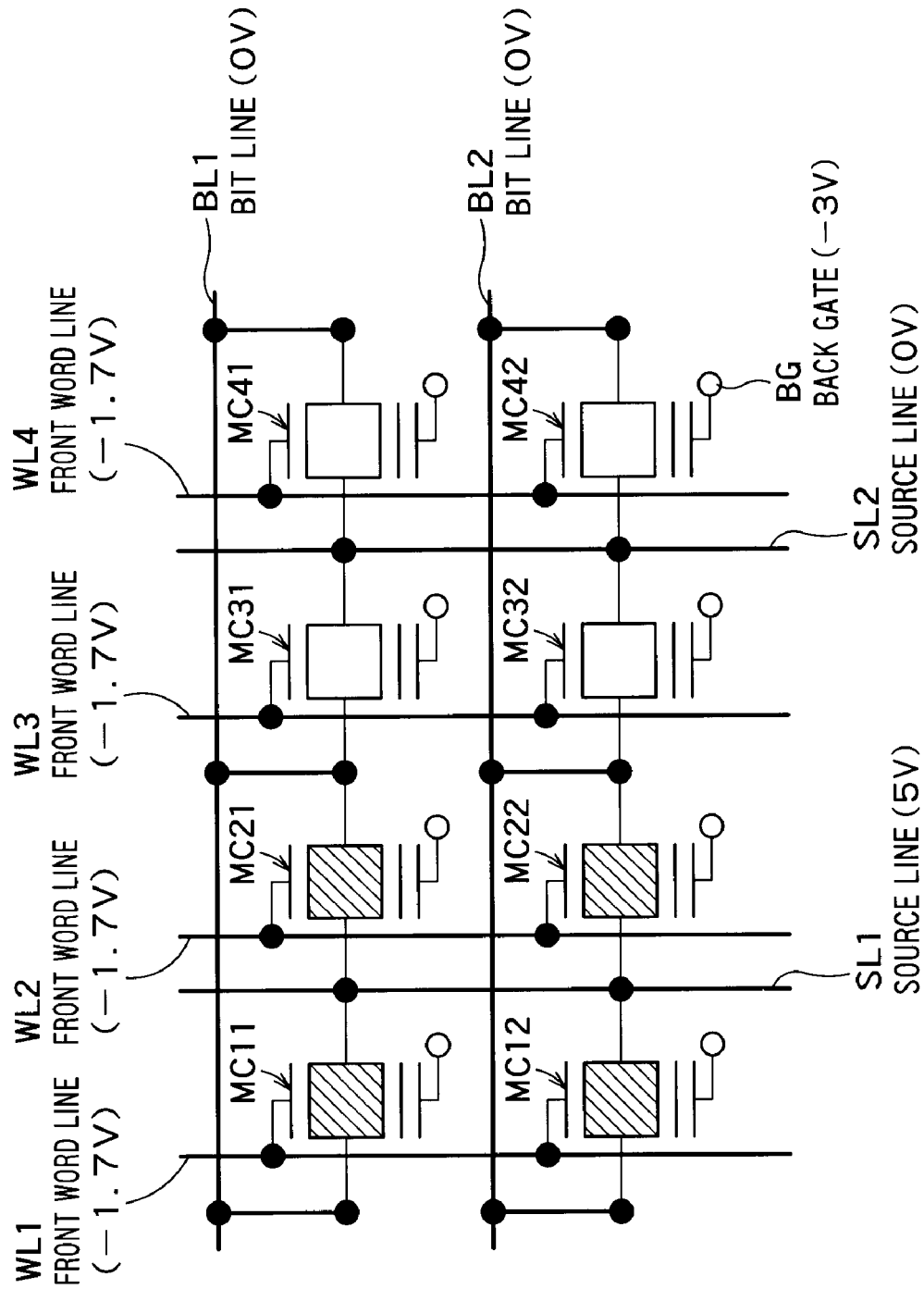
FIG. 27 shows the voltage state when holes are injected in the ONO film 20 in the erase mode.

As shown in FIG. 27, a first voltage (e.g., 0 V) is applied to the unselected source line SL2. A second voltage higher than the first voltage (e.g., 5 V) is applied to the selected source line SL1. A third voltage lower than the first voltage (e.g., −1.7 V) is applied to front word lines WL1 to WL4. A fourth voltage lower than the first voltage (e.g., −3 V) is applied to a back gate BG common to all memory cells. The first voltage (e.g., 0 V) is applied to bit lines BL1 and BL2. Holes are generated near sources 60 of the memory cells connected to the selected source line SL1 by band-to-band tunneling. Holes are accelerated by the source-body electric field so as to be injected as hot holes in the ONO film 20 near the body-source junction. Injection of holes in the ONO film 20 erases trapped electrons in the ONO film 20. According to memory cells connected to the front word lines WL3 and WL4 and holding the data depending on majority carriers in the respective bodies 50, 0 V is applied to their sources and drains and the cells are in the same state as the pause state. Data loss caused by bit line disturbance is not induced.

After trapped electrons are erased, the sense amplifier S/A reads the data from the data holding circuit and programs the data back in the body 50. The method for programming back is the same as in conventional FBC memories. The erase operation is performed for all front word lines.

According to the modified example of the third embodiment, as shown in FIG. 25, charges are injected in the ONO film 20 near the body-source junction and the source lines are selectively driven in the save mode. High voltage (2.6 V in FIG. 25) is applied between the source and the drain without bit line disturbance. The save mode is thus completed in a short time.

As shown in FIG. 27, holes are injected in the ONO film 20 near the body-source injection by band-to-band tunneling hot hole injection and the source lines are selectively driven in the erase mode. High voltage (5 V in FIG. 27) is applied between the source-drain without the bit line disturbance. The erase mode is thus completed in a short time. Because holes are injected in the ONO films 20 of a plurality of memory cells connected to a selected source line at the same time, the time for erasing data is reduced. If the capacity of data stored temporarily in the data holding circuit is increased and a plurality of source lines are selected, the time for erasing data is further reduced.

Fourth Embodiment

The above embodiments describe memory cells formed on the SOONO film 30. A logic circuit area surrounding a memory cell array can be formed on a bulk substrate (silicon substrate 10).

Figure 28:
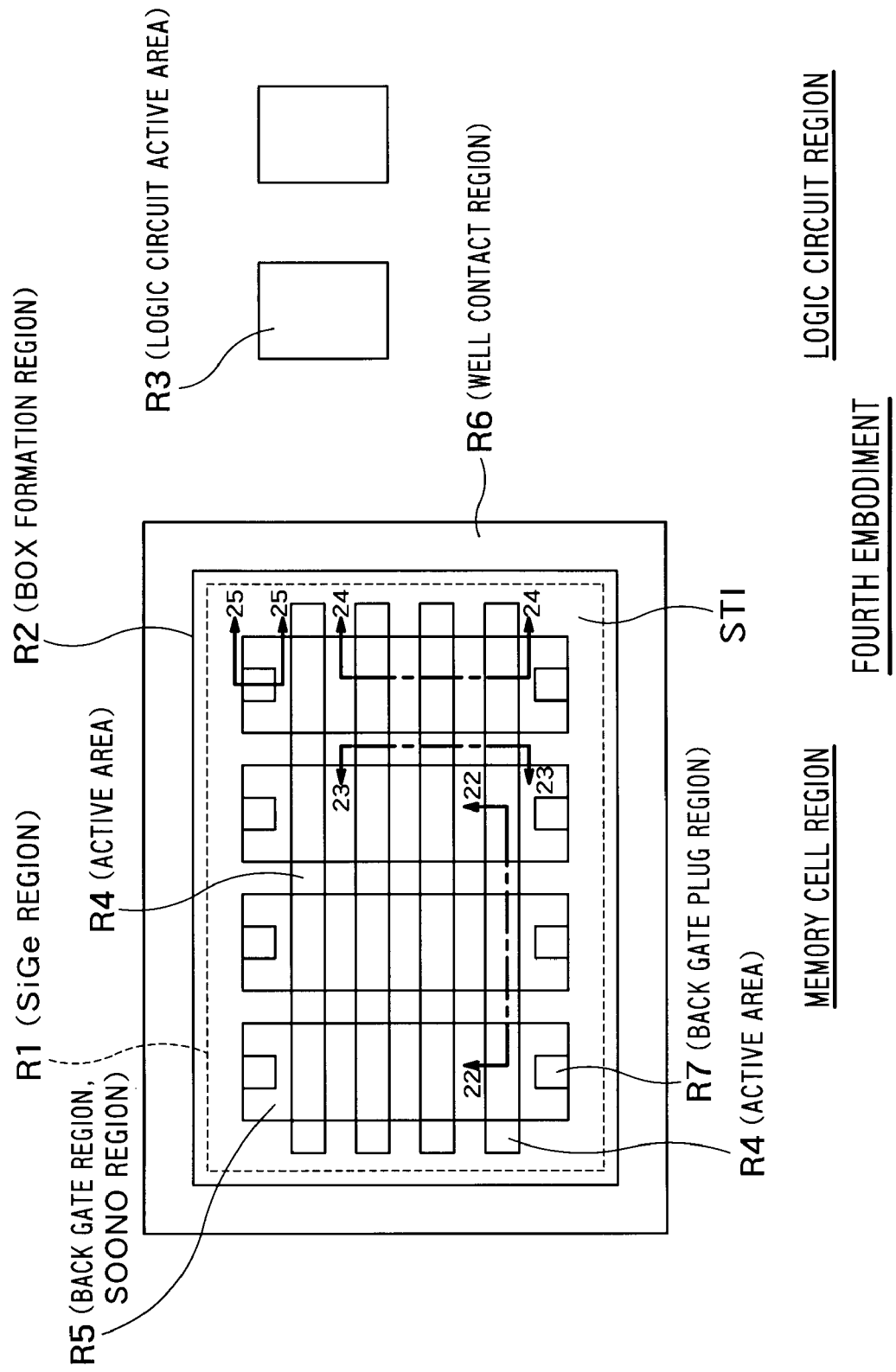
FIG. 28 is a plane layout diagram of an FBC memory according to a fourth embodiment of the present invention.

FIG. 28 is a plane layout diagram of an FBC memory according to a fourth embodiment of the present invention. Memory cells are formed on the region R2 where BOX (Buried Oxide) is formed, while a logic circuit on a bulk substrate. A cell array area is surrounded by a well contact region R6. An active area R4 isolated by STI is formed on a SiGe region R1 within the well contact region R6. A back gate region R5 extends so as to be perpendicular to the active area R4. An SOONO film and polysilicon serving as a back gate are formed in the back gate region R5. The back gate extends to the ends of the cell array area to be connected via a plug made of polysilicon to a back gate line (see FIG. 32) in a back gate plug region R7.

The impurity density of wells in the cell array is low. Alternatively, no well is formed in the cell array. Capacitances of the back gate and a supporting substrate are reduced. Power consumption of the logic circuit caused by a swing in back gate voltage is reduced.

Figure 29:
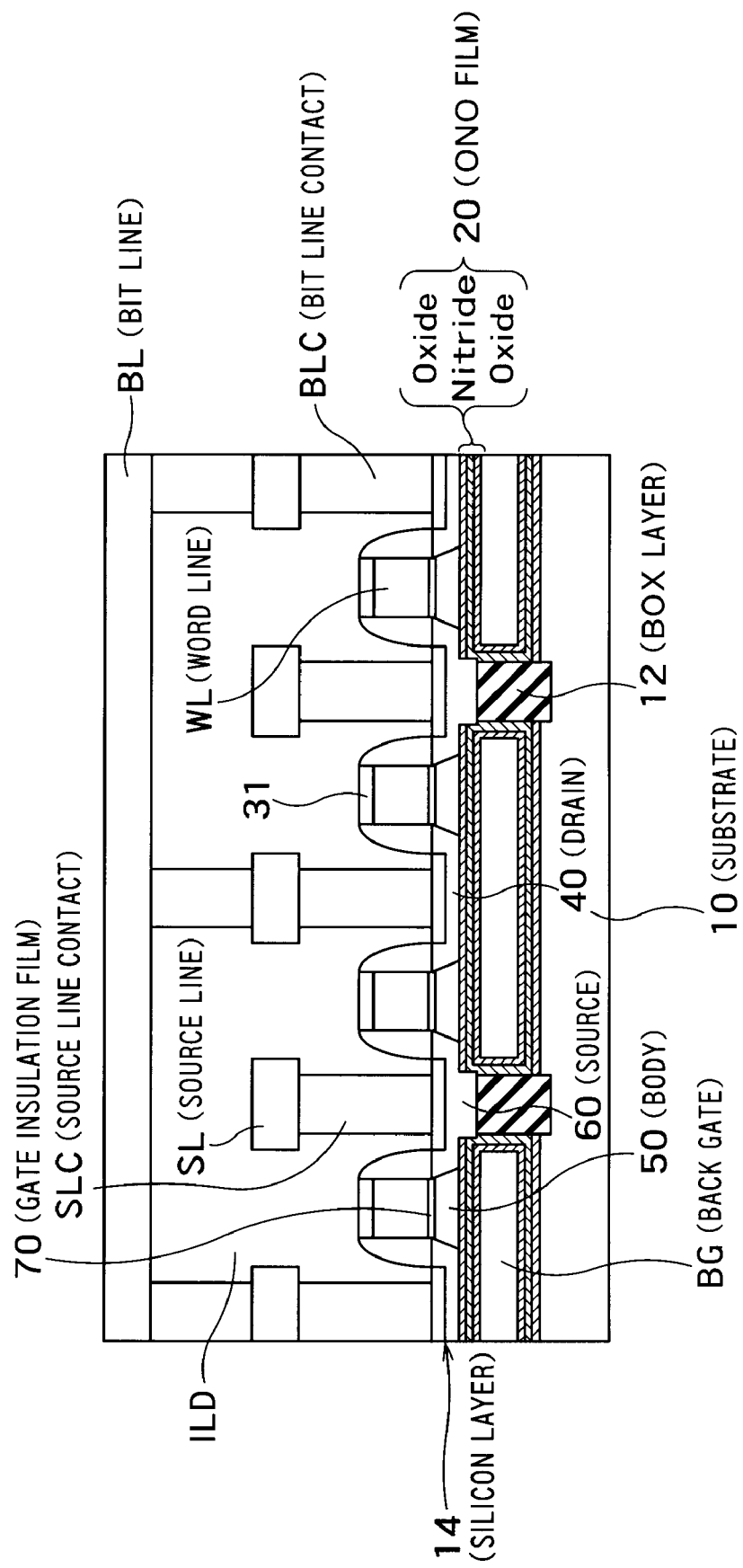
FIGS. 29 to 32 are cross-sectional views along the lines 22-22, 23-23, 24-24, and 25-25 of FIG. 28.

FIGS. 29 to 32 are cross-sectional views along the lines 22-22, 23-23, 24-24, and 25-25 of FIG. 28. As shown in FIG. 29, the back gate BG is placed on the supporting substrate (bulk substrate) 10. The periphery of the back gate BG is covered with the ONO film 20. The back gate BG is separated by a BOX layer 12 below the source line SL and provided to correspond to two adjacent word lines WL. The back gate BG extends along the direction the word line WL extends. A silicide layer 31 is provided on the word line WL. An interlayer insulating film ILD is provided between the lines.

Figure 30:
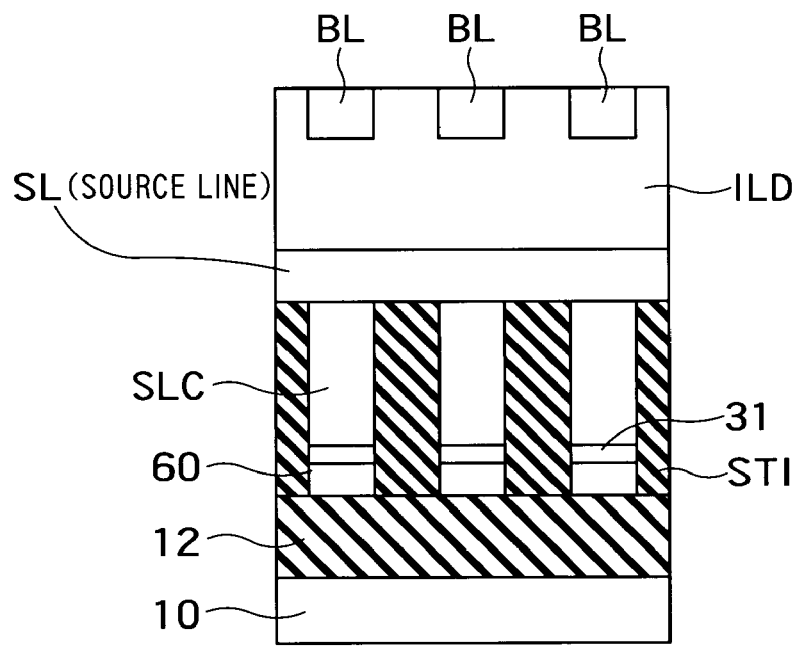
Figure 31:
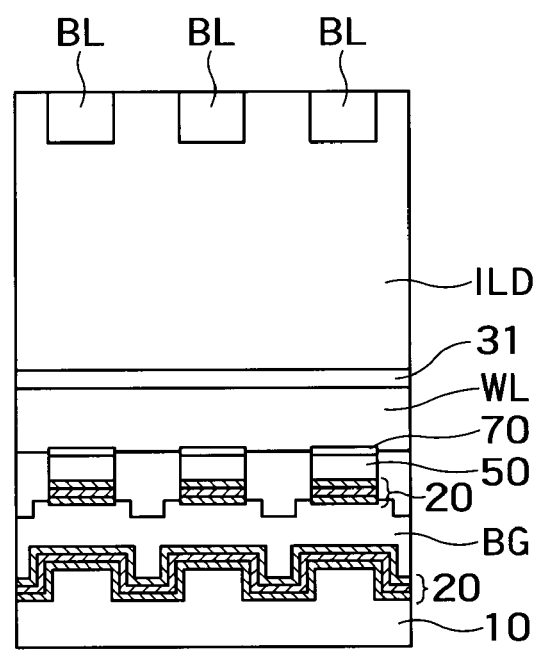
Figure 32:
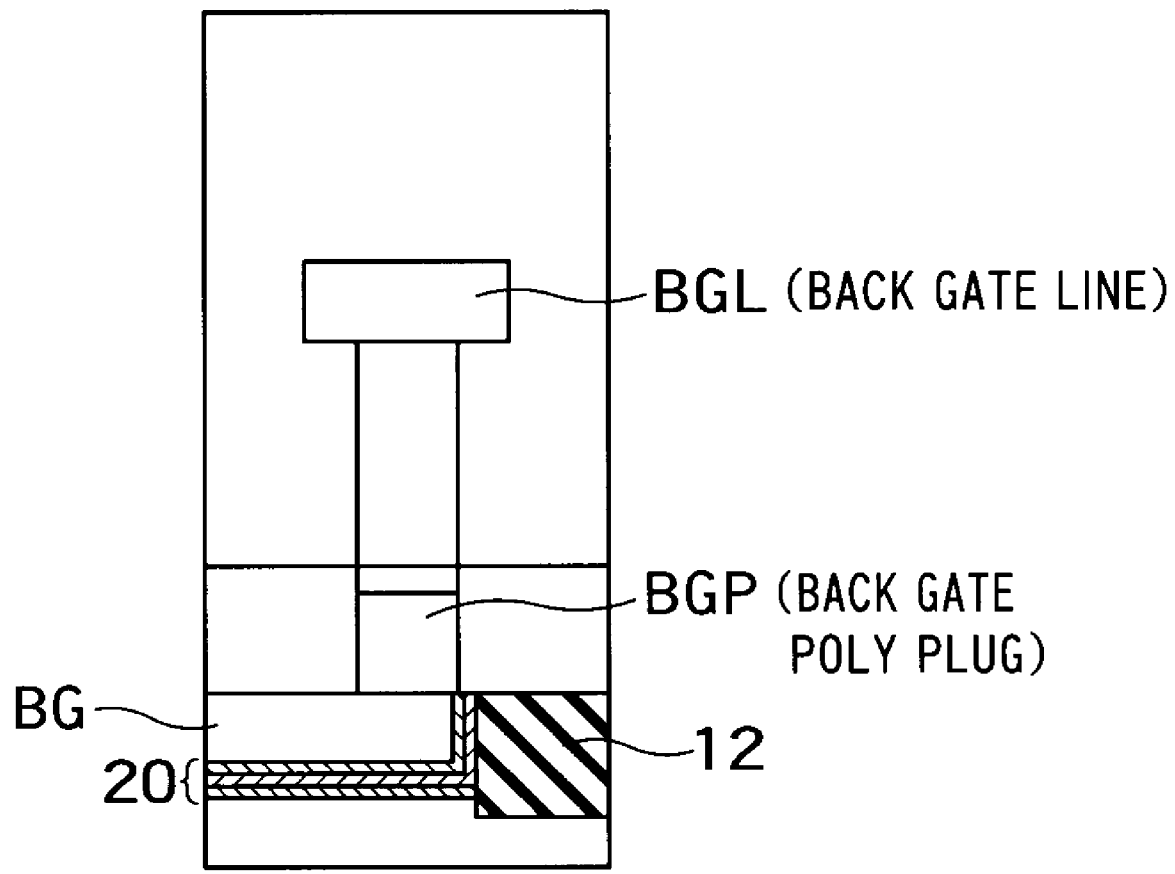

The ONO film 20 is provided on the back gate BG. A source layer 60 and a drain layer 40 are provided in a silicon layer 14 on the ONO film 20. A body 50 is provided between the source layer 60 and the drain layer 40. The body 50 is formed on the back gate BG with the ONO film 20 interposed therebetween. A gate insulating film 70 is provided on the body 50. The word line WL is provided on the gate insulating film 70 as shown in FIG. 31. The source layer 60 is connected via a source line contact SLC to the source line SL as shown in FIG. 30. The drain layer 40 is connected via a bit line contact BLC to the bit line BL. The back gate BG is connected via a back gate polyplug BGP to a back gate line BGL as shown in FIG. 32.

Figure 33:
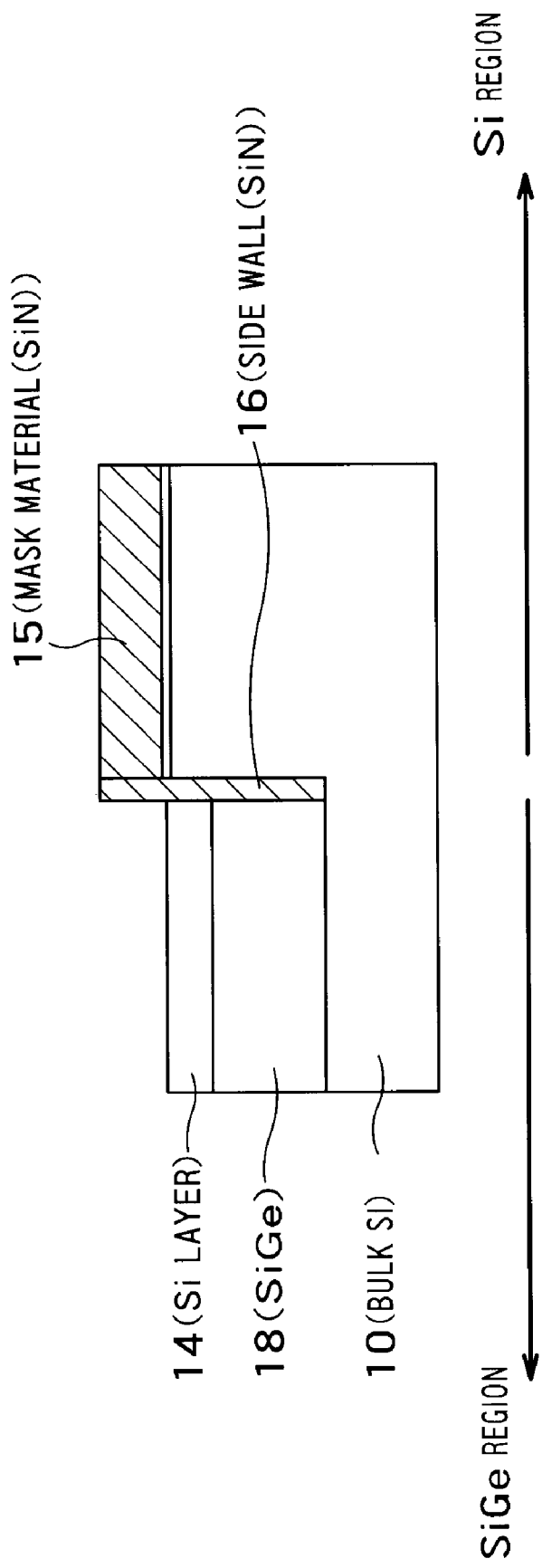
FIG. 33 shows the boundary between the memory cell area and the logic circuit area according to the fourth embodiment.

A method for manufacturing memories according to the fourth embodiment will be described next. A mask 15 made of a silicon nitride film is formed in the logic circuit area on the bulk substrate 10 made of silicon. The bulk substrate in the memory cell area is etched to a depth of about 250 nm using the mask 15. A sidewall 16 made of a silicon nitride film is formed at the side surface of a step made between the memory cell area and the logic circuit area. A SiGe layer 18 and a silicon layer 14 are selectively grown on the bulk substrate 10 in the memory cell area. The SiGe layer 18 has a thickness of about 200 nm and the silicon layer 14 has a thickness of about 50 nm. The configuration shown in FIG. 33 is thus obtained. The SiGe region R1 has been formed at this point. FIG. 33 shows the boundary between the memory cell area and the logic circuit area.

Figure 34:
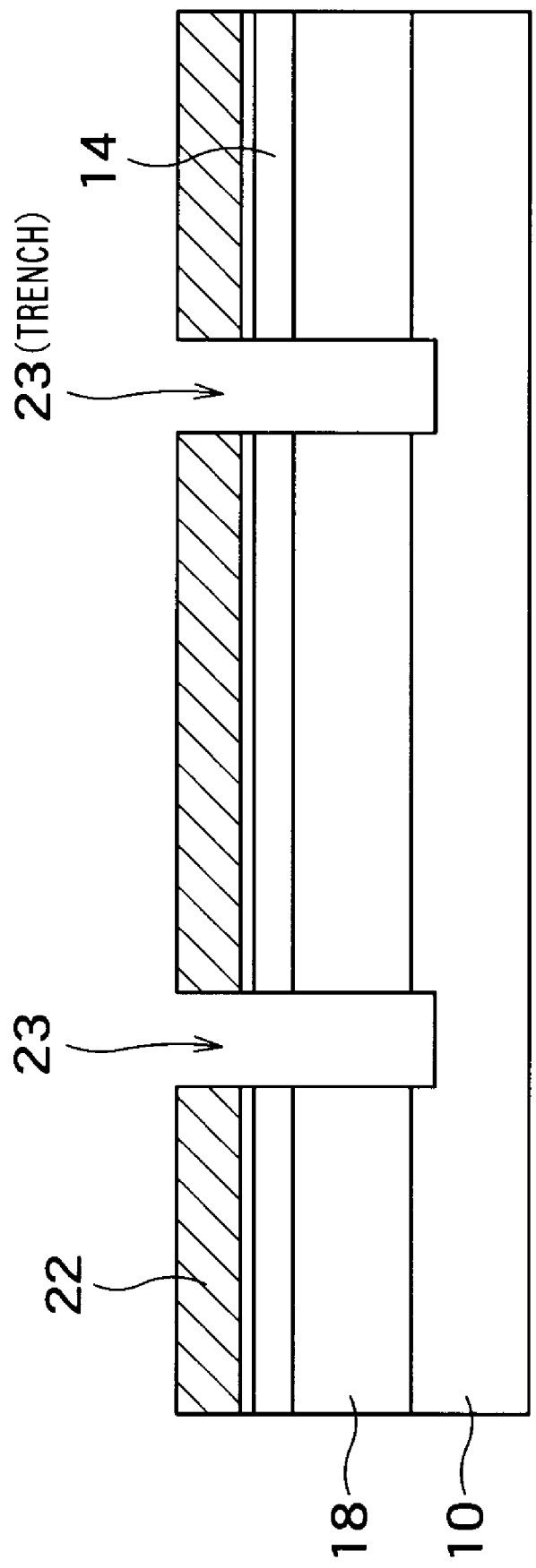
FIG. 34 is a cross-sectional view showing the manufacturing method following FIG. 33.

After the mask 15 is removed, a mask 22 is deposited on the silicon layer 14 in the memory cell area as shown in FIG. 34. A photoresist is formed on the mask 22 and patterned so as to cover the memory cell area other than the region between the region R2 where BOX is formed and the region R5 shown in FIG. 28. The mask 22, the silicon layer 14, and the SiGe layer 18 are etched by RIE (Reactive Ion Etching) using the photoresist as a mask. A trench 23 shown in FIG. 34 is thus formed in the region R2 where BOX is formed.

Figure 35:
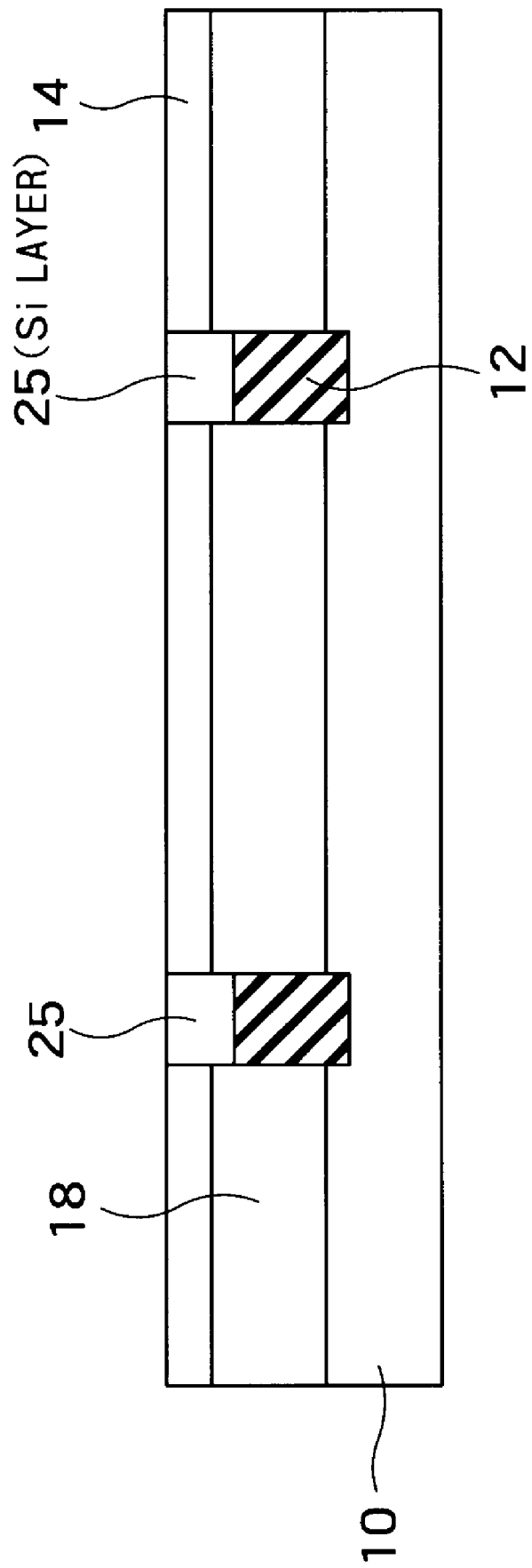
FIG. 35 is a cross-sectional view showing the manufacturing method following FIG. 34.

A silicon dioxide film is deposited and then etched back, so that the BOX layer 12 is formed. An amorphous silicon layer is deposited and thermally treated, so that a silicon layer 25 is formed on the BOX layer 12. The silicon layer 25 is etched back so as to have the same height level as the silicon layer 14. The mask 22 is then removed. As shown in FIG. 35, the BOX layer 12 is formed. The BOX layer 12 is formed inside the region R2 and outside the region R5 in FIG. 28.

Figure 36:
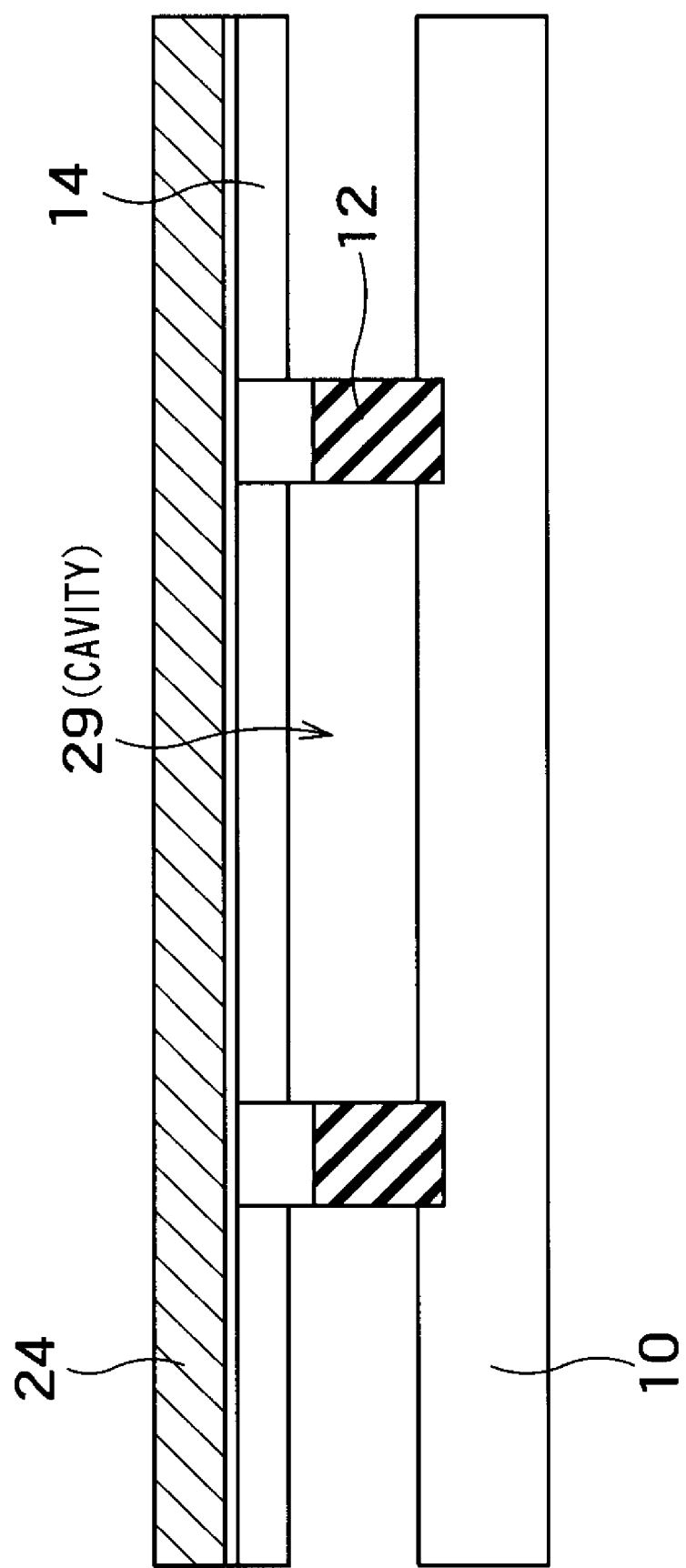
FIG. 36 is a cross-sectional view showing the manufacturing method following FIG. 35.

A mask 24 is formed on the memory cell area and the active area R3. An STI film is formed on the region other than the active area R3 in the logic circuit area. A process for forming STI in the memory cell array is then performed. A photoresist is patterned to cover the region R4 and the logic circuit area shown in FIG. 28. Trenches for STI are formed by using the photoresist as a mask. As shown in FIG. 36, the SiGe layer 18 is etched using a mixed solution of hydrofluoric acid and peracetic acid. A cavity 29 is thus formed under the silicon layer 14. The BOX layer 12 supports the silicon layer 14 as a pole.

Figure 37:
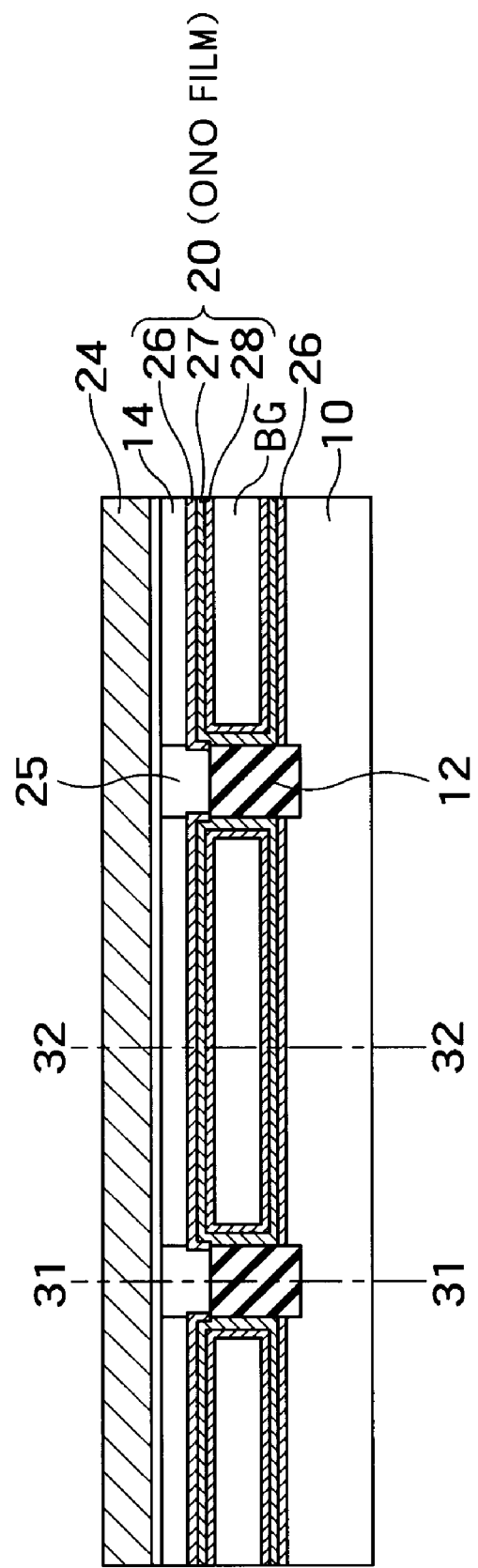
FIG. 37 is a cross-sectional view showing the manufacturing method following FIG. 36.

A silicon dioxide film 26 is formed at the inner wall of the cavity 29 as shown in FIG. 37. A silicon nitride film 27 and a silicon dioxide film 28 are formed successively at the inner wall of the cavity 29. The silicon dioxide film 26 has a thickness of about 3 nm, while the silicon nitride film 27 and the silicon dioxide film 28 have a thickness of about 6 nm. The silicon dioxide film 26, the silicon nitride film 27, and the silicon dioxide film 28 constitute the ONO film 20. A P-type polysilicon film is deposited inside the ONO film 20 and then etched back. The back gate BG and ONO film 20 are formed as shown in FIG. 37.

Figure 38:
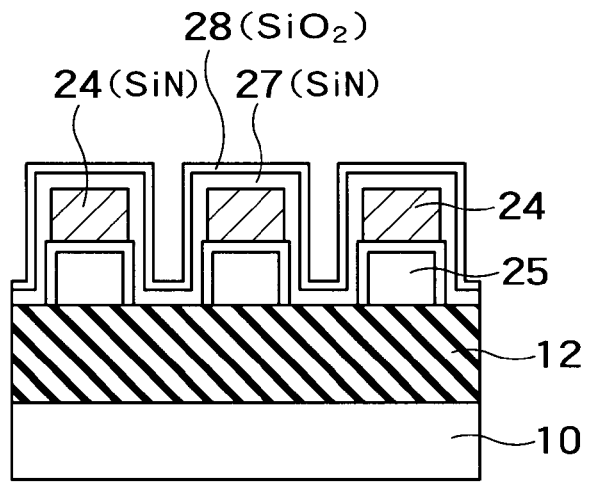
FIG. 38 is a cross-sectional view along the line 31-31 in FIG. 37.
Figure 39:
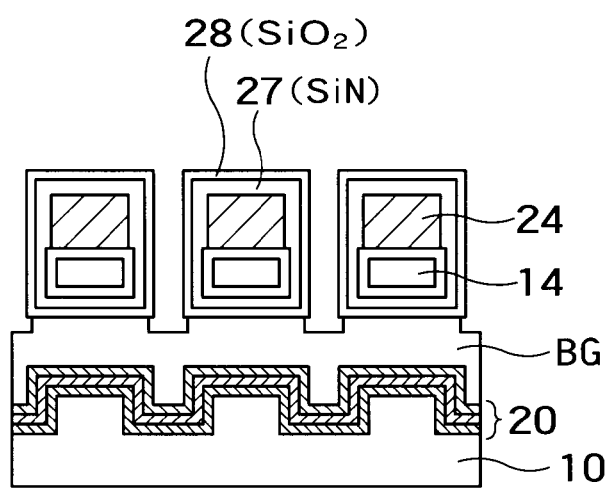
FIG. 39 is a cross-sectional view along the line 32-32 in FIG. 37.
Figure 40:
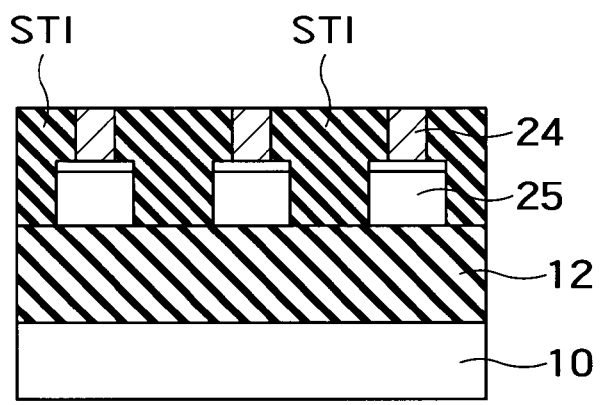
FIG. 40 is a cross-sectional view showing the manufacturing method following FIG. 38.
Figure 41:
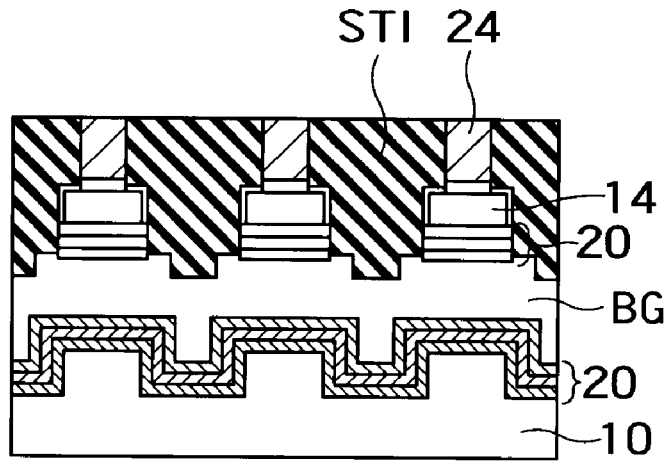
FIG. 41 is a cross-sectional view showing the manufacturing method following FIG. 39.
Figure 42:
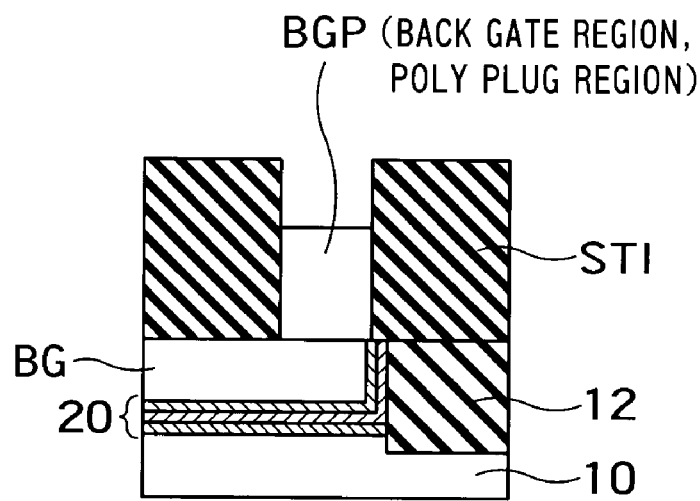
FIG. 42 is a cross-sectional view showing a back gate plug BGP.

FIG. 38 is a cross-sectional view along the line 31-31 in FIG. 37. FIG. 39 is a cross-sectional view along the line 32-32 in FIG. 37. The silicon dioxide film 28 and the silicon nitride film 27 on the periphery of the mask 24 and on the BOX layer 12 are removed. An insulating film serving as STI is filled in the spaces between adjacent silicon layers 14 and between adjacent silicon layers 25 as shown in FIGS. 40 and 41. CMP is performed by using the silicon nitride film 24 as a stopper. The STI is etched by using a resist pattern so that the back gate plug region R7 shown in FIG. 28 is exposed. By filling polysilicon in the region R7, the back gate plug BGP is formed as shown in FIG. 42.

A P-type impurity is charged in the body 50 and the bulk substrate 10. The impurity density of the body 50 is, e.g., about $10^{17}$ cm$^{-3}$. An impurity is also introduced appropriately in a transistor region constituting the logic circuit. The gate insulating film and the gate electrode are formed on the body 50. An extension layer (not shown) is formed on the source and drain regions if necessary. A sidewall film is formed at the side surface of the gate electrode. An N-type impurity is ion-implanted in the source and drain regions by using the gate electrode and the sidewall film as a mask. The silicide layer 31 is formed on the surfaces of the source region, the drain region, and the gate electrode. The interlayer insulating film ILD, the contacts SLC, BLC, and the lines BL, SL are formed by conventional processes. The FBC memory device shown in FIG. 29 is thus completed.

Fifth Embodiment

Figure 43:
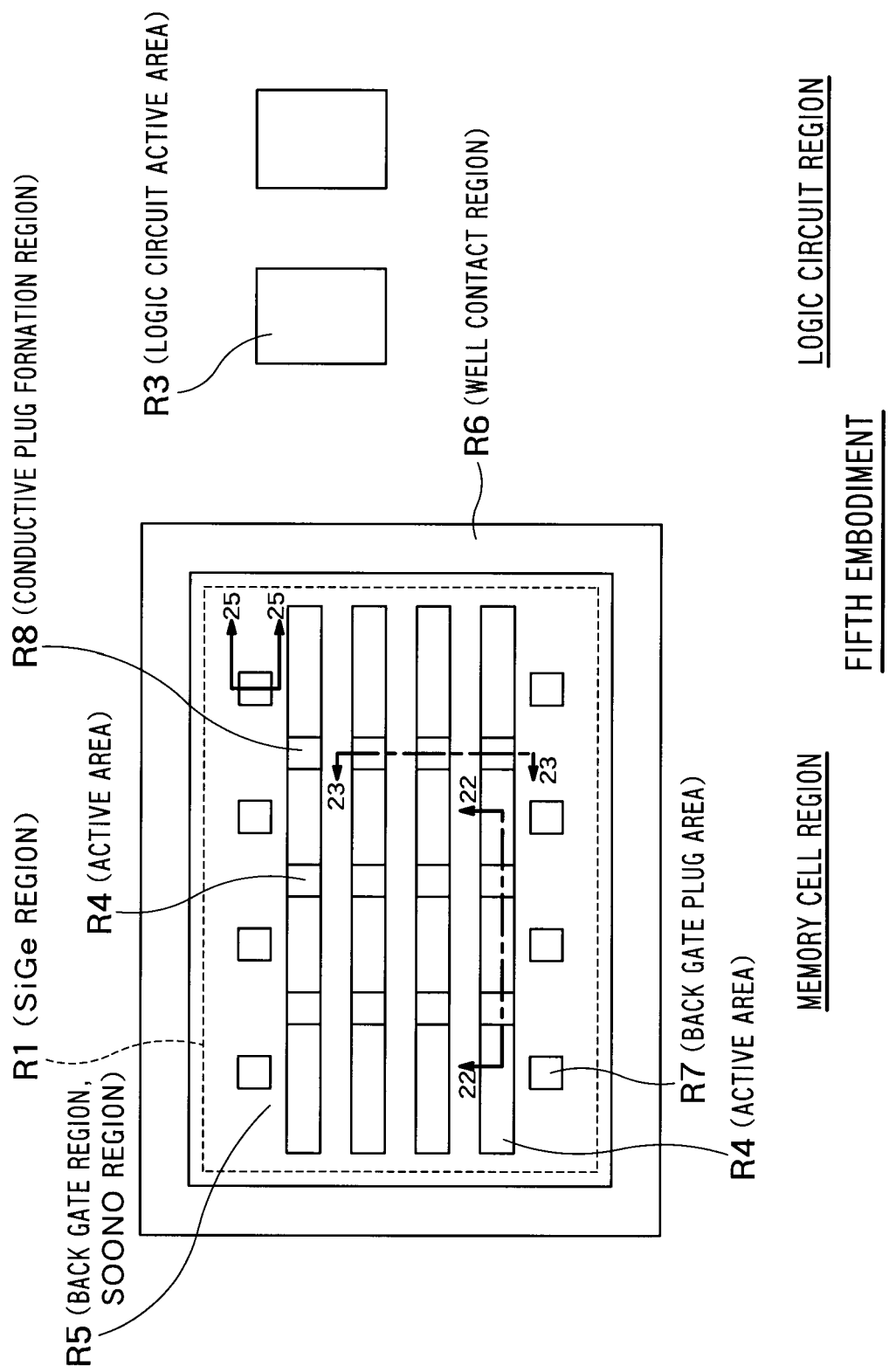
FIG. 43 is a plan view of a memory according to a fifth embodiment of the present invention.

FIG. 43 is a plan view of a memory according to a fifth embodiment of the present invention. The fifth embodiment is different from the fourth embodiment in that the BOX layer 12 is not provided and the source 60 is connected to the supporting substrate 10. As the BOX layer 12 is not formed, most part of the SiGe region R1 is dominated by the back gate region R5. In the region R8 a conductive plug 32 is formed, where the back gate BG is not formed. The conductive plug 32 is formed under the source 60. The source 60 is connected via the conductive plug to a P-type well formed in the supporting substrate 10. The ONO film 20 and the back gate BG are provided under an STI between adjacent sources 60. Other configurations of the fifth embodiment can be the same as those of the fourth embodiment.

Figure 44:
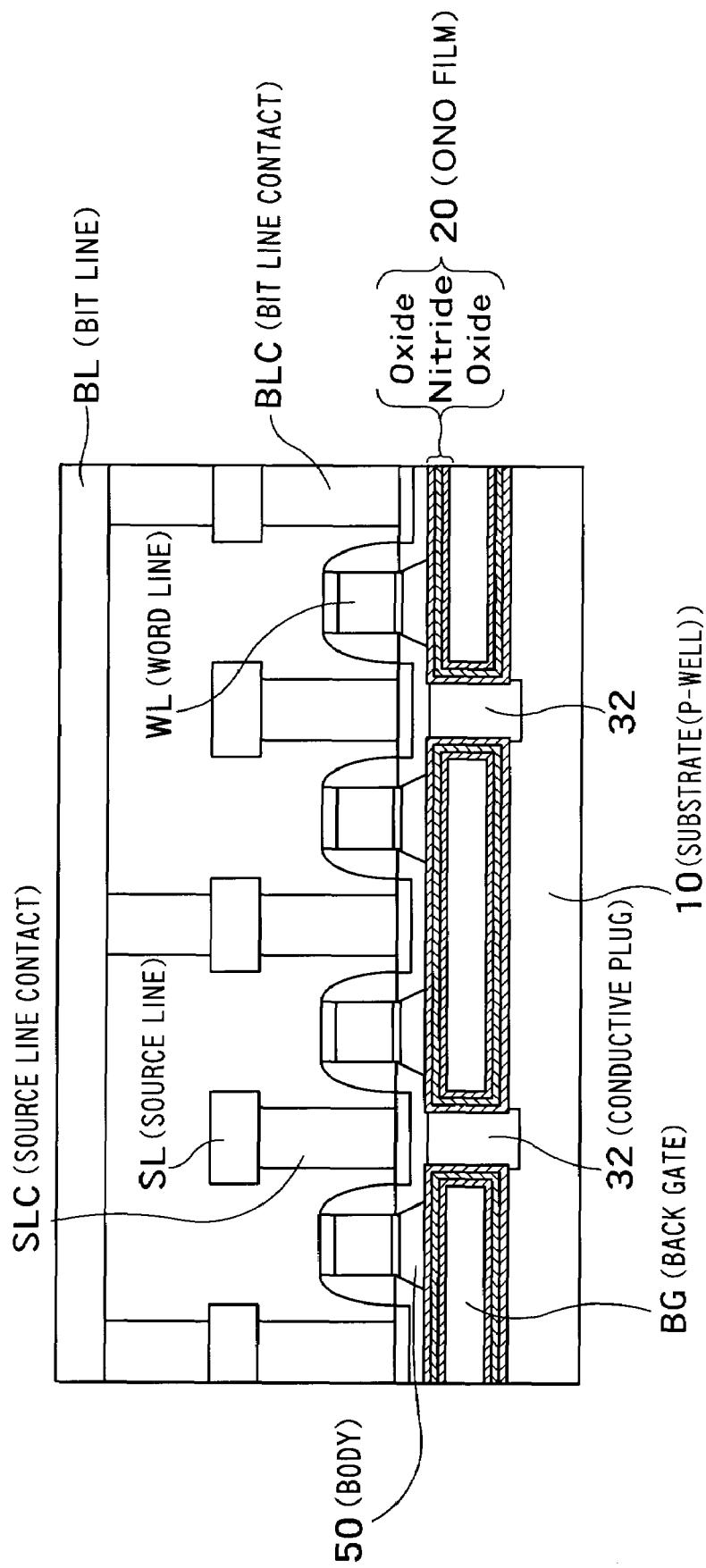
FIGS. 44 to 46 are cross-sectional views along the lines 22-22, 23-23, and 25-25 shown in FIG. 43.
Figure 45:
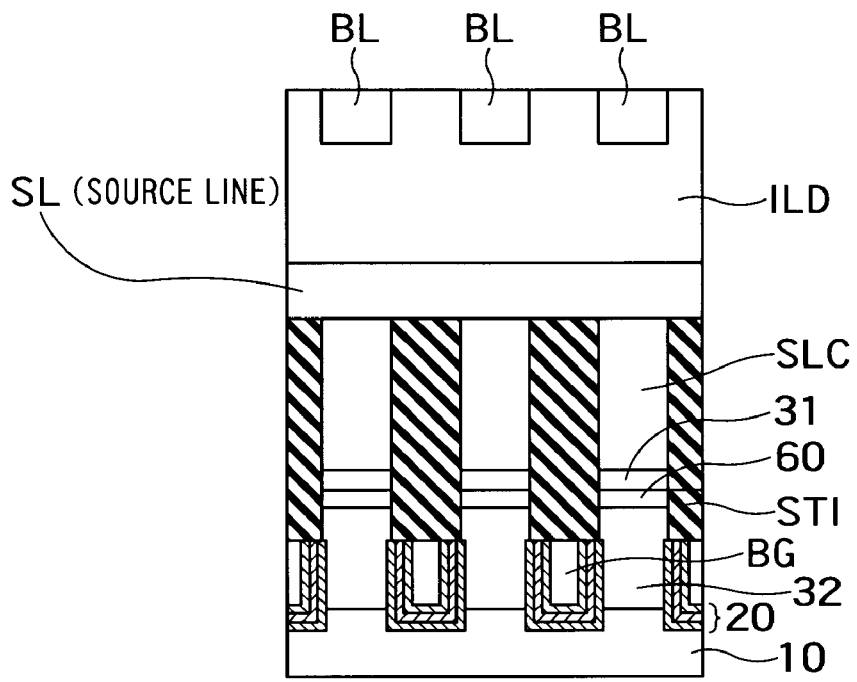
Figure 46:
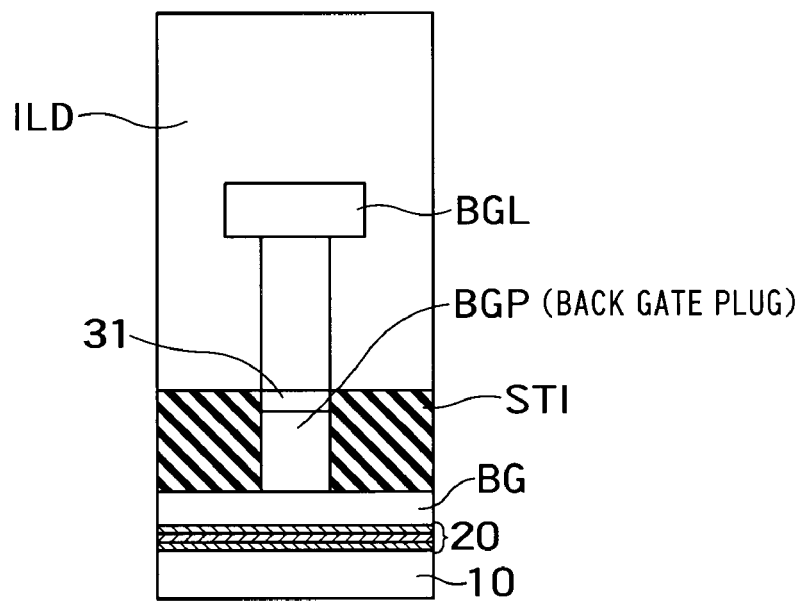

FIGS. 44 to 46 are cross-sectional views along the lines 22-22, 23-23, and 25-25 shown in FIG. 43. In the fifth embodiment, the conductive plug 32 is provided under the source 60 as shown in FIGS. 44 and 45. As shown in FIG. 45, the ONO film 20 and the back gate BG are provided under an STI between adjacent sources 60. The back gate BG is formed under the back gate plug BGP as shown in FIG. 46.

Figure 47:
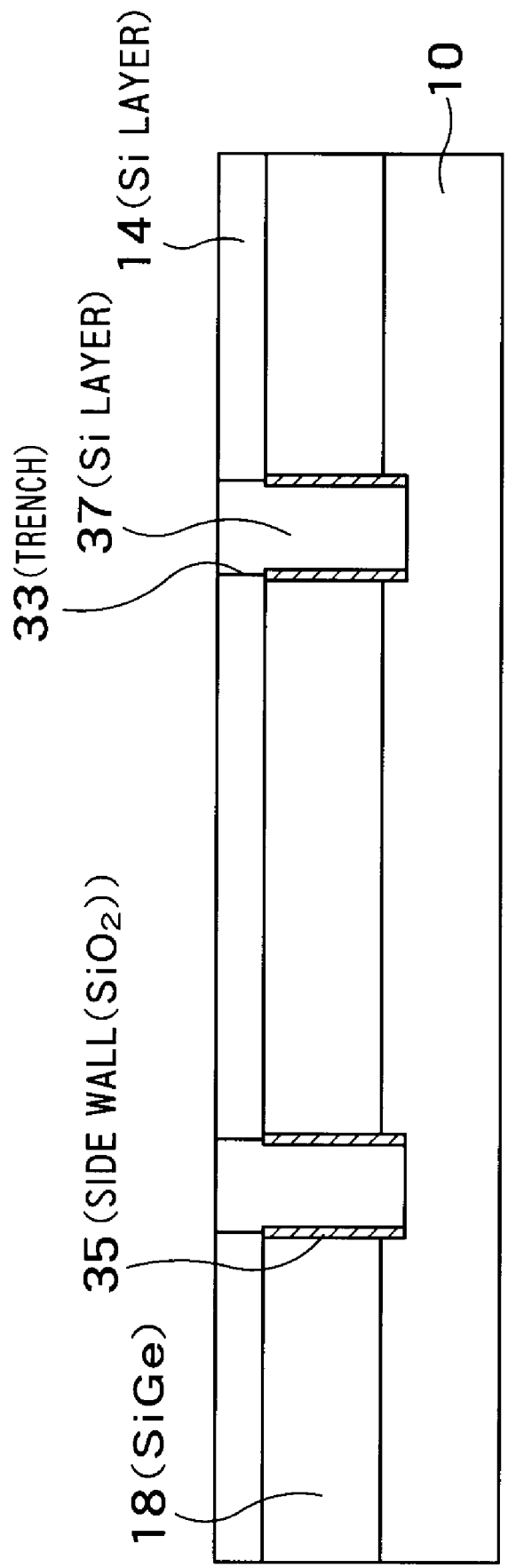
FIG. 47 is a cross-sectional view showing a method for manufacturing memories according to the fifth embodiment.

A method for manufacturing memories according to the fifth embodiment will be described next. The SiGe layer 18 and the silicon layer 14 are deposited on the supporting substrate 10 made of silicon. The SiGe layer 18 has a thickness of, e.g., about 200 nm and the silicon layer 14 has a thickness of, e.g., about 50 nm. The SiGe region R5 other than the region R8 where the conductive plug is formed is covered by a mask and the silicon layer 14 and the SiGe layer 18 are etched using RIE. A trench 33 is thus formed. The SiGe layer 18 and the silicon layer 14 on the supporting substrate 10 in the logic circuit area are removed. A sidewall film 35 is formed at the side surface of the SiGe layer 18 within the trench 33. A silicon layer 37 serving as the conductive plug is formed in the trench 33 by selective epitaxial growth. The silicon layer 37 is deposited on the supporting substrate 10 in the logic circuit area. By removing the mask, the configuration shown in FIG. 47 is obtained. The SiGe layer has been filled in the region R1 shown in FIG. 43 at this point.

Figure 48:
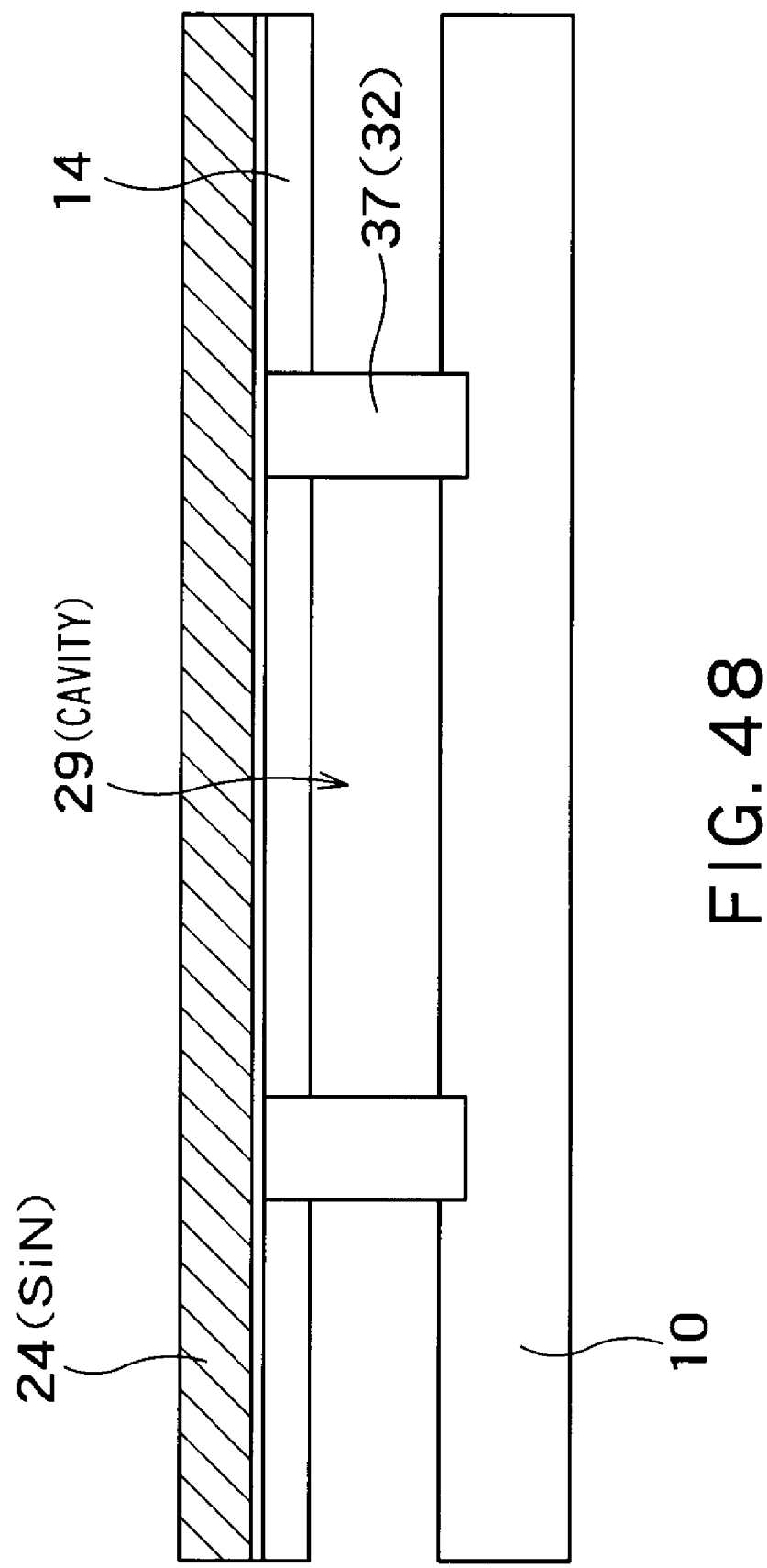
FIG. 48 is a cross-sectional view showing the manufacturing method following FIG. 47.

The mask 24 is formed on the memory cell area and the active area R3. An STI film is formed on the region other than the active area R3 in the logic circuit area. A process for forming STI in the memory cell array is then performed. A photoresist is patterned so that the region R4 and logic circuit area shown in FIG. 43 are covered. Trenches for STI are formed by using the photoresist as a mask. As shown in FIG. 48, the SiGe layer 18 is etched using a mixed solution of hydrofluoric acid and peracetic acid. The cavity 29 is formed under the silicon layer 14. A silicon layer 37 supports the silicon layer 14 as a pole.

Figure 49:
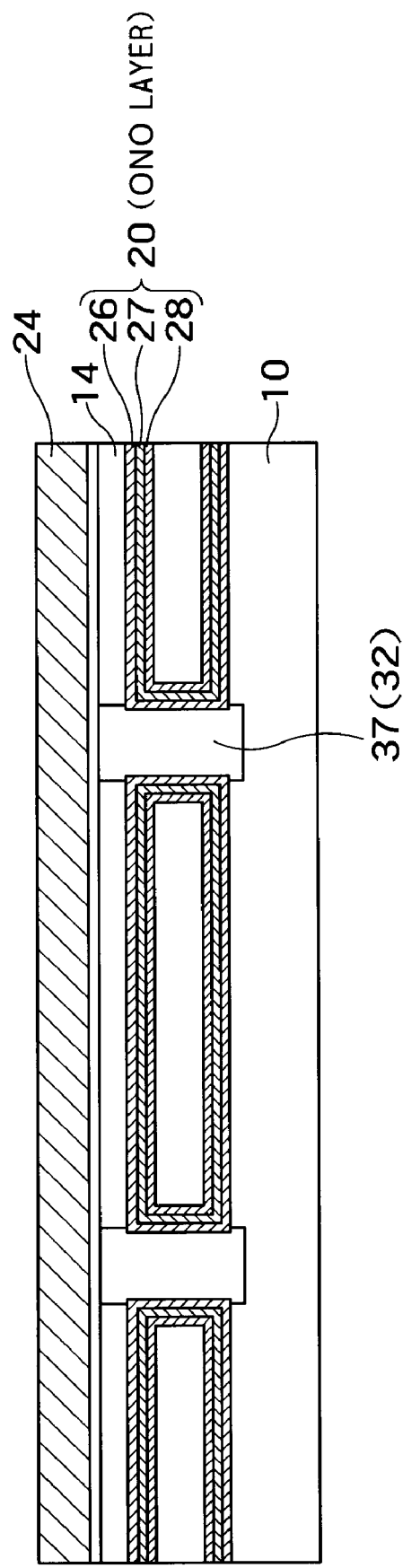
FIG. 49 is a cross-sectional view showing the manufacturing method following FIG. 48.

As shown in FIG. 49, the silicon dioxide film 26 is formed at the inner wall of the cavity 29. The silicon nitride film 27 and the silicon dioxide film 28 are formed successively at the inner wall of the cavity 29. The silicon dioxide film 26 has a thickness of about 3 nm and the silicon nitride film 27 and the silicon dioxide film 28 have a thickness of about 6 nm. The silicon dioxide film 26, the silicon nitride film 27, and the silicon dioxide film 28 constitute the ONO film 20. A P-type polysilicon film is deposited in the ONO film 20 and then etched back. The back gate BG and ONO film 20 are thus formed as shown in FIG. 49. The silicon layer 37 functions as the conductive plug 32. The same processes as in the fourth embodiment are performed, so that the memory shown in FIG. 44 is completed.

According to the fourth and fifth embodiments, intervals between adjacent BOX layers 12 and between adjacent conductive plugs 32 (the silicon layers 37) are set so that the silicon layer 14 is not fallen down during production. When the BOX layer 12 is used in the fourth embodiment, the parasitic capacitance of the back gate BG is decreased and power consumption caused by swings in back gate voltage is reduced. Because the process for forming the BOX layer 12 is not required in the fifth embodiment, the manufacturing method is relatively simple. However, the parasitic capacitance of the back gate BG is relatively increased. The resistance of the back gate is preferably reduced so that delays do not occur at the time of increasing and decreasing the back gate voltage. For this purpose, the thickness of the SiGe layer 18 is made to be large. Alternatively, the thickness of the back gate BG is made to be large. The resistance of the back gate BG is reduced by extending intervals between adjacent conductive plugs 32.

Sixth Embodiment

Figure 50:
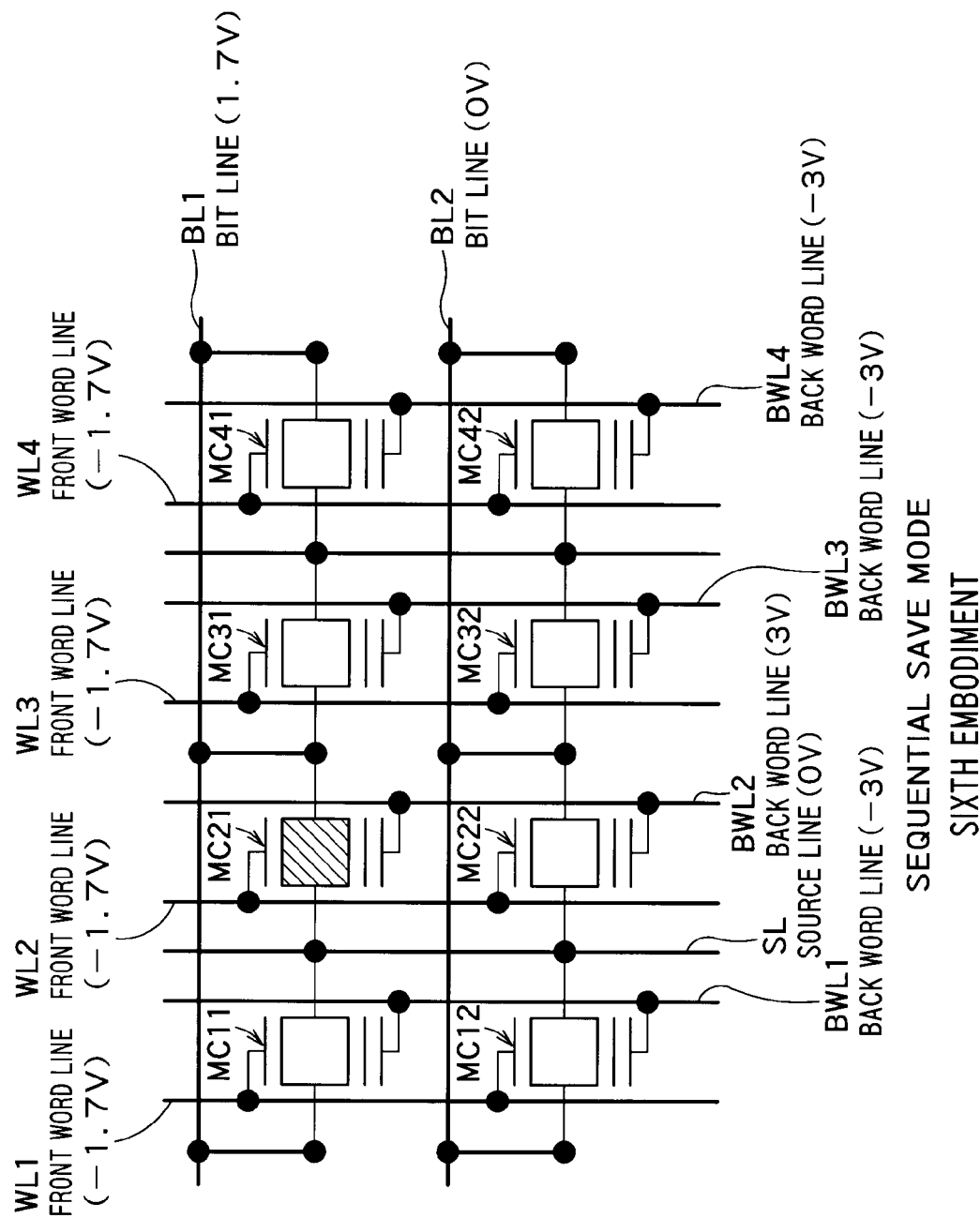
FIG. 50 shows a memory cell array according to a sixth embodiment of the present invention.

FIG. 50 shows a memory cell array according to a sixth embodiment of the present invention. In the sixth embodiment, the back gate is separated so as to correspond to the front word line and functions as the back word line. Other configurations of the sixth embodiment can be the same as those of the third embodiment.

Back word lines BWL1 to BWL4 are provided so as to correspond to front word lines WL1 to WL4. The back word lines BWL1 to BWL4 are substantially parallel to the front word lines WL1 to WL4, respectively.

According to the sixth embodiment, a back word line is selected. At the same time a plurality of memory cells connected to that back word line and the corresponding front word line are selected. The source line SL is common to all memory cells in the memory cell array.

FIG. 50 shows the voltage relationship when electrons are injected in the ONO film in the sequential save mode. A first voltage (e.g., 0 V) is applied to the source line SL common to the memory cells. A second voltage lower than the first voltage (e.g., −1.7 V) is applied to the front word lines WL1 to WL4. A third voltage lower than the first voltage (e.g., −3 V) is applied to unselected back word lines BWL1, BWL3, and BWL4. A fourth voltage higher than the first voltage (e.g., 3 V) is applied to a selected back word line BWL2. A fifth voltage higher than the first voltage (e.g., 1.7 V) is applied to a selected bit line BL1 and the first voltage to an unselected bit line BL2. A memory cell MC21 is thus selected and a current flows in the back channel (first surface) of the memory cell MC21. Electrons are injected in the ONO film 20 of the memory cell MC21. Electrons are not injected in the ONO films 20 of the memory cells other than the memory cell MC21. According to the sixth embodiment, the sequential save mode is performed by using the back word line. Because electrons flow from the source 60 to the drain 40 in the sixth embodiment, hot electrons are injected in the ONO film 20 near the body-drain PN junction.

In FIG. 50, only the memory cell MC21 is the selected memory cell. Other memory cells are selected successively. Alternatively, a plurality of memory cells MC2j connected to the selected back word line BWL2 can be selected. Among all bit lines (1024 lines in the example of FIG. 1) connected to the selected back word line BWL2, 1.7 V is applied to bit lines to which memory cells with the data "1" are connected and 0 V to bit lines to which memory cells with the data "0" are connected. If a memory cell stores the data "1", electrons are injected in the ONO film 20. If a memory cell stores the data "0", electrons are not injected. Data are programmed in the ONO films of the memory cells connected to the selected back word line BWL2 at the same time.

By applying the fourth voltage lower than the first voltage (e.g., −1.7 V) to the selected bit line BL1, hot electrons are injected in the ONO film 20 near the body-source PN junction. The position of electrons in the ONO film 20 influences greatly the threshold voltage at the time of the reading operation. Electrons are injected in an appropriate position depending on the reading operation. Hot electrons can be injected in both the ONO film 20 near the body-source PN junction and the ONO film 20 near the body-drain PN junction.

While electrons are injected in the memory cells connected to the selected back word line BWL2, −3 V is applied to unselected back word lines. As the back word line is selectively driven, the back word line does not need to be varied between 3 V and −3 V unlike the third embodiment. Accordingly, a leak current through the interface state of bottom surface of the body is not generated in a memory cell holding data depending on majority carriers in the body 50. The frequency of the refresh operation is reduced and the save mode is completed in a short time.

Figure 51:
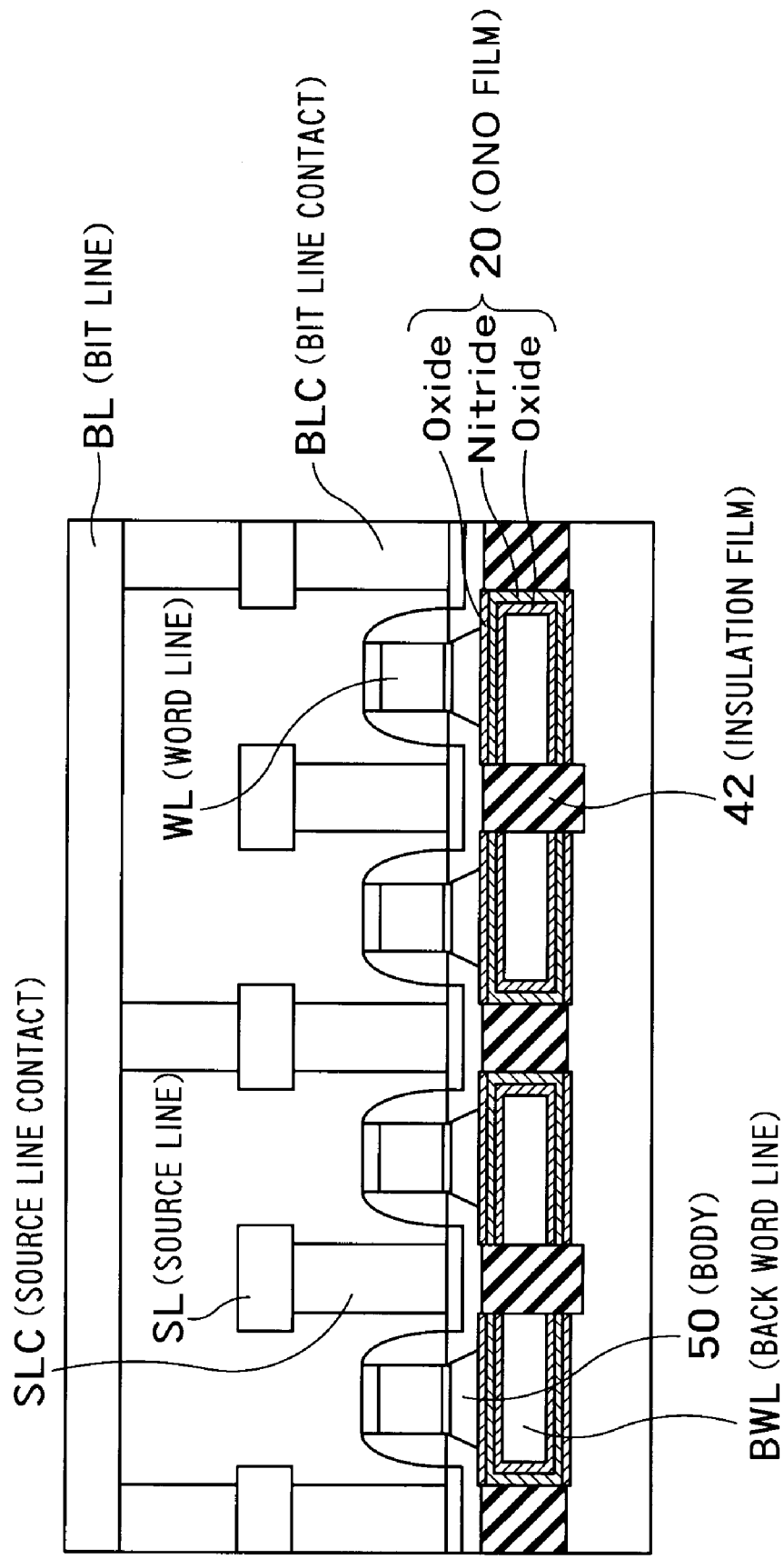
FIG. 51 is a cross-sectional view of the memory cell according to the sixth embodiment.

FIG. 51 is a cross-sectional view of the memory cell according to the sixth embodiment. According to the sixth embodiment, an insulating film 42 is formed under the source 60 and the drain 40. The insulating film 42 allows the back word line BWL to be formed so as to correspond to the front word line WL. Other cross-sectional configurations of the sixth embodiment are the same as in FIG. 29.

Figure 52:
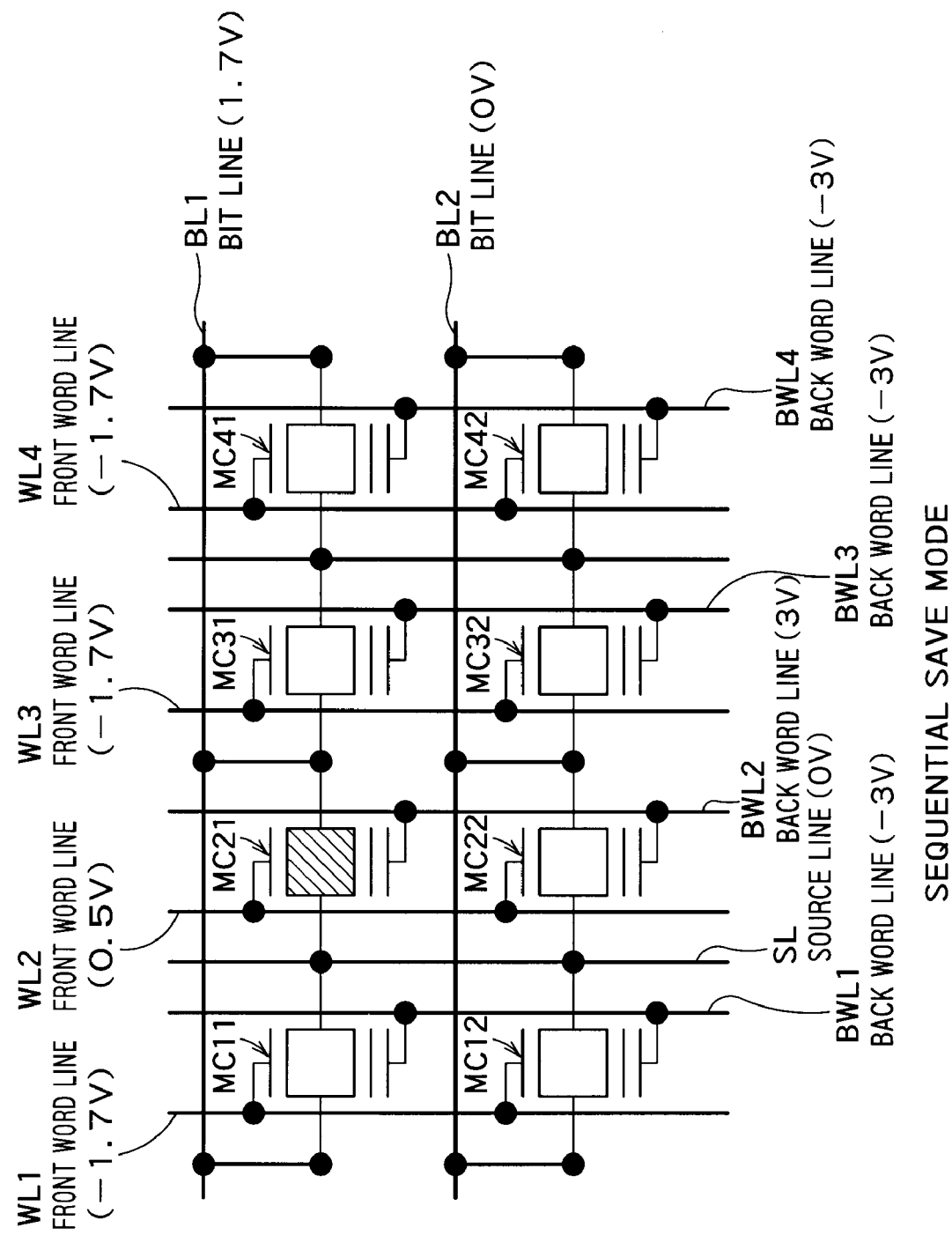
FIG. 52 shows a voltage relationship at an electron injection operation according to the sixth embodiment.

With reference to FIG. 52, 0.5 V is applied to the selected front word line WL2 and −1.7 V to other unselected front word lines. The voltages of the source line SL, the bit lines BL1 and BL2, and the back word lines BWL1 to BWL4 are the same as in FIG. 50. Compared with the voltage of the unselected front word line, the voltage of the selected front word line WL2 is made closer to the voltage of the selected back word line BWL2 as shown in FIG. 52. The threshold voltage of bottom surface (first surface) of the body 50 in the selected memory cell MC21 is decreased more than that of an unselected memory cell. The selectivity of the selected memory cell MC21 is improved. Electrons are injected in the ONO film 20 of the selected memory cell in a shorter time by using a lower bit line voltage.

While electrons are injected in memory cells connected to the selected back word line BWL2, there can be memory cells holding the data "0" depending on majority carriers in the body 50 among the memory cells connected to the unselected back word lines. Because electrons are injected in a shorter time by using a lower bit line voltage (e.g., 1.7 V), bit line high disturbance for the memory cells holding the data "0" is suppressed.

According to the sixth embodiment, by driving the back word line and the front word line selectively, data is programmed in the individual memory cell or in a plurality of memory cells at the same time. The time required for the programming operation (the time required for injecting electrons in the ONO film 20) is reduced. Because disturbance hardly occurs, the frequency of the refresh operation is reduced. The sequential save mode is thus completed in a short time.

Figure 53:
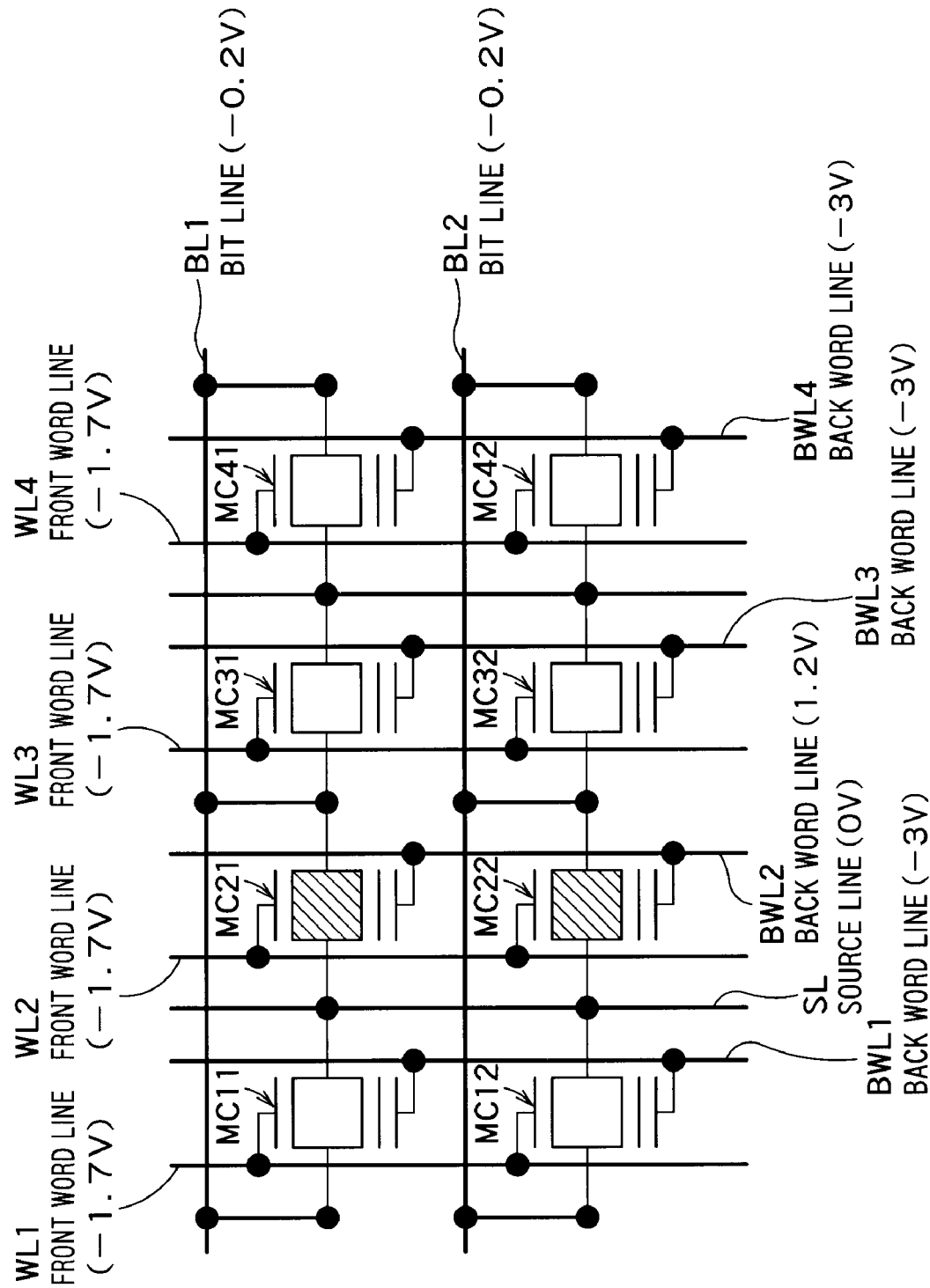
FIG. 53 shows the voltage state when the second storage state is read in the sequential return mode.

FIG. 53 shows the voltage state when the second storage state is read in the sequential return mode. The second storage state is read by driving the back word line selectively unlike the third embodiment. If electrons are injected in the ONO film 20 near the body-drain PN junction, a voltage lower than the source line voltage (e.g., −0.2 V) is preferably applied to the bit lines BL1 and BL2. If electrons are injected in the ONO film 20 near the body-source PN junction, a voltage higher than the source line voltage (0.2 V) is preferably applied to the bit lines BL1 and BL2. The sense amplifier S/A reads data depending on electrons in the ONO films 20 of the memory cells MC21 and MC22 and latches the data. If the data is "0", the sense amplifier S/A injects electrons in the ONO film 20 of the corresponding memory cell. If the data is "1", the sense amplifier S/A does not inject electrons because trapped electrons have already been injected in the ONO film 20. Electrons are injected by the method described with reference to FIG. 50. −3 V is then applied again to the selected back word line.

The sense amplifier S/A programs the latched data back in the bodies 50 of the memory cells MC21 and MC22. The method for programming back is the same as in conventional FBC memories. The return operation is performed for memory cells connected to a front word line and the refresh operation is then performed. The refresh operation is performed for the memory cells holding data depending on majority carriers in the respective bodies 50 like the memory cells MC21 and MC22 (under the first storage state). A series of such operations is performed for all back word lines and the sequential return mode is then completed.

Figure 54:
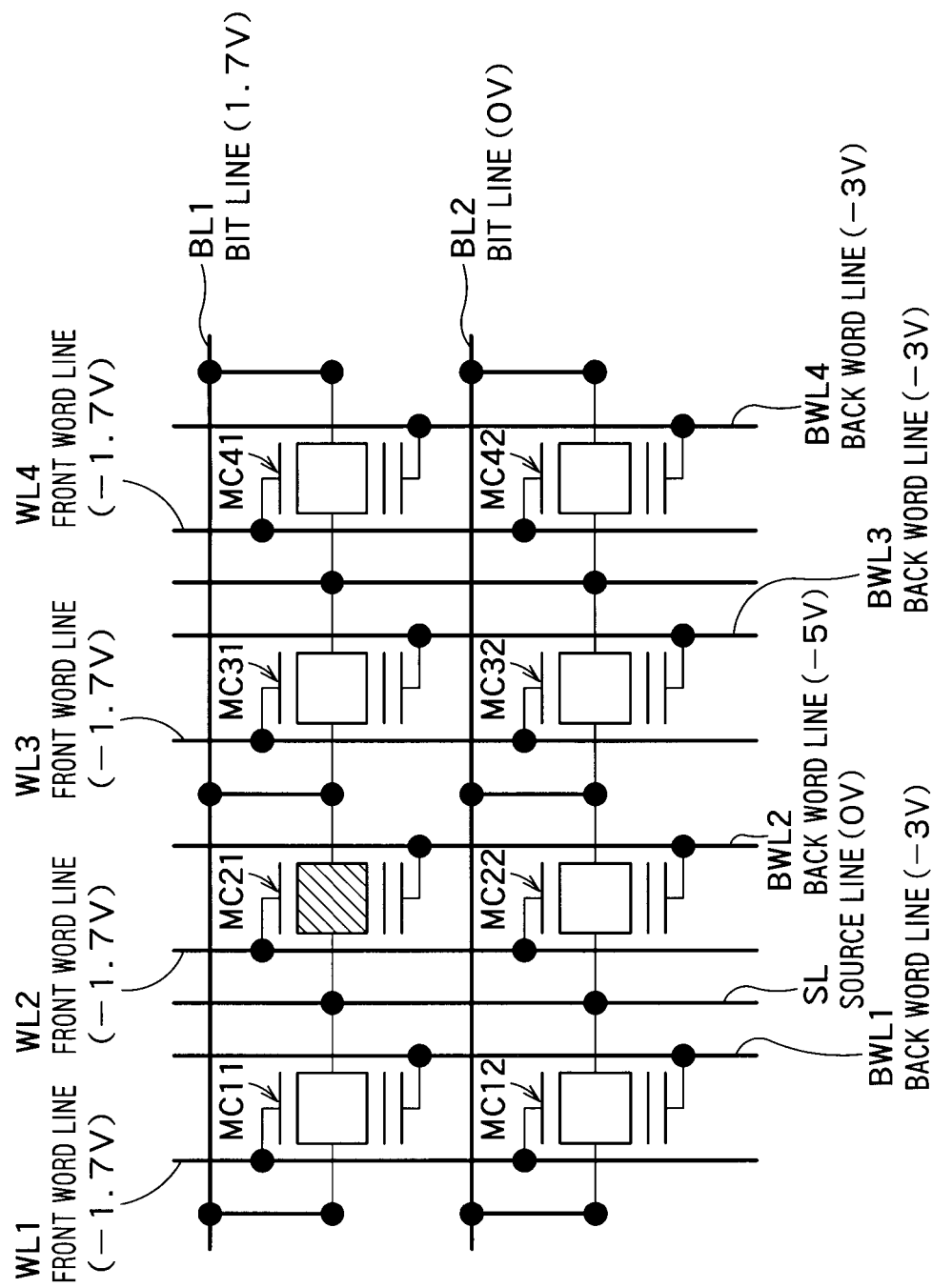
FIG. 54 is a diagram of the memory cell array showing the voltage relationship when holes are injected in the ONO film 20 in the erase mode of the sixth embodiment.

FIG. 54 is a diagram of the memory cell array showing the voltage relationship when holes are injected in the ONO film 20 in the erase mode of the sixth embodiment. To inject holes in the ONO film 20, a first voltage (e.g., 0 V) is applied to the source line SL common to all memory cells. A second voltage lower than the first voltage (e.g., −1.7 V) is applied to the front word lines WL1 to WL4. A third voltage lower than the first voltage (e.g., −3 V) is applied to unselected back word lines BWL1, BWL3, and BLW4. A fourth voltage lower than the third voltage (e.g., −5 V) is applied to a selected back word line BWL2. A fifth voltage higher than the first voltage (e.g., 1.7 V) is applied to a selected bit line BL1 and the first voltage (0 V) to an unselected bit line BL2. The memory cell MC21 is selected and holes are injected in its ONO film 20 by band-to-band tunneling.

At the time of injection, holes are accelerated in the electric field around the drain 40 to receive energy. The holes are injected as hot holes in the ONO film 20 near the body-drain PN junction.

By setting the voltage of the bit line BL2 to 1.7 V which is the same as the selected bit line BL1 in FIG. 54, the memory cells MC21 and MC22 connected to the selected back word line BWL2 are selected at the same time.

Figure 55:
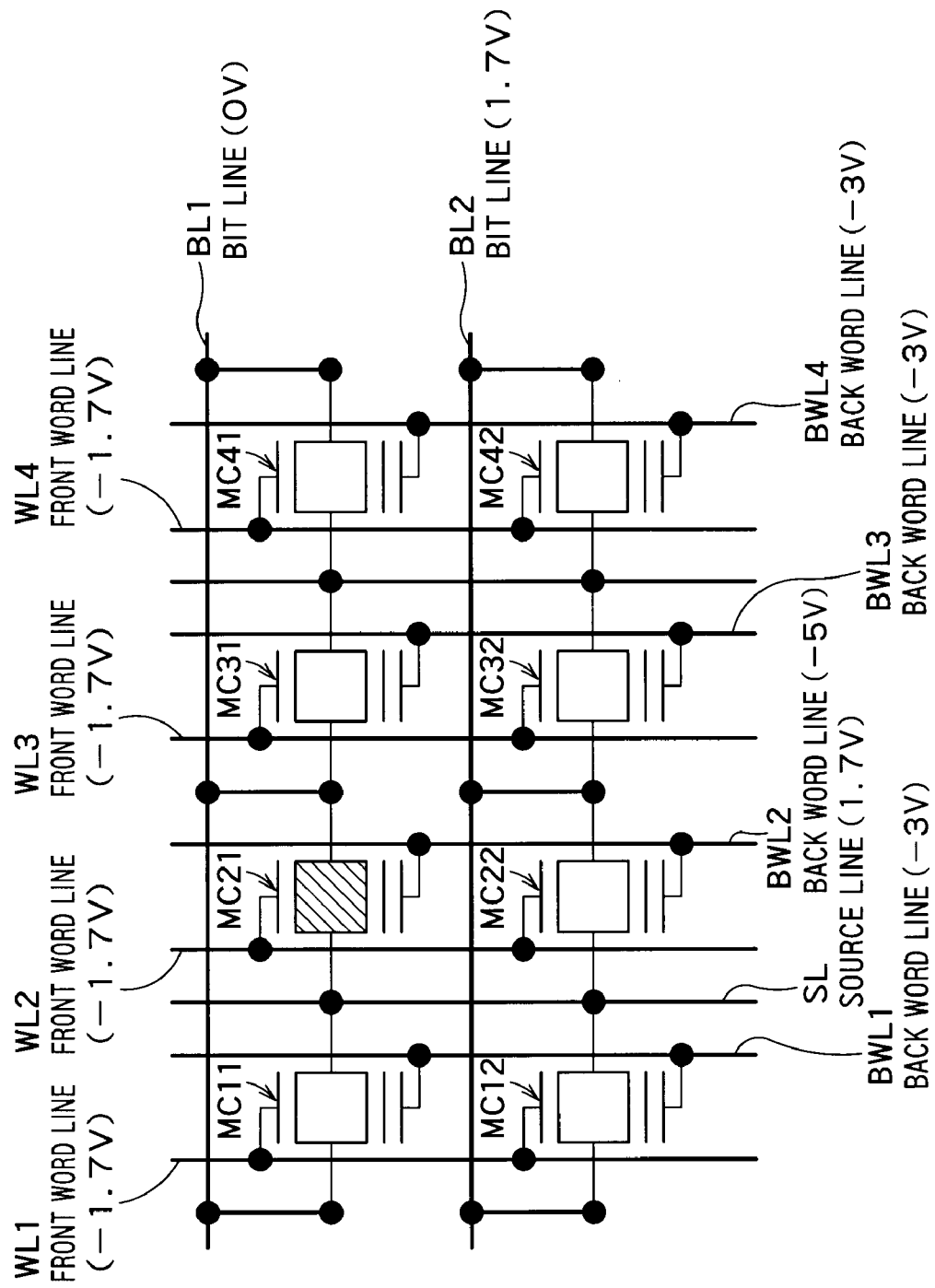
FIG. 55 is a diagram of the memory cell array showing another voltage relationship when holes are injected in the ONO film 20.

FIG. 55 is a diagram of the memory cell array showing another voltage relationship when holes are injected in the ONO film 20. The voltage relationship shown in FIG. 55 is such that the potential of the source line SL is high, e.g., 1.7 V. A low potential, e.g., 0 V is applied to the selected bit line BL1 and a high potential, e.g., 1.7 V to the unselected bit line BL2. Holes are accelerated in the electric field near the source 60 to receive energy. The holes are injected as hot holes in the ONO film 20 near the body-source PN junction.

Seventh Embodiment

Figure 56:
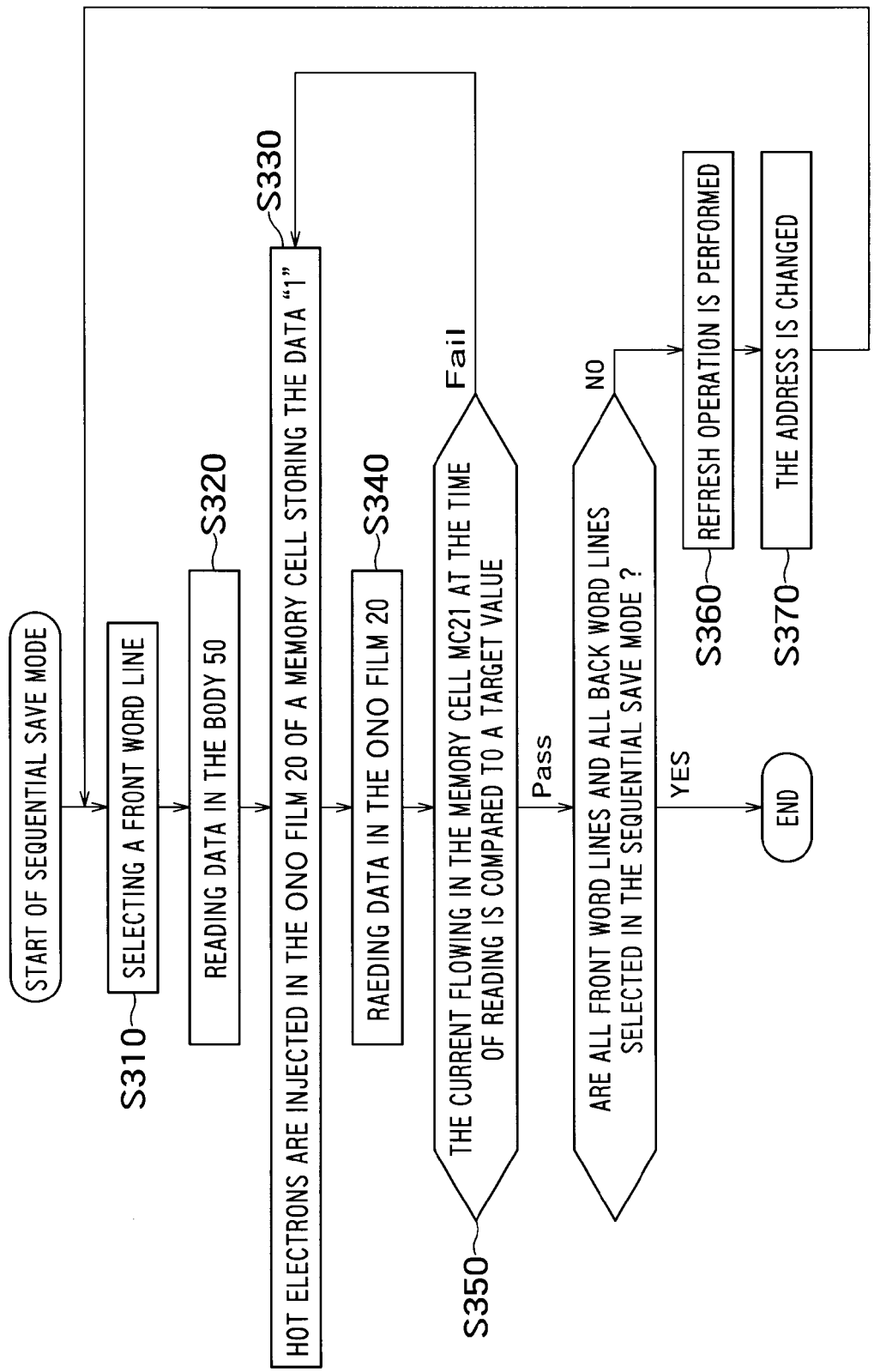
FIG. 56 is a flowchart of the sequential save mode according to a seventh embodiment of the present invention.

FIG. 56 is a flowchart of the sequential save mode according to a seventh embodiment of the present invention. The sequential save mode is applied to the sixth embodiment that the back word line is provided so as to correspond to the front word line. A front word line is selected (S310). The sense amplifier S/A reads data depending on majority carriers in the body 50 and identifies the data (S320). The sense amplifier S/A reads the data from the memory cells connected to the selected front word line via a bit line. The reading operation is the same as in ordinary FBC memories.

Hot electrons are injected in the ONO film 20 of a memory cell storing the data "1" (S330). As shown in FIG. 52, a specific word line is selected by a pair of the front word line WL2 and the back word line BWL2. A first voltage (e.g., 0 V) is applied to the source line SL common to all memory cells.

A second voltage lower than the first voltage (e.g., −1.7 V) is applied to the unselected front word lines WL1, WL3, and WL4. A third voltage higher than the second voltage (e.g., 0.5 V) is applied to the selected front word line WL2. A fourth voltage lower than the first voltage (e.g., −3 V) is applied to the unselected back word lines BWL1, BWL3, and BWL4. A fifth voltage higher than the third voltage (e.g., 3 V) is applied to the selected back word line BWL2. The memory cells MC21 and MC22 are thus selected. Assume that the memory cell MC21 stores the data "1" and the memory cell MC22 the data "0".

A sixth voltage higher than the first voltage (e.g., 1.7 V) is applied to the bit line BL1 and the first voltage (e.g., 0 V) to the bit line BL2. Electrons are not injected in the ONO film 20 of the memory cell MC22 but in the ONO film 20 of the memory cell MC21. The programming time is e.g., 100 ns.

To verify whether sufficient electrons are injected in the ONO film 20, the sense amplifier S/A reads data depending on trapped charges in the ONO film 20 (S340). As shown in FIG. 53, a specific word line is selected by the back word line BWL2. The memory cells MC21 and MC22 are thus selected. A first voltage (e.g., 0 V) is applied to the source line SL common to all memory cells. A second voltage lower than the first voltage (e.g., −1.7 V) is applied to the front word lines WL1 to WL4. A third voltage lower than the first voltage (e.g., −3 V) is applied to the unselected back word lines BWL1, BWL3, and BWL4. A fourth voltage higher than the third voltage (e.g., 1.2 V) is applied to the selected back word line BWL2. A fifth voltage different from the first voltage (e.g., −0.2 V) is applied to the bit lines BL1 and BL2.

Because trapped electrons are injected in the ONO film 20 of the memory cell MC21, the current based on the amount of the trapped electrons flows in the memory cell MC21. The current flowing in the memory cell MC21 at the time of reading is compared to a target value (S350). The target value is the current value of a memory cell obtained when trapped electrons are injected sufficiently in the ONO film 20. If the current does not reach the target value, it means that more trapped electrons are required (Fail). Step S330 is then repeated to inject further electrons in the ONO film 20. If the current reaches the target value, it means that sufficient trapped electrons exist in the ONO film 20. The refresh operation is performed (S360) and then the address is changed to select the next front word line and the back word line (S370). When the save operation is performed for all pairs of the front word line and the back word line, the sequential save mode ends.

After electrons are injected in the respective ONO films 20 for the front word line WL1, the refresh operation is performed successively for the front word line WL2, the front word line WL3, and the front word line WL4 that have not been subjected to the programming operation. Electrons are injected in the respective ONO films 20 for the front word line WL2. The refresh operation is then performed for the front word line WL3 and the front word line WL4. Namely, a front word line is selected and then the refresh operation is successively repeated for all of unselected front word lines.

To refresh a memory cell storing the data "1", impact ionization is induced between the body and the drain, so that holes are accumulated in the body 50. To refresh a memory cell storing the data "0", holes are removed from the body 50.

Figure 57:
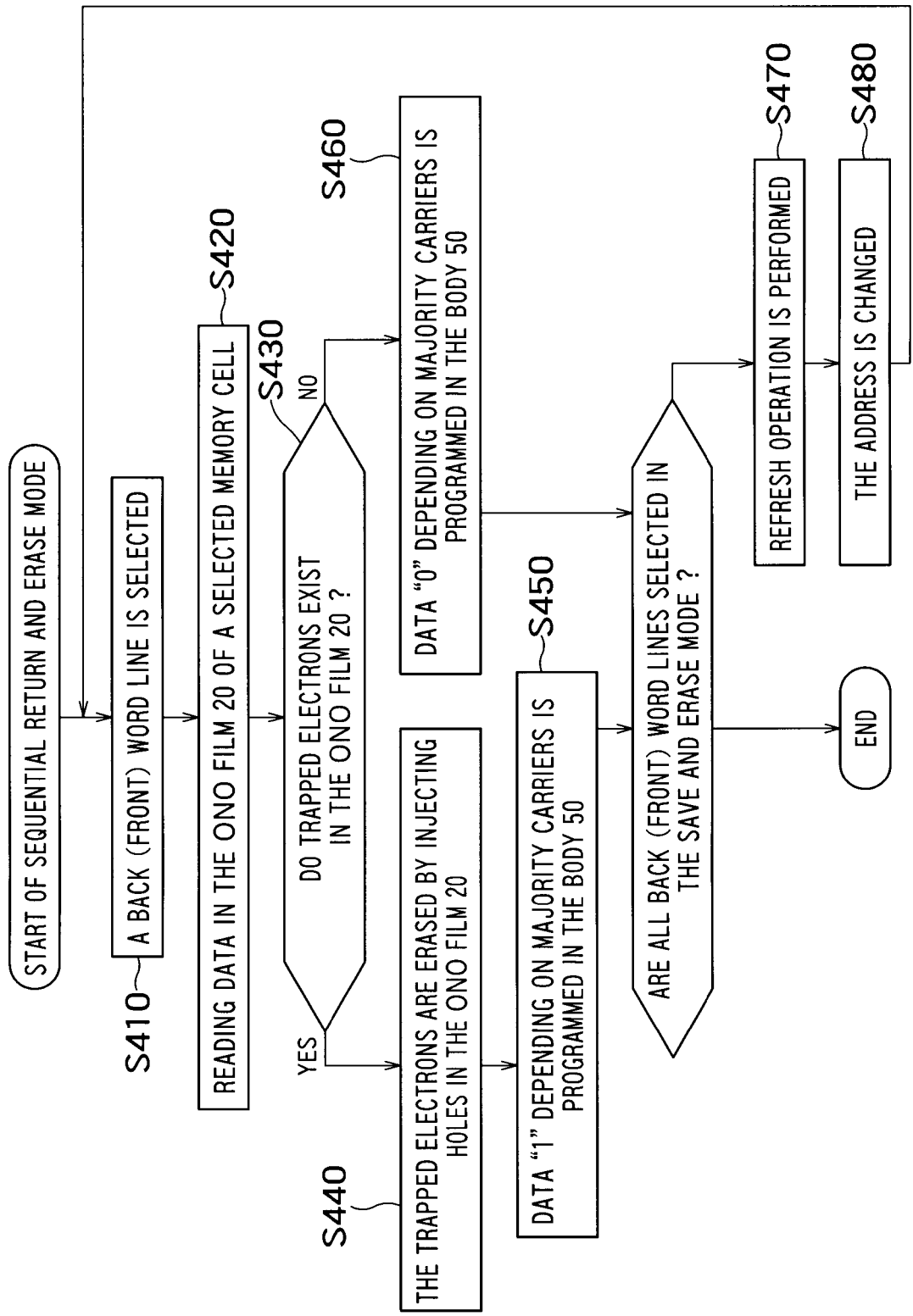
FIG. 57 is a flowchart of the sequential return mode and erase mode according to the seventh embodiment.

FIG. 57 is a flowchart of the sequential return mode and erase mode according to the seventh embodiment. A back word line is selected (S410). The sense amplifier S/A reads data depending on trapped electrons in the ONO film 20 of a selected memory cell connected to a bit line (S420). For example, the data is read by the method described with reference to FIG. 53. The data is latched temporarily in the sense amplifier S/A.

Whether trapped electrons exist in the ONO film 20 is verified based on the data (S430). If trapped electrons exist in the ONO film 20, the trapped electrons are erased by injecting holes in the ONO film 20 (S440). The time for hole injection is e.g., 100 µs. Holes are injected by band-to-band tunneling hot holes. Voltages shown in FIG. 54 are applied. The memory cells MC21 and MC22 are thus selected. Assume that data "1" is stored in the ONO film of the memory cell MC21 while data "0" is stored in the ONO film of the memory cell MC22. Holes are injected in the memory cell MC21, not in the memory cell MC22.

When trapped electrons exist in the ONO film 20, the data is "1". Holes as majority carriers are accumulated in the body 50. The data "1" depending on such majority carriers is thus programmed in the body 50 (S450).

When trapped electrons do not exist in the ONO film 20, the data is "0". Majority carriers (holes) in the body 50 are drawn. The data "0" depending on majority carriers is programmed in the body 50 (S460). The refresh operation is performed (S470) and then the next back word line is selected (S480). When the return and erase operations are performed for all back and front word line pairs, the sequential return/erase mode ends.

The time for injecting a predetermined amount of holes in the ONO film 20 is longer than the time for injecting a predetermined amount of electrons in the ONO film 20. For example, while the time for injecting electrons in the ONO film is 100 ns, the time for injecting holes in the ONO film is 100 µs. When there provided many word lines, data loss can occur if holes are injected in a selected word line and the refresh operation is performed for unselected word lines. For example, if there provided 4000 word lines and a cycle for the refresh operation is 100 ns, it takes 400 µs for performing the refresh operation for all memory cells. If holes are injected in a selected word line for 100 µs, the time 400+100=500 µs is required. If the shortest data retention time for enabling data identification is 500 µs, data identification may be impossible because of hole injection and refresh operations.

Figure 58:
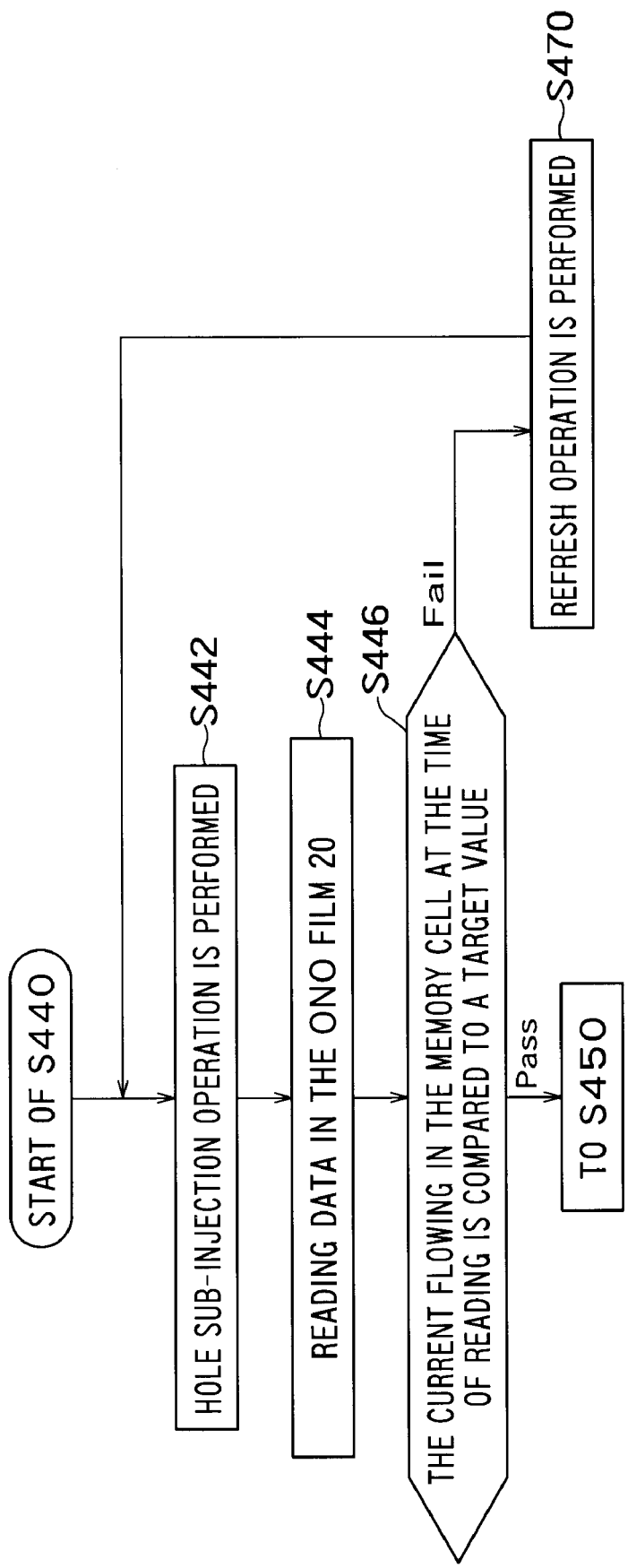
FIG. 58 is a flowchart showing sub-injection operations.

As shown in FIG. 58, the hole injection operation is divided into a plurality of sub-injection operations and the refresh operation is performed for each sub-injection operation. FIG. 58 is a flowchart for explaining the operation of step S440 in further detail. The hole sub-injection operation is performed (S442). The time for performing the sub-injection operation once is, e.g., 1 µs. The sense amplifier S/A reads data depending on trapped electrons in the ONO film 20 (S444). If the current flowing in a memory cell at the time of reading does not reach a target value (Fail), the refresh operation is performed (S470) and the hole sub-injection operation is performed. The sub-injection and the refresh operations are repeated, so that trapped electrons in the ONO film 20 are erased gradually. If the current flowing in a memory cell at the time of reading reaches the target value (Pass), the process moves to step S450.

If the sub-injection operation takes 1 µs in the above example, the sub-injection and the refresh operation is completed in 401 µs. The probability of data loss is reduced.

Steps S444 and S446 can be omitted and the number of sub-injection operations can be determined to be 100, and the determination is then made based on the number.

Needless to say, the electron injection operation shown in FIG. 56 can be divided into a plurality of sub-injection operations. The refresh operation is performed for every electron sub-injection operation.

Figure 59:
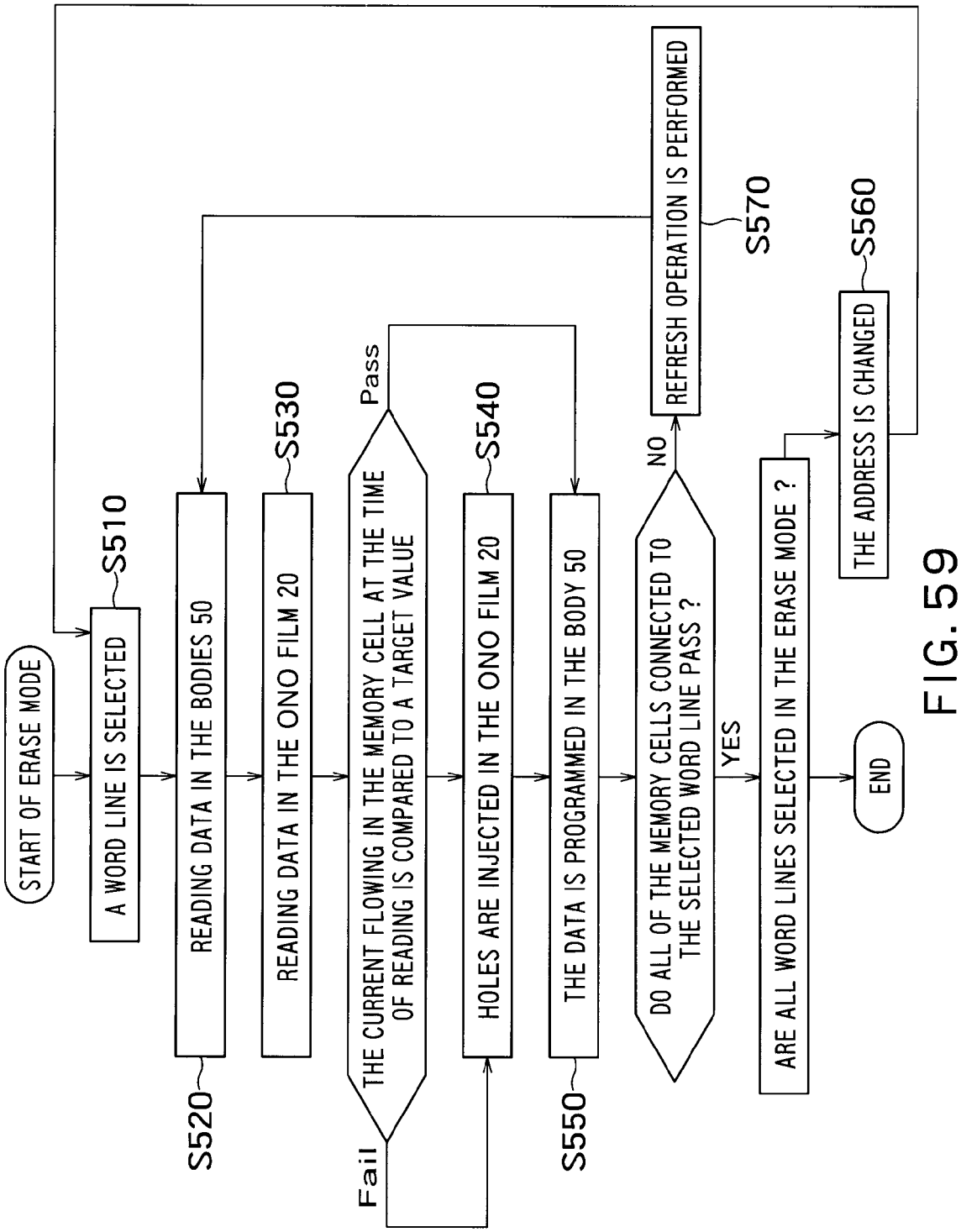
FIG. 59 is a flowchart showing an erase mode.

The return mode and the erase mode can be performed separately in the seventh embodiment. The sequential return mode is performed based on the flowchart of FIG. 12 and the data depending on trapped electrons in the ONO film 20 is converted into the data depending on majority carriers in the body 50. The erase mode shown in FIG. 59 is then performed. A word line is selected (S510). The sense amplifier S/A reads data depending on majority carriers in the bodies 50 of the memory cells connected to the selected word line (S520). The sense amplifier S/A reads data depending on trapped electrons in the ONO films 20 of the memory cells connected to the selected word line (S530). The current flowing in a selected memory cell at the time of reading the data depending on trapped electrons is compared to a target value. If the current does not reach the target value (Fail), trapped electrons exist in the ONO film 20. Holes are thus injected in the ONO film 20 (S540). If band-to-band tunneling hot hole injection is performed and different voltages are set for bit lines, holes are injected only in the selected memory cell. If the current reaches the target value (Pass), trapped electrons do not exist in the ONO film 20. Holes are not injected in the ONO film 20. The data depending on majority carriers is programmed in the body 50 (S550). If all of the memory cells connected to the selected word line pass the test, the address of the word line is changed (S560). If any of the memory cells connected to the selected word line fails, the refresh operation is performed (S570) and then the process moves to step S520. A series of operations is repeated until trapped electrons in the ONO films 20 of all memory cells are erased by hole injection. The data depending on trapped electrons in the ONO film 20 is read and the current flowing in a memory cell at the time of reading is compared to the target value. Holes are not injected in the ONO film 20 excessively.

Because the sixth and seventh embodiments accomplish selective driving of back word lines, data loss is reduced and data programming in the ONO film 20 and data erasing from the ONO film 20 are faster as compared to the third embodiment. The parasitic capacitance of the back word line is smaller than that of a well used as the common back gate BG. Power consumption is thus reduced. Needless to say, the terms "front" and "back" do not necessarily mean that the front word lines are formed above the back word line. The back word lines in contact with the charge trapping film can be formed above an SOI layer under which the front word lines are formed.

Eighth Embodiment

An eighth embodiment of the present invention is different from the seventh embodiment in the sequential return mode and erase mode. Other configurations of the eighth embodiment can be the same as those of the seventh embodiment.

Figure 60:
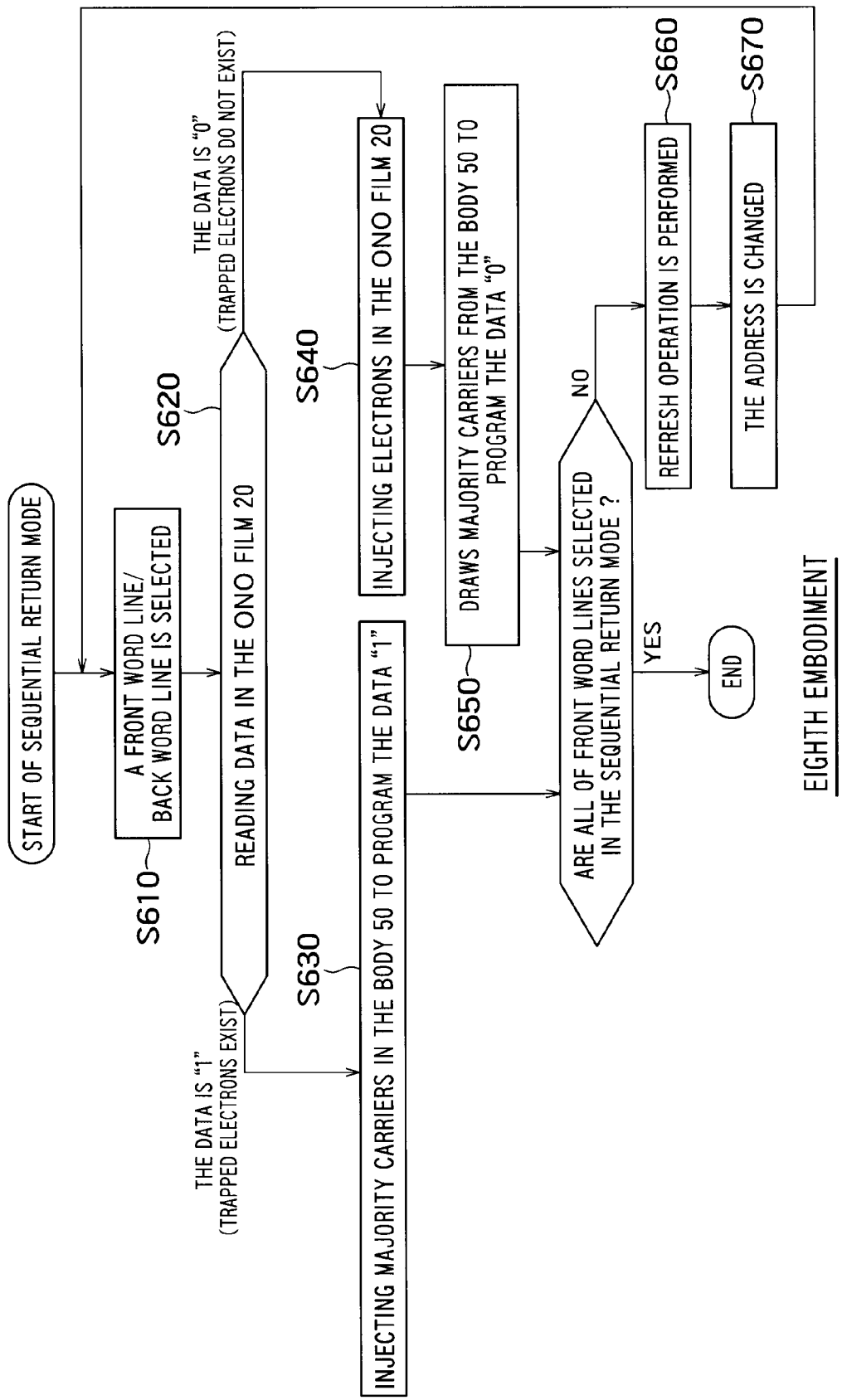
FIG. 60 is a flowchart of the sequential return mode and erase mode according to the eighth embodiment.

FIG. 60 is a flowchart of the sequential return mode and erase mode according to the eighth embodiment. A front word line/back word line is selected (S610). The sense amplifier S/A reads data depending on trapped electrons in the ONO film 20 (S620). If the data is "1", i.e., trapped electrons exist, the sense amplifier S/A does not inject electrons in the ONO film 20 but majority carriers (holes) in the body 50 to program the data "1" (S630).

If the data is "0", i.e., trapped electrons do not exist, the sense amplifier S/A injects electrons in the ONO film 20 (S640). The sense amplifier S/A further removes majority carriers from the body 50 to program the data "0" (S650).

The refresh operation is performed for memory cells holding data depending on majority carriers in their bodies 50 (S660). The address of the front word line is changed (S670).

The operations of steps S620 to S650 are repeated. The sequential return mode is performed for all front word lines in a memory cell array. The data depending on trapped electrons in the ONO film 20 is recovered to the data depending on majority carriers in the body 50. The ONO films 20 of all memory cells have trapped electrons injected (data "1"). As electrons are injected in the ONO films 20 of all memory cells, variations in threshold voltage at the time of reading data in the first storage state are reduced.

Figure 61:
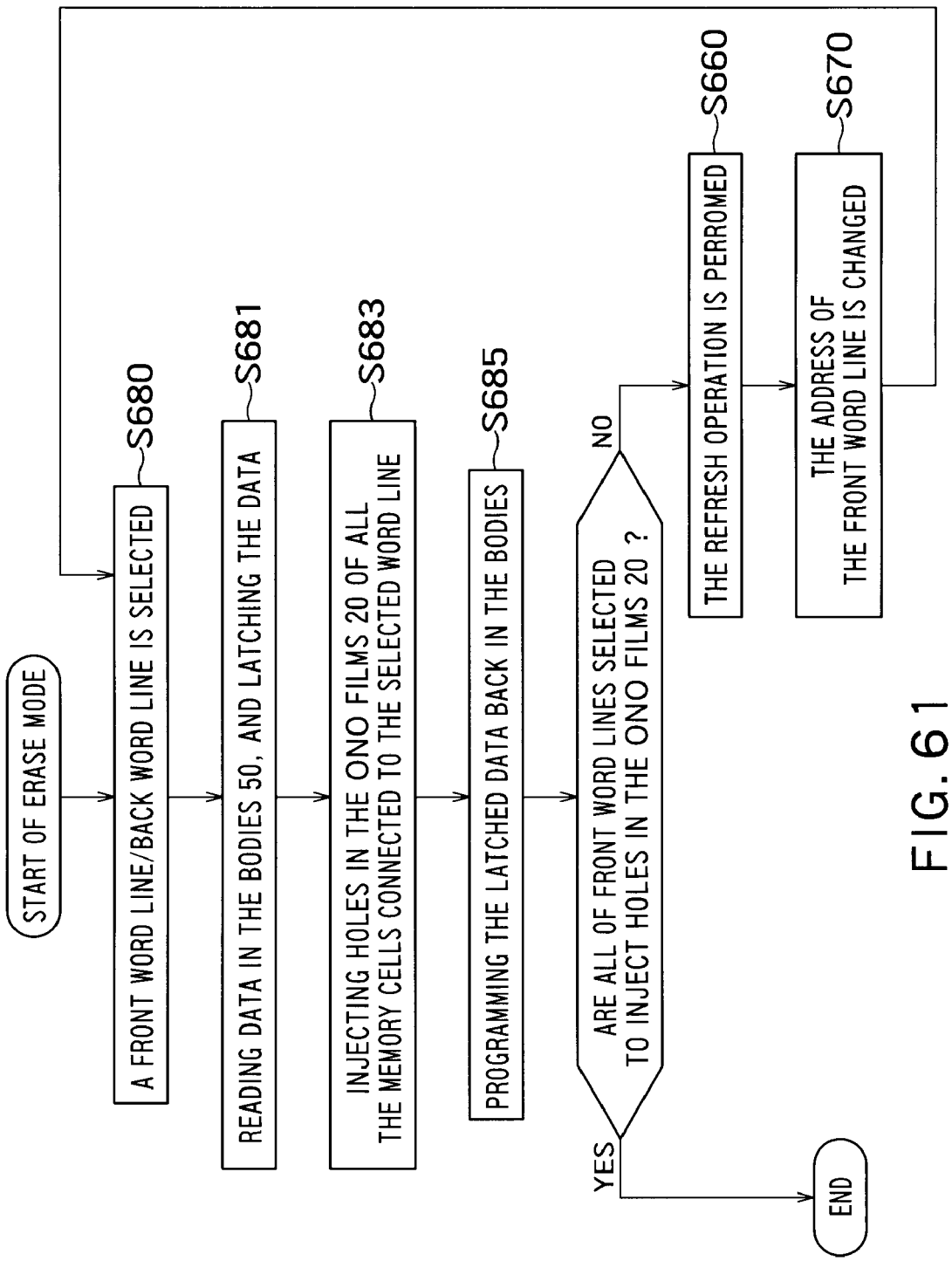
FIG. 61 is a flowchart of the erase mode according to the eighth embodiment.

FIG. 61 is a flowchart of the erase mode according to the eighth embodiment. A front word line/back word line is selected (S680). The sense amplifier S/A reads data depending on majority carriers in the bodies 50 of the memory cells connected to the selected word line, and latches the data (S681). The sense amplifier S/A injects holes in the ONO films 20 of the memory cells connected to the selected word line to erase trapped electrons (S683). The sense amplifier S/A then programs the latched data back in the bodies of the memory cells (S685). The refresh operation is performed for memory cells holding data depending on majority carriers in the bodies 50 (S660). The address of the front word line is then changed (S670) and the operations of steps S680 to S685 are repeated. The erase operation is performed for all front word lines in the memory cell array. The data depending on majority carriers in the body 50 remains, while trapped electrons in the ONO films 20 of all memory cells are erased.

Into the ONO films 20 without trapped electrons, electrons are injected through the erase mode of the eighth embodiment. The data depending on trapped electrons in the ONO film 20 is converted into the data depending on majority carriers in the body 50 as well. The amounts of trapped electrons in the ONO films 20 of all memory cells become uniform. After the amounts of trapped electrons become uniform the data depending on trapped electrons in the ONO films 20 are erased.

According to the eighth embodiment, the memory cell array enters the usual mode (the first storage state) after the sequential return mode unlike FIG. 11. The erase mode is performed just before the sequential save mode. In the first storage state, the sense amplifier S/A reads the data depending on majority carriers in the body 50 while trapped electrons exist in the ONO films 20 of all memory cells. As described with reference to FIG. 21, if trapped electrons exist in the ONO film 20, the difference in threshold voltage between the data "0" and "1" is further increased when the data depending on majority carriers in the body 50 is read.

Ninth Embodiment

A ninth embodiment of the present invention is different from the seventh embodiment in the first storage state and the sequential save mode.

Figure 62:
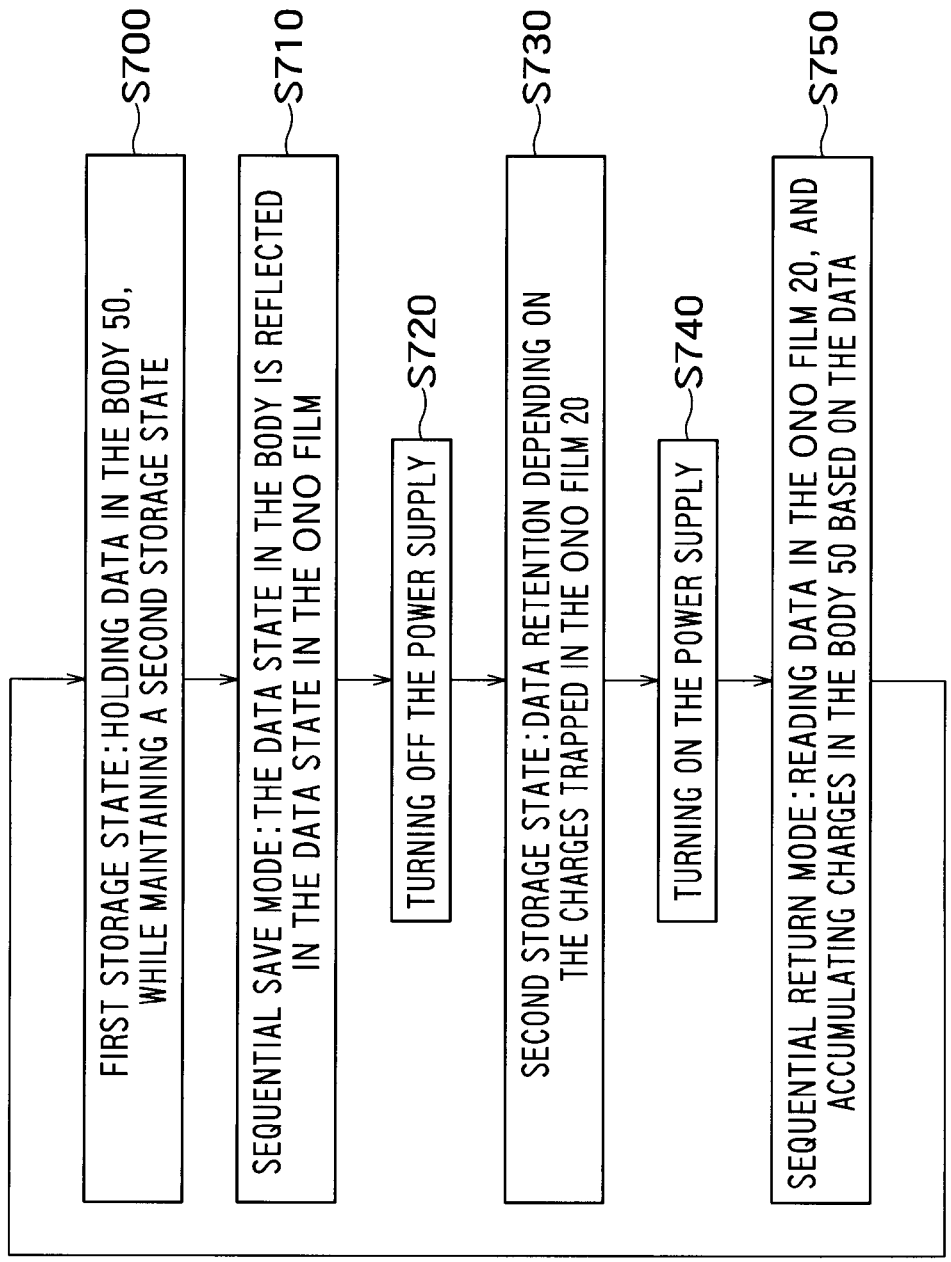
FIG. 62 is a flowchart of the sequential save mode and the sequential return mode.

FIG. 62 is a flowchart of the sequential save mode and the sequential return mode. An FBC memory is in the first storage state (S700). In the first storage state of the ninth embodiment, the FBC memory holds data depending on majority carriers in the body 50. The FBC memory also maintains a data state depending on charges in the ONO film 20. The sequential save mode is performed (S710). In the sequential save mode of the ninth embodiment, the data state depending on majority carriers in the body is reflected in the data state depending on charges in the ONO film 20. The FBC memory may return to the first storage state after the sequential save mode. Steps S700 and S710 can be repeated.

When a data state in the first storage state is changed, the data state is reflected in the second storage state. A data state is stored and maintained simultaneously in both states of the first storage state and the second storage state of each single cell. The second storage state functions as a backup for the first storage state.

Even if the power supply for the memory device is turned off after the sequential save mode or the first storage state (S720), data in memory cells MC is maintained. While the power supply is off, the FBC memory maintains the second storage state (S730). If the sequential save mode is performed for every certain period of time, even though in case of emergency that power is shut down suddenly, data remains in the ONO film because of the sequential save mode performed most recently.

When the power supply is turned on (S740), the sequential return mode is performed (S750). A selected memory cell MC is shifted from the second storage state to the first storage state. The sequential return mode allows the FBC memory which functions as a non-volatile memory to function as a dynamic volatile memory. Data is read from or written in memory cells MC at high speed.

Figure 63:
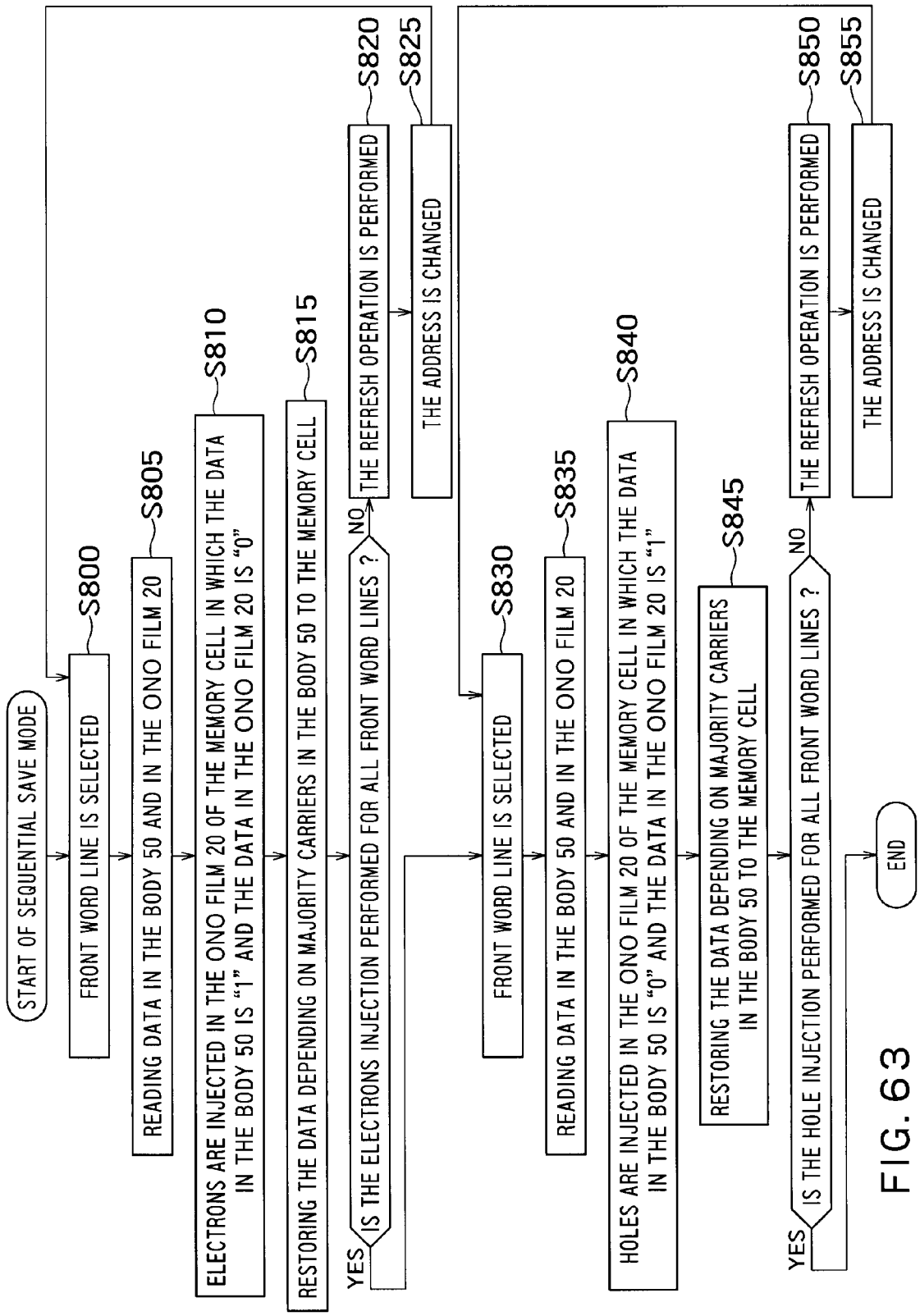
FIG. 63 is a flowchart of the sequential save mode according to the ninth embodiment.

FIG. 63 is a flowchart of the sequential save mode according to the ninth embodiment. A front word line/back word line is selected (S800). The sense amplifier S/A reads data depending on majority carriers in the body 50 and trapped electrons in the ONO film 20 (S805). If the data depending on majority carriers in the body 50 is "1" and the data depending on trapped electrons in the ONO film 20 is "0", electrons are injected in the ONO film 20 of the corresponding memory cell (S810). Electrons are not injected in the ONO films 20 of memory cells that do not satisfy the above condition. After injection of electrons, the sense amplifier S/A programs the data depending on majority carriers (holes) in the body 50 (S815). The refresh operation is performed for the memory cells holding the data depending on majority carriers in the bodies 50 (S820). The address of the front word line is changed (S825) and the operations of steps S800 to S825 are repeated. Such series of operations is performed for all front word lines in the memory cell array.

A front word line/back word line is then selected (S830). The sense amplifier S/A reads data depending on majority carriers in the body 50 and trapped electrons in the ONO film 20 (S835). If the data depending on majority carriers in the body 50 is "0" and the data depending on trapped electrons in the ONO film 20 is "1", holes are injected in the ONO film 20 of the corresponding memory cell (S840). Holes are not injected in the ONO films 20 of memory cells that do not satisfy the above condition. After injection of holes, the sense amplifier S/A programs the data depending on majority carriers (holes) in the body 50 (S845). The refresh operation is performed for the memory cells holding the data depending on majority carriers (holes) in the bodies 50 (S850). The address of the front word line is changed (S855) and the operations of steps S830 to S855 are repeated. Such series of operations is performed for all front word lines in the memory cell array.

The sequential save mode described above allows the data depending on holes in the body 50 to be copied in the data depending on trapped electrons in the ONO film 20. The sequential return mode is performed based on the flowchart shown in FIG. 12.

Tenth Embodiment

Figure 64:
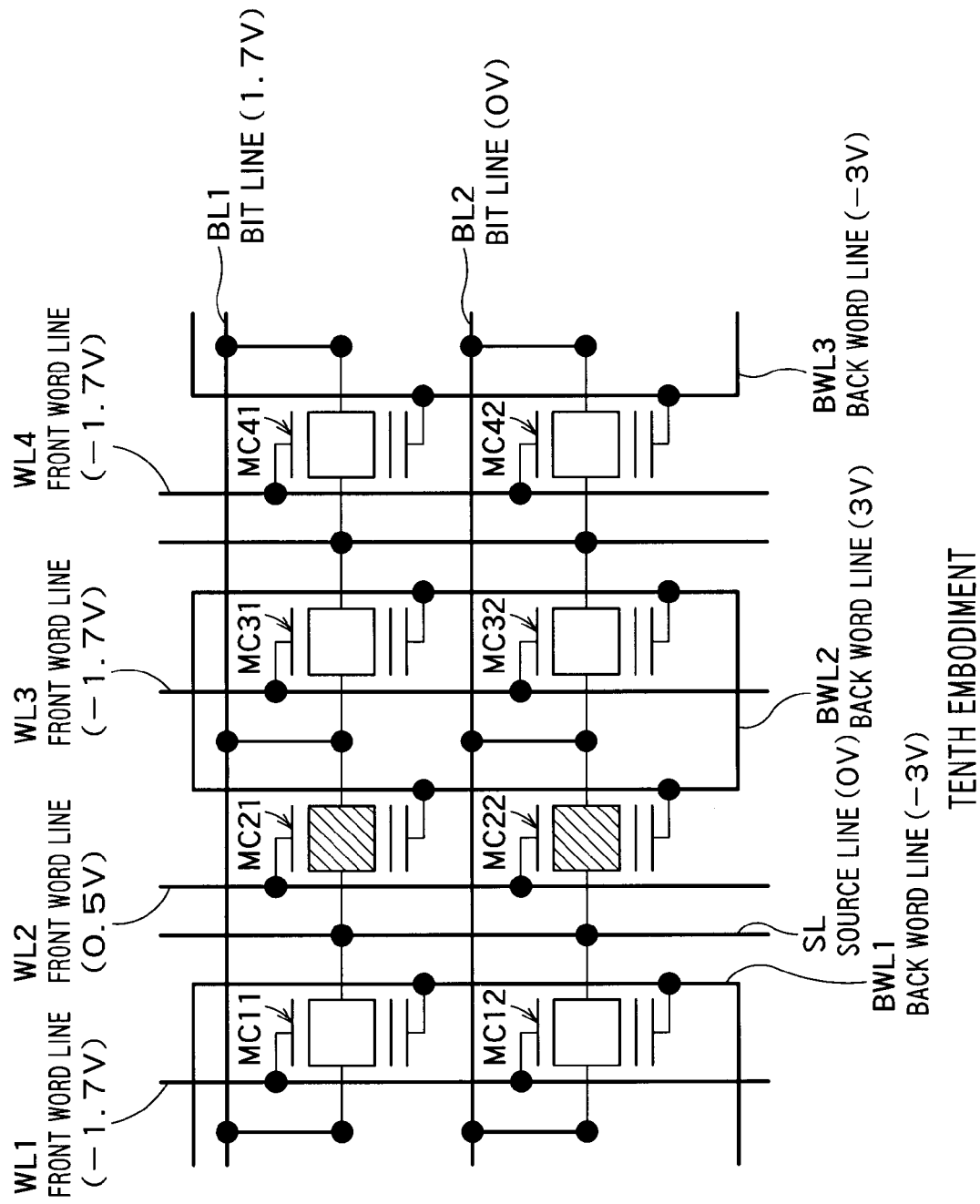
FIG. 64 is a diagram of a memory cell array according to a tenth embodiment of the present invention.

FIG. 64 is a diagram of a memory cell array according to a tenth embodiment of the present invention. The tenth embodiment is different from the eighth embodiment in that the back word line is provided so as to correspond to a plurality of front word lines. FIG. 64 shows the voltage relationship of the electron injecting operation in the sequential save mode. According to the tenth embodiment, connected to a selected back word line are memory cells arranged in two rows. The memory cells arranged in one of the two rows are selected by the front word line.

By selecting a back word line BWL2, a pair of adjacent front word lines WL2 and WL3 is selected. The sense amplifier S/A reads data in the bodies 50 of memory cells MC21 and MC22 connected to the selected front word line WL2 and latches the data.

Electrons are injected in the ONO film 20 based on the read data. Assume the data in the body 50 of the memory cell MC21 is "1", while the data in the memory cell MC22 is "0". For example, as shown in FIG. 64, a first voltage (e.g., 0 V) is applied to the source SL common to all memory cells. A second voltage lower than the first potential (−1.7 V) is applied to unselected front word lines WL1, WL3, and WL4. A third voltage higher than the second voltage (e.g., 0.5 V) is applied to the selected front word line WL2. A fourth voltage lower than the first voltage (e.g., −3 V) is applied to unselected back word lines BWL1 and BWL3. A fifth voltage higher than the third voltage (e.g., 3 V) is applied to the selected back word line BWL2. A sixth voltage (e.g., 1.7 V) higher than the first voltage is applied to the bit line BL1 used for programming the data "1". The first voltage is applied to the bit line BL2 used for programming the data "0". The memory cells MC21 and MC22 are selected by the voltage relationship. Electrons are injected in the ONO film 20 of the memory cell MC21 but not in the ONO film 20 of the memory cell MC22. The data depending on trapped electrons in the ONO film 20 of the memory cell MC21 is "1". The data depending on trapped electrons in the ONO film 20 of the memory cell MC22 is "0". Because the drain voltage of the memory cell MC21 is higher than the source voltage, electrons are injected in the ONO film 20 near the body-drain junction. After electrons are injected, the voltage of the back word line BWL2 is returned to −3 V.

The front word line WL3 is then selected and the save operation is performed for the memory cells MC31 and MC32. Such series of operations is repeated and the save operation is performed for all front word lines and back word lines.

While electrons are injected in the ONO films 20 of the memory cells connected to the front word line WL2, memory cells connected to the unselected front word lines hold their data states depending on majority carriers in the bodies 50. For example, for memory cells MC41 and MC42 connected to the front word line WL4, −3 V is applied to the back word line BWL3. A leak current through the interface state of bottom surface of the body is not generated. For memory cells MC31 and MC32 connected to the front word line WL3, 3 V is applied to the back word line BWL2. The bottom surface of the body is changed between an inverted state, depleted state, and accumulated state and the leak current through the interface state is generated. The save operation is performed for the front word line WL3 immediately after the save operation for the front word line WL2. The possibility of data loss is thus reduced. This is because the back word line is provided for two front word lines and driven independently.

Figure 65:
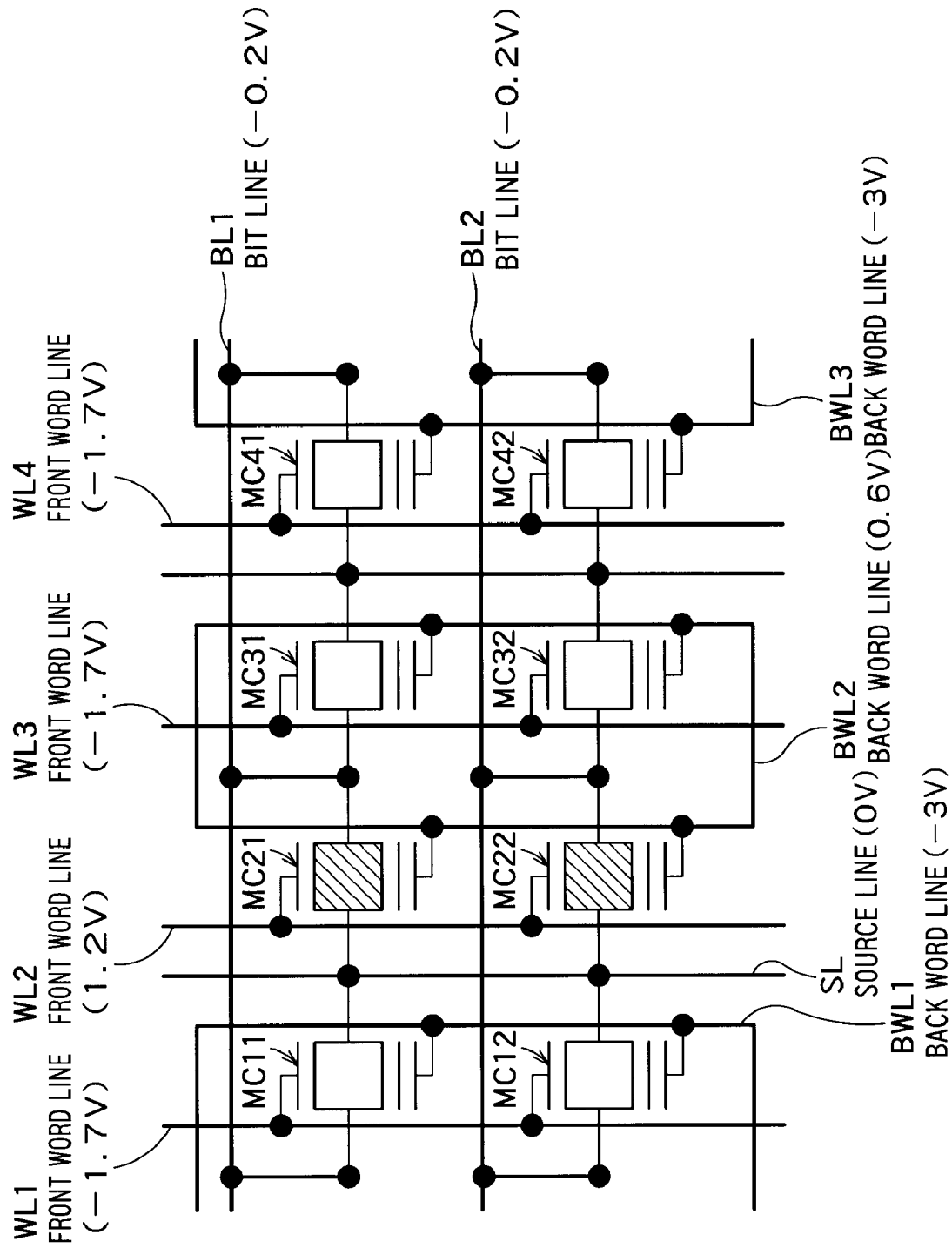
FIG. 65 is a diagram of the memory cell array showing the voltage relationship at the time of the data reading operation in the sequential return mode.

FIG. 65 is a diagram of the memory cell array showing the voltage relationship at the time of the data reading operation in the sequential return mode. With reference to FIG. 65, memory cells MC21 and MC22 are selected. A first voltage (e.g., 0 V) is applied to the source line SL common to all memory cells. A second voltage lower than the first voltage (e.g., −1.7 V) is applied to unselected front word lines WL1, WL3, and WL4. A third voltage higher than the second voltage (e.g., 1.2 V) is applied to a selected front word line WL2. A fourth voltage lower than the first voltage (e.g., −3 V) is applied to unselected back word lines BWL1 and BWL3. A fifth voltage higher than the fourth voltage (e.g., 0.6 V) is applied to a selected back word line BWL2. A sixth voltage different from the first voltage (e.g., −0.2 V) is applied to the bit lines BL1 and BL2. Based on the voltage relationship, the sense amplifier S/A reads data depending on trapped electrons in the ONO films 20 of the memory cells MC21 and MC22 and latches the data. If the data is "0", the sense amplifier S/A injects electrons in the ONO film 20 of the corresponding memory cell. If the data is "1", the sense amplifier S/A does not inject electrons because trapped electrons have already been injected in the ONO film 20. The voltage relationship shown in FIG. 64 is used at the time of electron injection. After electrons are injected, the voltage of the back word line BWL2 is set to −3 V. The sense amplifier S/A programs the data back in the bodies 50 of the memory cells MC21 and MC22. The method for programming back is the same as in conventional FBC memories. A series of operations is repeated, so that the return operation is performed for all front word lines.

Figure 66:
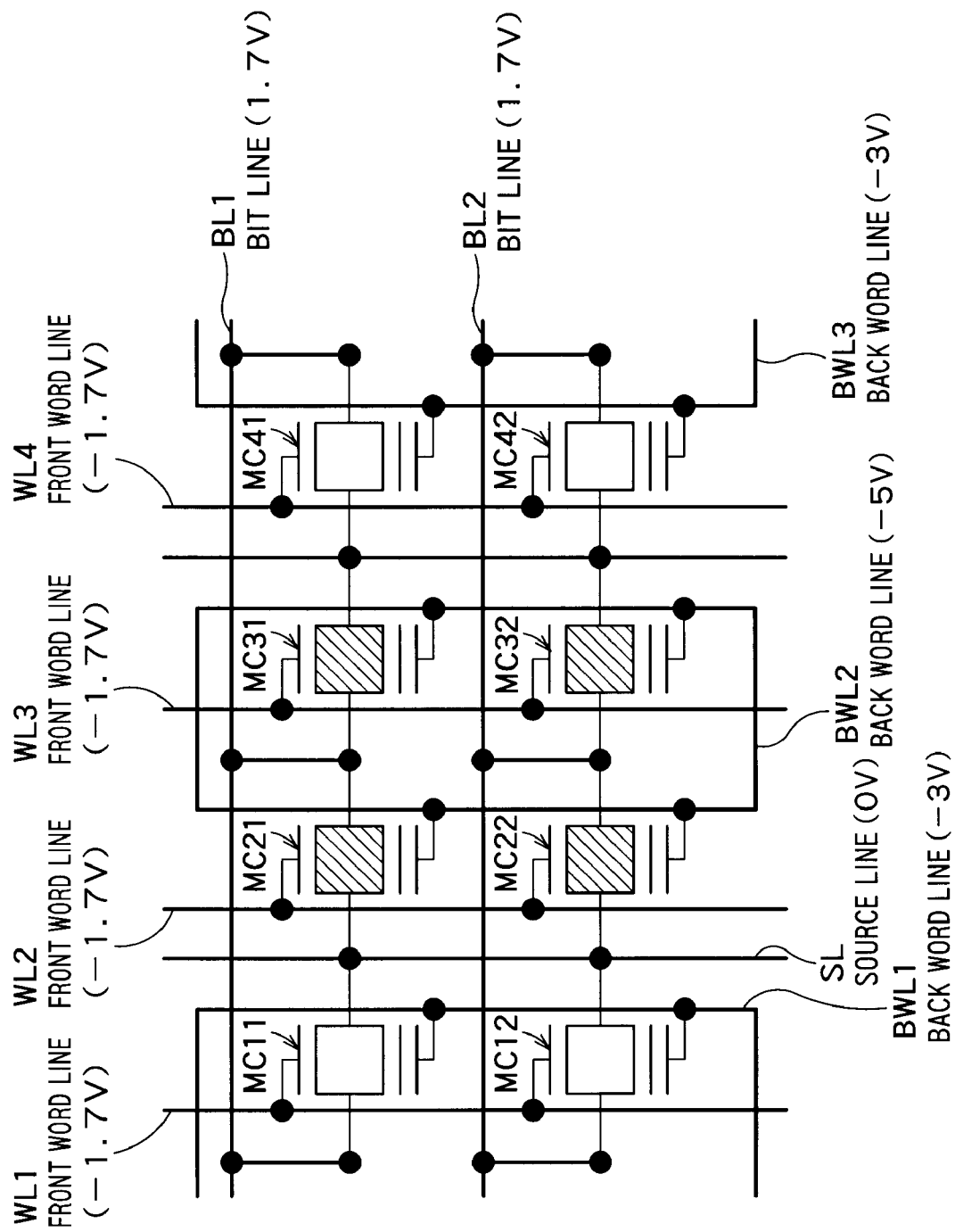
FIG. 66 is a diagram of the memory cell array showing the voltage relationship at the time of the erase mode.

In the erase mode, by selecting the back word line BWL2, a pair of the front word lines WL2 and WL3 is selected. The sense amplifier S/A reads the data in the bodies 50 of the memory cells MC21, MC22, MC31, and MC32 connected to the front word lines WL2 and WL3. The read data is stored temporarily in a data holding circuit different from the sense amplifier S/A. A first voltage (e.g., 0 V) is applied to the source line SL common to all memory cells as shown in FIG. 66. A second voltage (e.g., −1.7 V) is applied to the front word lines WL1 to WL4. A third voltage lower than the first voltage (e.g., −3 V) is applied to unselected back word lines BWL1 and BWL3. A fourth voltage lower than the third voltage (e.g., −5 V) is applied to a selected back word line BWL2. A fifth voltage higher than the first voltage (e.g., 1.7 V) is applied to the bit lines BL1 and BL2. Holes are injected in the ONO film 20 near the body-drain junction. Alternatively, holes are injected in the ONO film 20 by FN tunneling with 0 V of all bit lines. By injecting holes in the ONO film 20, trapped electrons in the ONO film 20 are erased. After the trapped electrons are erased, the voltage of the selected back word line is set to −3 V. The data is read from the data holding circuit. The sense amplifier S/A programs the data back in the respective bodies 50. Such an erase operation is performed for all back word lines.

Hole injection takes 1000 times longer time than electron injection. A reduction in the hole injection time is effective. In the erase mode of the tenth embodiment, every hole injection is performed for a plurality of rows. The time required for the erase mode is reduced by half.

While the back word line is provided so as to correspond to a pair of front word lines in the tenth embodiment, the back word line can be provided so as to correspond to three or more front word lines. According to a modified example of the tenth embodiment shown in FIGS. 67 to 70, the back word line is provided so as to correspond to four front word lines. The time required for the erase mode is further reduced.

Figure 67:
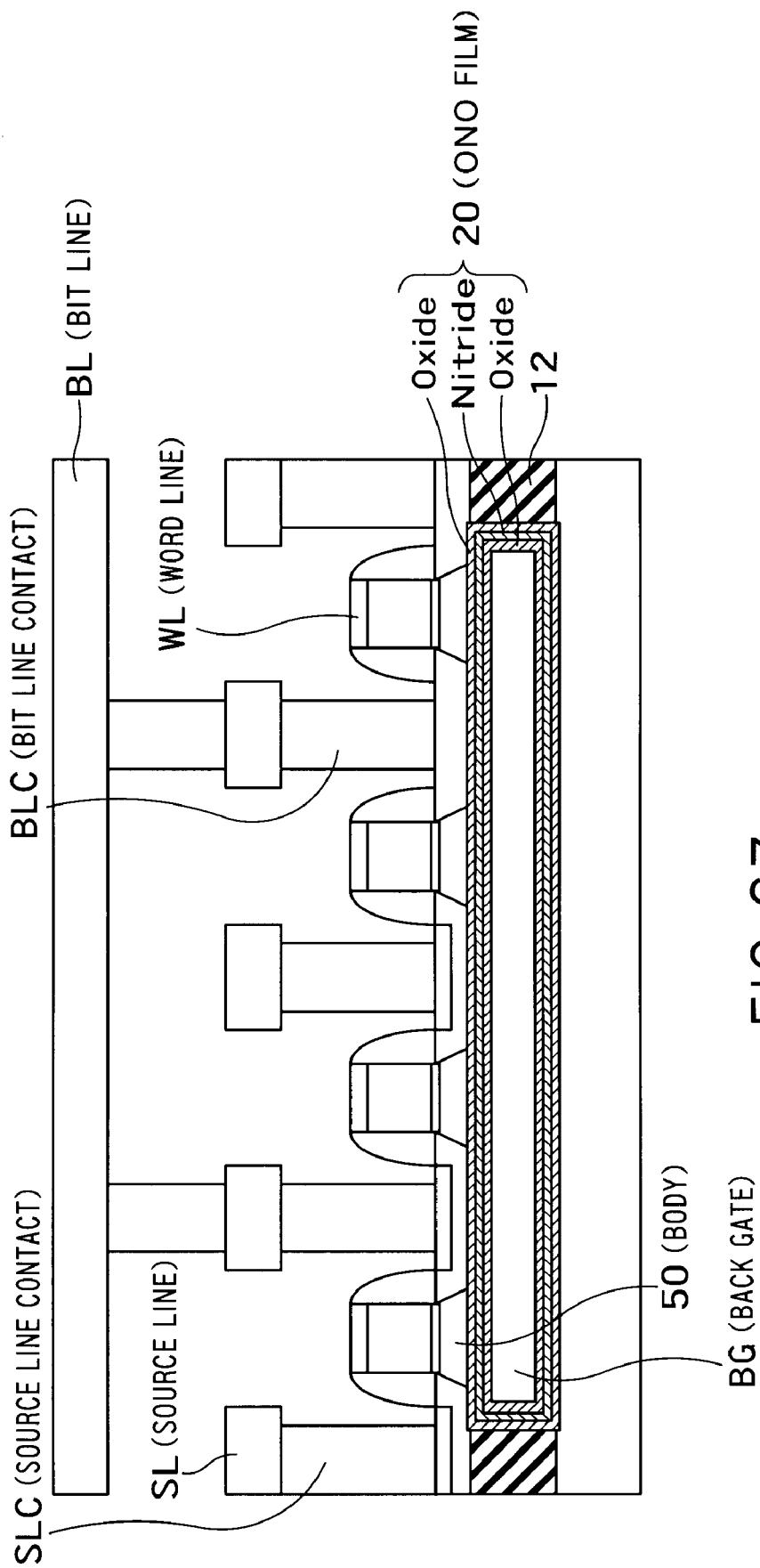
FIG. 67 is a cross-sectional view of an FBC memory according to the modified example of the tenth embodiment.

FIG. 67 is a cross-sectional view of an FBC memory according to the modified example of the tenth embodiment. The back word line is formed so as to correspond to four front word lines. Other configurations of the modified example are the same as in FIG. 29.

By selecting the back word line BWL1, four front word lines WL1 to WL4 are selected. The sense amplifier S/A reads the data in the bodies 50 of memory cells MC11, MC21, MC31, MC41, MC 12, MC22, MC32, and MC42 connected to the selected front word lines WL1 to WL4. The read data is stored temporarily in a data holding circuit (different from sense amplifier S/A).

Figure 68:
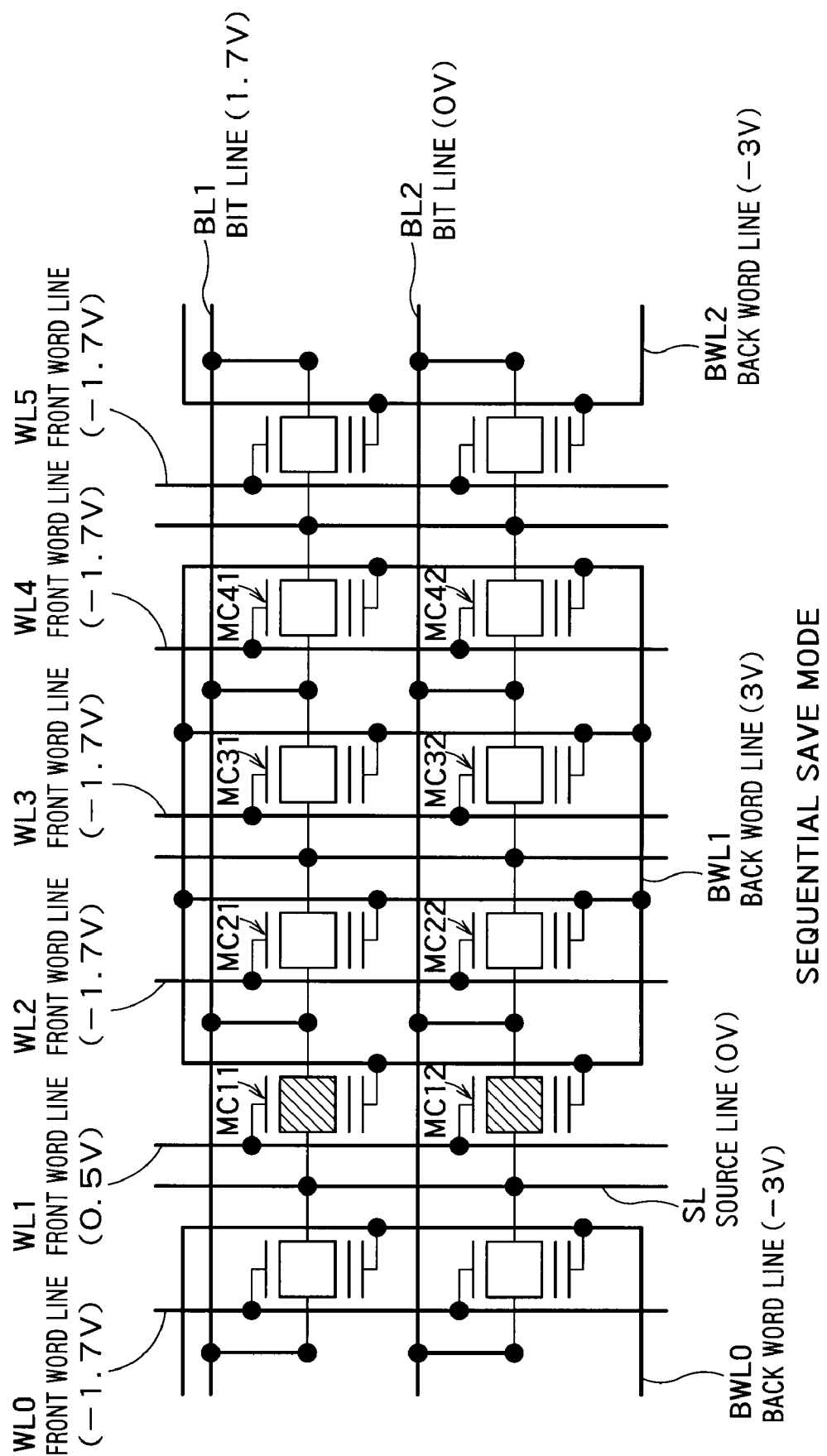
FIG. 68 is a diagram of the memory cell array showing the voltage relationship of the data reading operation in the sequential save mode.

Electrons are injected in the respective ONO films 20 of the memory cells connected to the four front word lines based on the read data. The front word line WL1 is selected first. The data of the memory cells connected to the front word line WL1 is read from the data holding circuit storing the data of the four front word lines. Assume that the data in the body 50 of the memory cell MC11 is "1" and the data in the body 50 of the memory cell MC 12 is "0". For example, as shown in FIG. 68, a first voltage (e.g., 0 V) is applied to the source SL common to all memory cells. A second voltage lower than the first voltage (e.g., −1.7 V) is applied to unselected front word lines WL0 and WL2 to WL5. A third voltage higher than the second voltage (e.g., 0.5 V) is applied to the selected front word line WL1. A fourth voltage lower than the first voltage (e.g., −3 V) is applied to unselected back word lines BWL0 and BWL2. A fifth voltage higher than the third voltage (e.g., 3 V) is applied to a selected back word line BWL1. A sixth voltage higher than the first voltage (e.g., 1.7 V) is applied to the bit line BL1 used for programming the data "1". The first voltage is applied to the bit line BL2 used for programming the data "0". The memory cells MC11 and MC12 are selected based on the voltage relationship. Electrons are injected in the ONO film 20 of the memory cell MC11 but not in the ONO film 20 of the memory cell MC 12. The data depending on trapped electrons in the ONO film 20 of the memory cell MC11 is "1", while the data depending on trapped electrons in the ONO film 20 of the memory cell MC 12 is "0". Because the drain voltage of the memory cell MC11 is higher than the source voltage, electrons are injected in the ONO film 20 near the body-drain junction.

The data of the memory cells connected to the front word line WL2 is read from the data holding circuit storing the data of the four front word lines. The front word line WL2 is selected and the same save operation is performed for the memory cells MC21 and MC22. A series of operations is repeated four times and the data of the memory cells connected to the four front word lines is saved. That operation is further repeated and the save operation is performed for all back word lines.

While electrons are injected in the ONO films 20 of the memory cells connected to the front word line WL1, the memory cells connected to other unselected front word lines maintain their data states depending on majority carriers in the bodies 50. For example, for the memory cells connected to the front word line WL5, −3 V is applied to the back word line BWL2. A leak current through the interface state of bottom surface of the body is not generated. For the memory cells connected to the front word lines WL2, WL3, and WL4, 3 V is applied to the back word line BWL1. As the bottom surface of the body is changed between an inverted state, depleted state, and accumulated state, the leak current through the interface state is generated. The memory cells connected to the front word line WL4 may be disturbed by the back word line BWL1 before the save operation. According to the described embodiment, the data of all memory cells connected to four front word lines is stored temporarily in the data holding circuit. Accordingly, the disturbance described above does not need to be considered.

Figure 69:
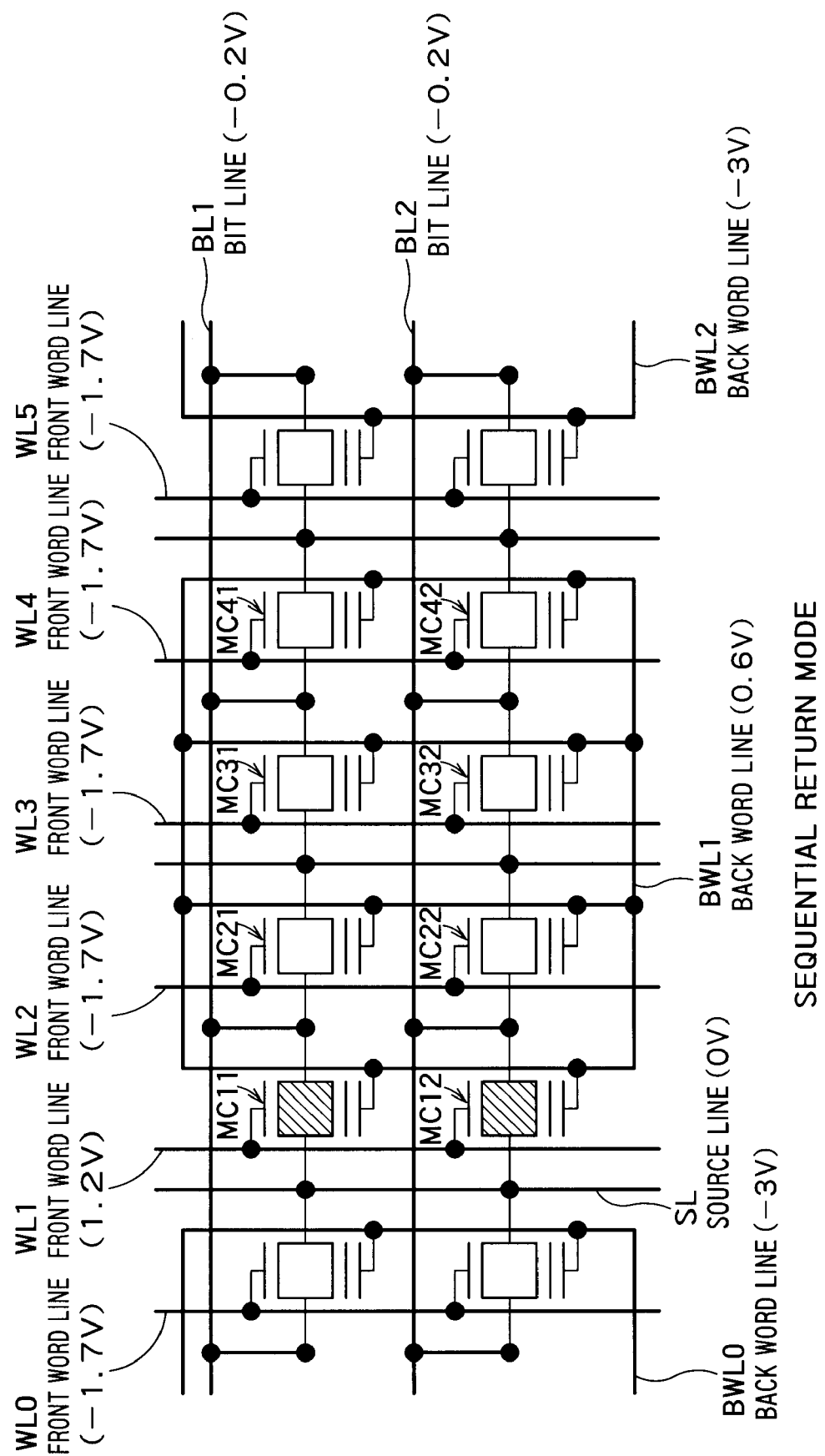
FIG. 69 is a diagram of the memory cell array showing the voltage relationship of the data reading operation in the sequential return mode.

FIG. 69 is a diagram of the memory cell array showing the voltage relationship of the data reading operation in the sequential return mode. Memory cells MC11 and MC12 are selected in FIG. 69. A first voltage (e.g., 0 V) is applied to the source SL common to all memory cells. A second voltage lower than the first potential (e.g., −1.7 V) is applied to unselected front word lines WL0 and WL2 to WL5. A third voltage higher than the second voltage (e.g., 1.2 V) is applied to a selected front word line WL1. A fourth voltage lower than the first voltage (e.g., −3 V) is applied to unselected back word lines BWL0 and BWL2. A fifth voltage higher than the fourth voltage (e.g., 0.6 V) is applied to a selected back word line BWL1. A sixth voltage different from the first voltage (e.g., −0.2 V) is applied to the bit lines BL1 and BL2. The sense amplifier S/A reads the data depending on trapped electrons in the ONO films 20 of the memory cells MC11 and MC12 based on the voltage relationship and latches the data. The read data is stored temporarily in a data holding circuit (different from sense amplifier S/A). If the data is "0", the sense amplifier S/A injects electrons in the ONO film 20 of the corresponding memory cell. If the data is "1", the sense amplifier S/A does not inject electrons because trapped electrons have already been injected in the ONO film 20. The voltage relationship shown in FIG. 68 is used for electron injection.

The front word line WL2 is then selected and the data depending on trapped electrons in the ONO films 20 of the memory cells MC21 and MC22 is read. The data is latched. The read data is stored temporarily in the data holding circuit (different from sense amplifier S/A). Electrons are injected in the ONO film 20. A series of operations is repeated for four front word lines.

After the data is stored and electrons are injected for the four front word lines, the voltage of the back word line BWL1 is set to −3 V. The data of the memory cells connected to the front word line WL1 is read from the data holding circuit. The data is programmed back in the bodies as majority carriers. A series of such operations is repeated for the four front word lines. That operation is further repeated, so that the return operation is performed for all back word lines.

Figure 70:
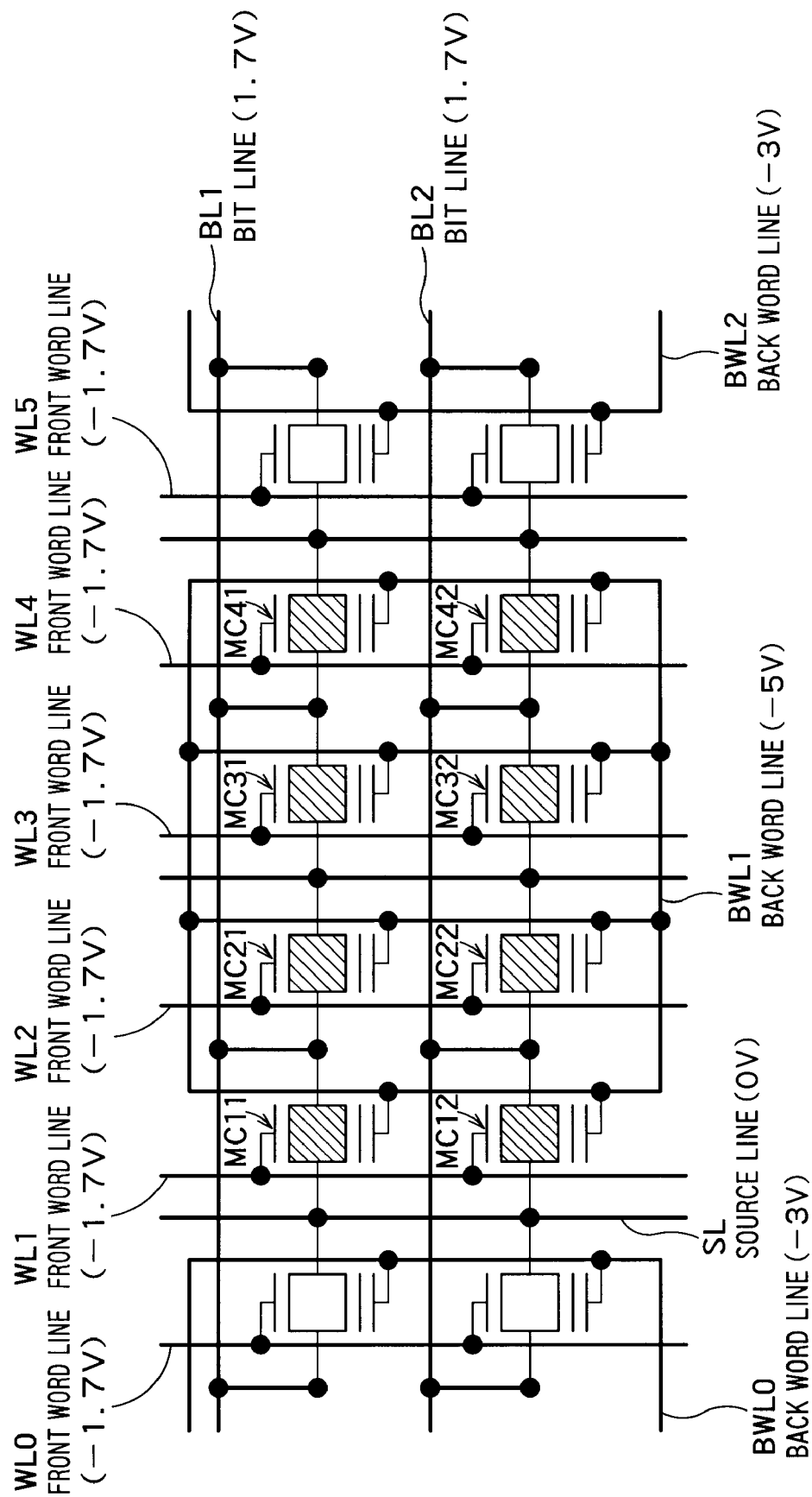
FIG. 70 is a diagram of the memory cell array showing the voltage relationship at the time of the erase mode.

In the erase mode, by selecting the back word line BWL1, four front word lines WL1 to WL4 are selected. The sense amplifier S/A reads the data in the bodies 50 of the memory cells MC11 to MC42 connected to the front word lines WL1 to WL4. The read data is stored temporarily in the data holding circuit (different from sense amplifier S/A). As shown in FIG. 70, a first voltage (e.g., 0 V) is applied to the source SL common to all memory cells. A second voltage lower than the first voltage (e.g., −1.7 V) is applied to the front word lines WL0 to WL5. A third voltage lower than the first voltage (e.g., −3 V) is applied to unselected back word lines BWL0 and BWL2. A fourth voltage lower than the third voltage (e.g., −5 V) is applied to a selected back word line BWL1. A fifth voltage higher than the first voltage (e.g., 1.7 V) is applied to the bit lines BL1 and BL2. Holes are thus injected in the ONO film 20 near the body-drain junction. Alternatively, holes are injected in the ONO film 20 by FN tunneling with 0 V of all bit lines. Hole injection in the ONO film 20 erases trapped electrons in the ONO film 20. After the trapped electrons are erased, the voltage of the selected back word line is set to −3 V. The data of the memory cells connected to the front word line WL1 is read from the data holding circuit. The sense amplifier S/A programs the data back in the respective bodies 50. A series of such operations is repeated for the four front word lines. That erase operation is performed for all back word lines.

According to the tenth embodiment, the back word line is provided so as to correspond to a plurality of front word lines. The balance between the parasitic resistance and parasitic capacitance of the back word line is set appropriately. The delay at the time of driving the back word line is reduced. If the back word line is provided for a plurality of front word lines, the number of increasing and decreasing the voltage of the back word line is decreased. Power consumption for operating the memory is thus reduced. As the back word line is provided so as to correspond to a plurality of front word lines, the probability of data loss is reduced as compared to the third embodiment, resulting in a reduction in frequency of the refresh operation. This leads high-speed operation of the memory.

Eleventh Embodiment

Figure 71:
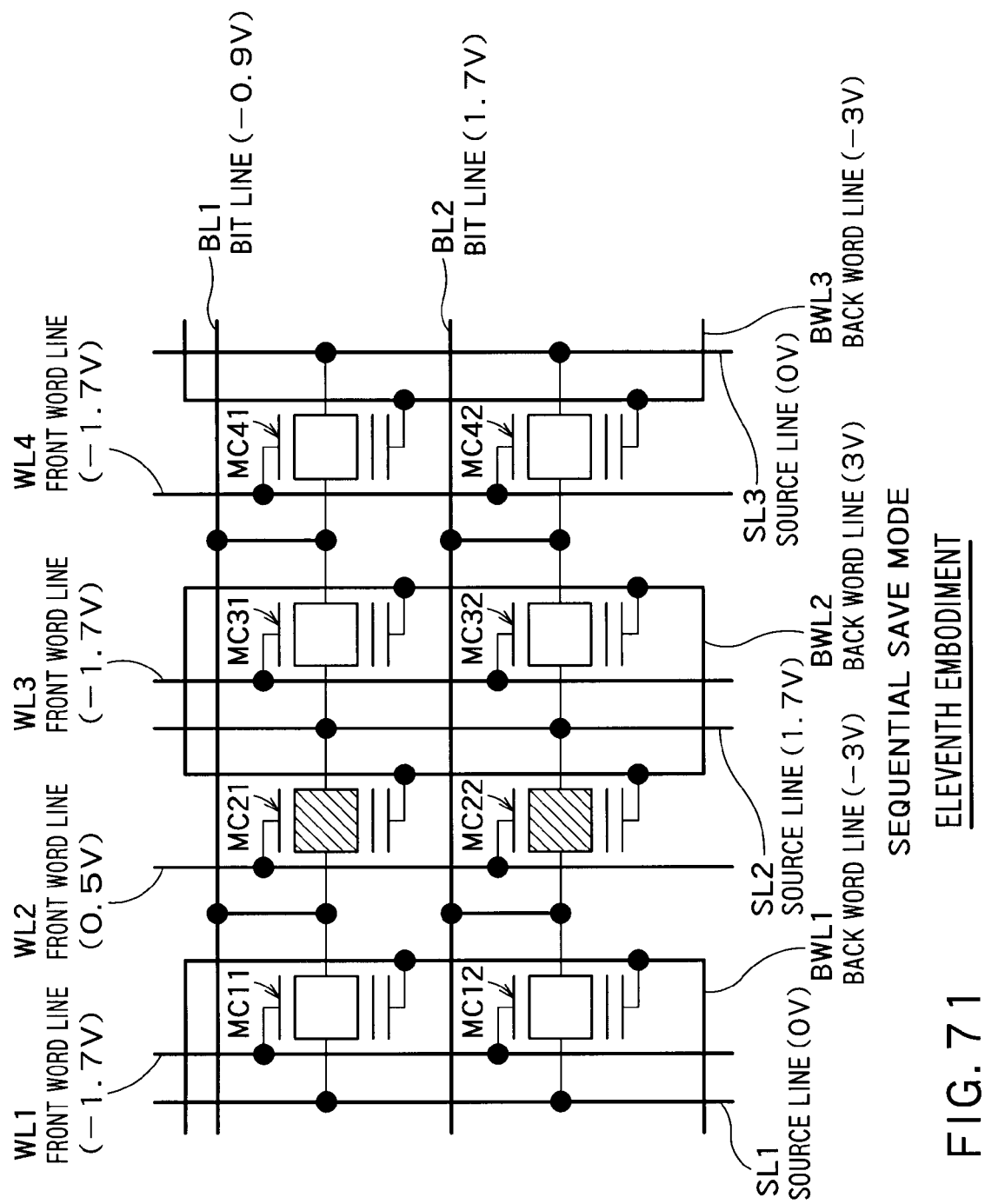
FIG. 71 is a diagram of a memory cell array according to an eleventh embodiment of the present invention.

FIG. 71 is a diagram of a memory cell array according to an eleventh embodiment of the present invention. The eleventh embodiment is different from the tenth embodiment in that the source line is driven selectively. FIG. 71 shows the voltage relationship when electrons are injected in the sequential save mode. In the eleventh embodiment, a memory cell MC21 storing the data "1" and a memory cell MC22 storing the data "0" are selected. A first voltage (e.g., 0 V) is applied to unselected source lines SL1 and SL3. A second voltage higher than the first voltage (e.g., 1.7 V) is applied to a selected source line SL2. A third voltage lower than the first potential (−1.7 V) is applied to unselected front word lines WL1, WL3, and WL4. A fourth voltage higher than the third voltage (e.g., 0.5 V) is applied to a selected front word line WL2. A fifth voltage lower than the first voltage (e.g., −3 V) is applied to unselected back word lines BWL1 and BWL3. A sixth voltage higher than the fourth voltage (e.g., 3 V) is applied to a selected back word line BWL2. A seventh voltage lower than the first voltage (e.g., −0.9 V) is applied to the bit line BL1 used for programming the data "1". The second voltage (e.g., 1.7 V) is applied to the bit line BL2 used for programming the data "0". Electrons are injected in the ONO film 20 of the memory cell MC21 based on the voltage relationship. Because the source voltage of the memory cell MC21 (1.7 V) is higher than the drain voltage (−0.9 V), electrons flow from the drain 40 to the source 60. Electrons are thus injected in the ONO film 20 near the body-source PN junction. The data "1" is programmed in the memory cell MC21. The source voltage of the memory cell MC22 (1.7 V) is equal to the drain voltage (1.7 V). Electrons are not injected in the ONO film 20 of the memory cell MC22. The data "0" is stored in the memory cell MC22. After the data are programmed, the voltage of the back word line BWL2 is returned to −3 V, while the voltage of the front word line WL2 to −1.7 V. The sequential save operation is repeated sequentially for all front word lines in the memory cell array.

In the eleventh embodiment, the source line is driven selectively. As described in the modified example of the third embodiment, a high voltage (2.6 V in FIG. 71) is applied between the source and the drain without data loss caused by bit line disturbance. The back word line is provided so as to correspond to a plurality of front word lines and driven selectively. As described in the tenth embodiment, the risk of data loss due to disturb by the back gate is reduced. The save mode is thus completed in a short time.

Figure 72:
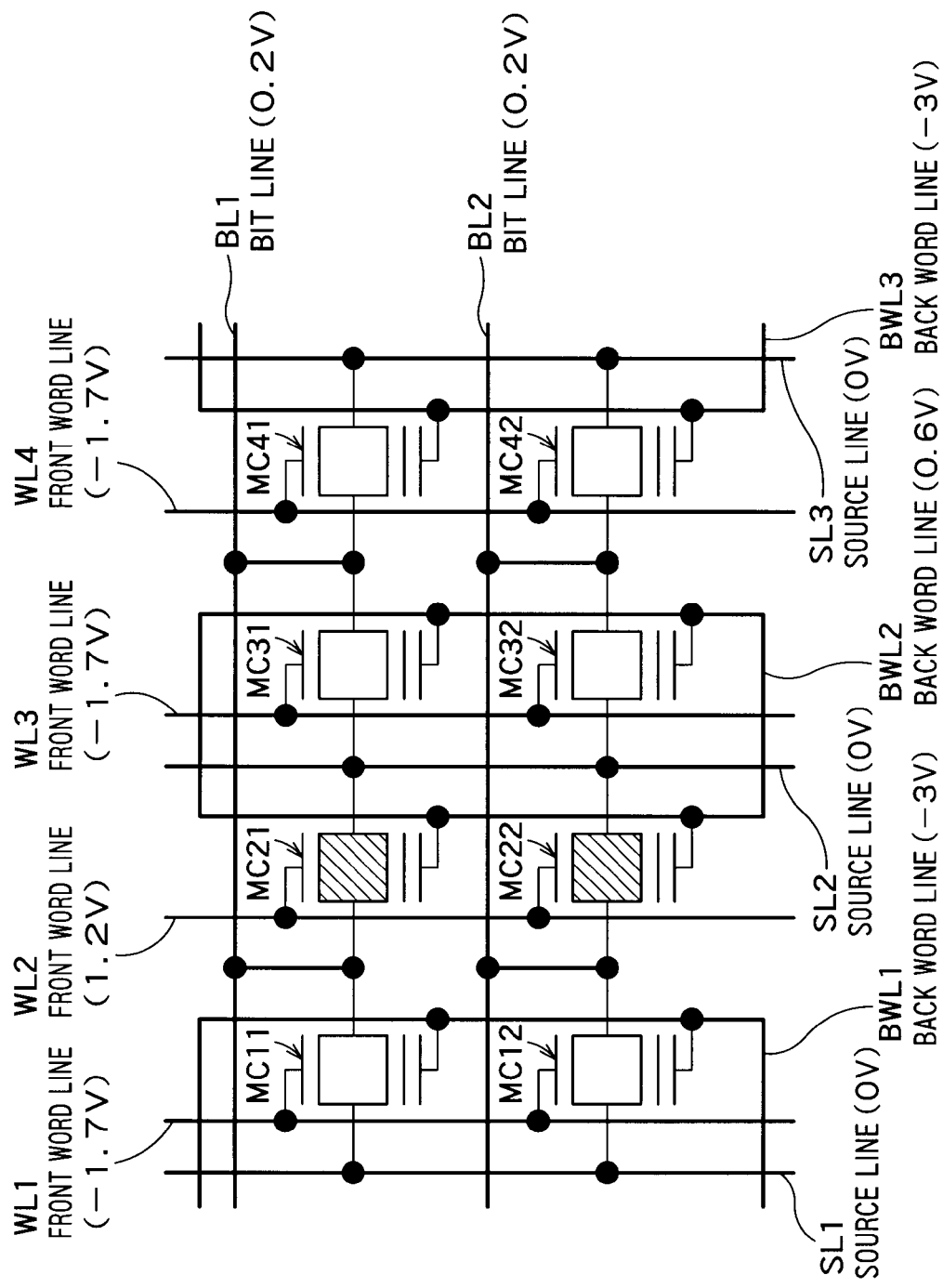
FIG. 72 is a diagram of the memory cell array showing the voltage relationship at the time of data reading operation in the sequential return mode.

FIG. 72 is a diagram of the memory cell array showing the voltage relationship at the time of data reading operation in the sequential return mode. The memory cells MC21 and MC22 are selected in FIG. 72. A first voltage (e.g., 0 V) is applied to the source lines SL1 to SL3. A second voltage lower than the first potential (e.g., −1.7 V) is applied to unselected front word lines WL1, WL3, and WL4. A third voltage higher than the second voltage (e.g., 1.2 V) is applied to a selected front word line WL2. A fourth voltage lower than the first voltage (e.g., −3 V) is applied to unselected back word lines BWL1 and BWL3. A fifth voltage higher than the fourth voltage (e.g., 0.6 V) is applied to a selected back word line BWL2. A sixth voltage different from the first voltage (e.g., 0.2 V) is applied to the bit lines BL1 and BL2. Based on the voltage relationship, the sense amplifier S/A reads the data depending on trapped electrons in the ONO films 20 of the memory cells MC21 and MC22 and latches the data. If the data is "0", the sense amplifier S/A injects electrons in the ONO film 20 of the corresponding memory cell. If the data is "1", the sense amplifier S/A does not inject electrons because trapped electrons have already been injected in the ONO film 20. The voltage relationship shown in FIG. 71 is utilized for electron injection. After electrons are injected, the voltage of the back word line WL2 is set to −3 V.

The sense amplifier S/A then programs the latched data back in the bodies 50 of the memory cells. The method for programming back is the same as in conventional FBC memories. The data depending on majority carriers in the body 50 is held as in the memory cells MC21 and MC 22 shown in FIG. 71. The return operation is performed for memory cells connected to a front word line and then the refresh operation is performed. The refresh operation is performed for memory cells holding data depending on majority carriers in the respective bodies 50 like the memory cells MC21 and MC 22. The return operation is performed for all front word lines and the sequential return mode is thus completed.

Figure 73:
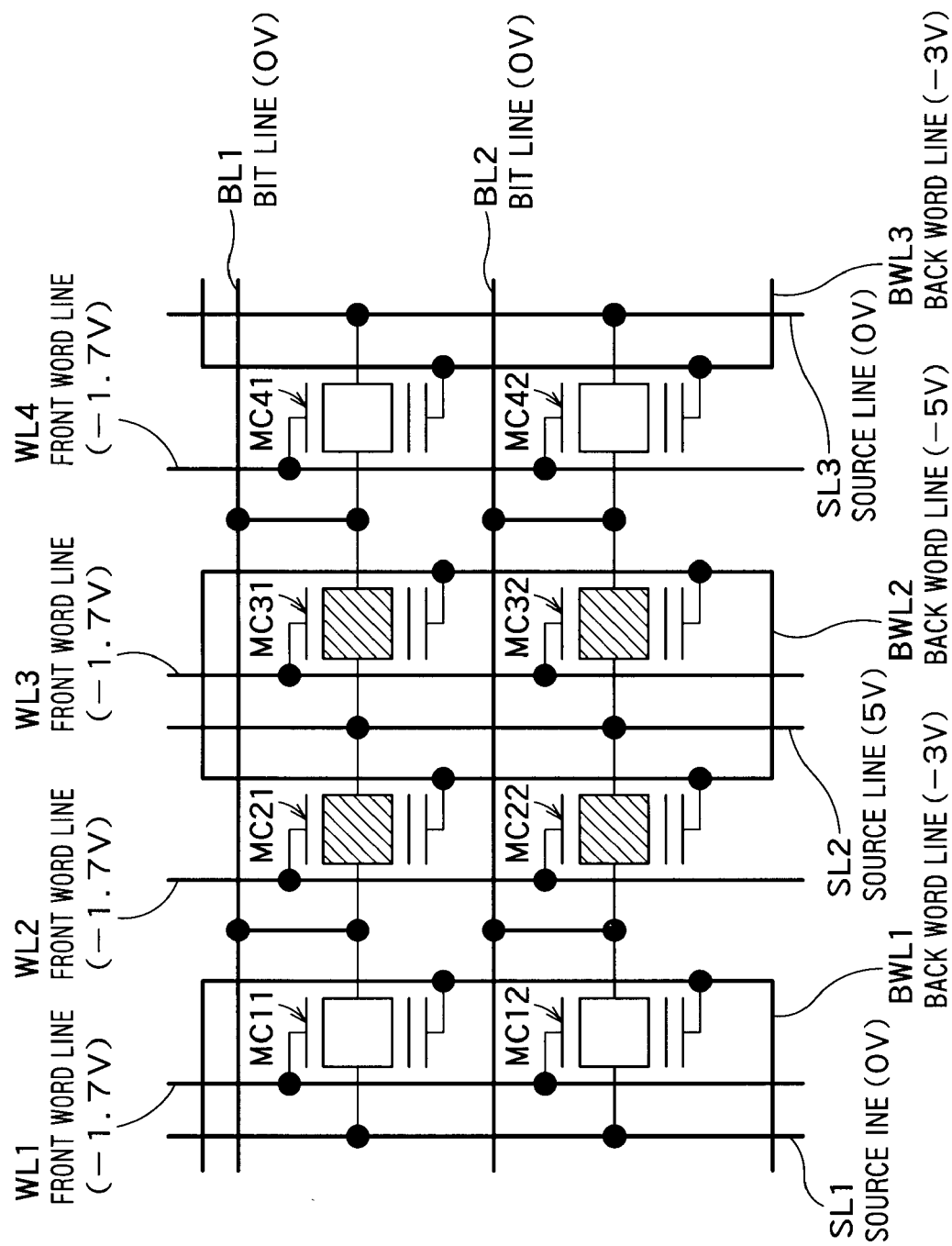
FIG. 73 is a diagram of the memory cell array showing the voltage relationship at the time of the erase mode.

In the erase mode, by selecting the source line SL2 and the back word line BWL2, a pair of the front word lines WL2 and WL3 is selected. The sense amplifier S/A reads the data in the bodies 50 of the memory cells MC21, MC22, MC31, and MC32 connected to the front word lines WL2 and WL3. The read data is stored temporarily in a data holding circuit (different from sense amplifier S/A). As shown in FIG. 73, a first voltage (e.g., 0 V) is applied to unselected source lines SL1 and SL3. A second voltage higher than the first voltage (e.g., 5 V) is applied to the selected source line SL2. A third voltage lower than the first voltage (e.g., −1.7 V) is applied to the front word lines WL1 to WL4. A fourth voltage lower than the first voltage (e.g., −3 V) is applied to unselected back word lines BWL1 and BWL3. A fifth voltage lower than the fourth voltage (e.g., −5 V) is applied to the selected back word line BWL2. The first voltage (e.g., 0 V) is applied to the bit lines BL1 and BL2. Holes are thus injected in the ONO film 20 near the body-source junction. Hole injection in the ONO film 20 erases trapped electrons in the ONO film 20. After the trapped electrons are erased, the voltage of the selected back word line is set to −3 V. The sense amplifier S/A reads the data from the data holding circuit and programs the data back in the respective bodies 50. The erase operation is performed for all front word lines. The eleventh embodiment achieves the effects of both the modified example of the third embodiment and the tenth embodiment.

Figure 74:
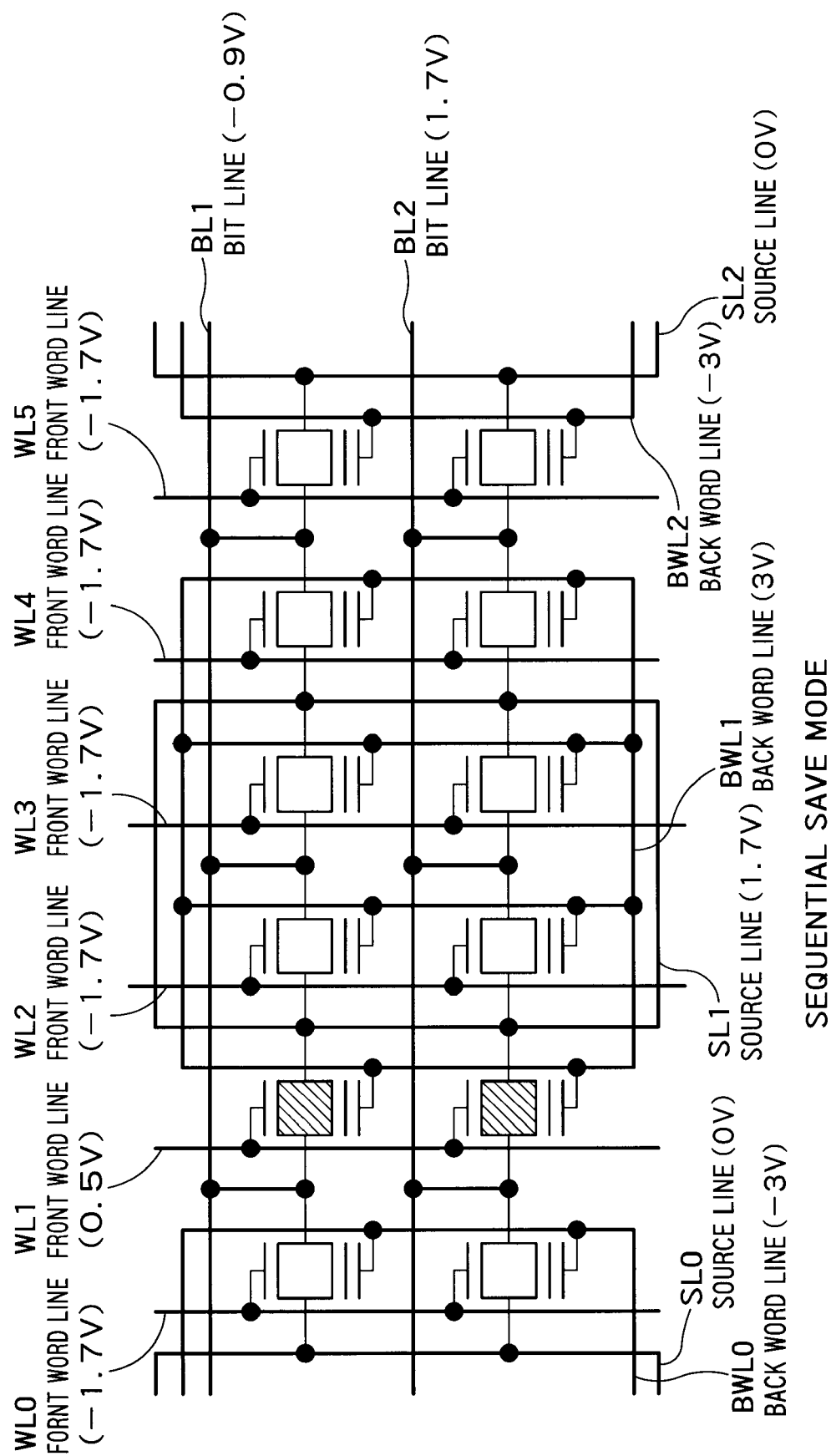
FIG. 74 is a diagram of the memory cell array showing the voltage relationship of the sequential save mode according to the eleventh embodiment.
Figure 75:
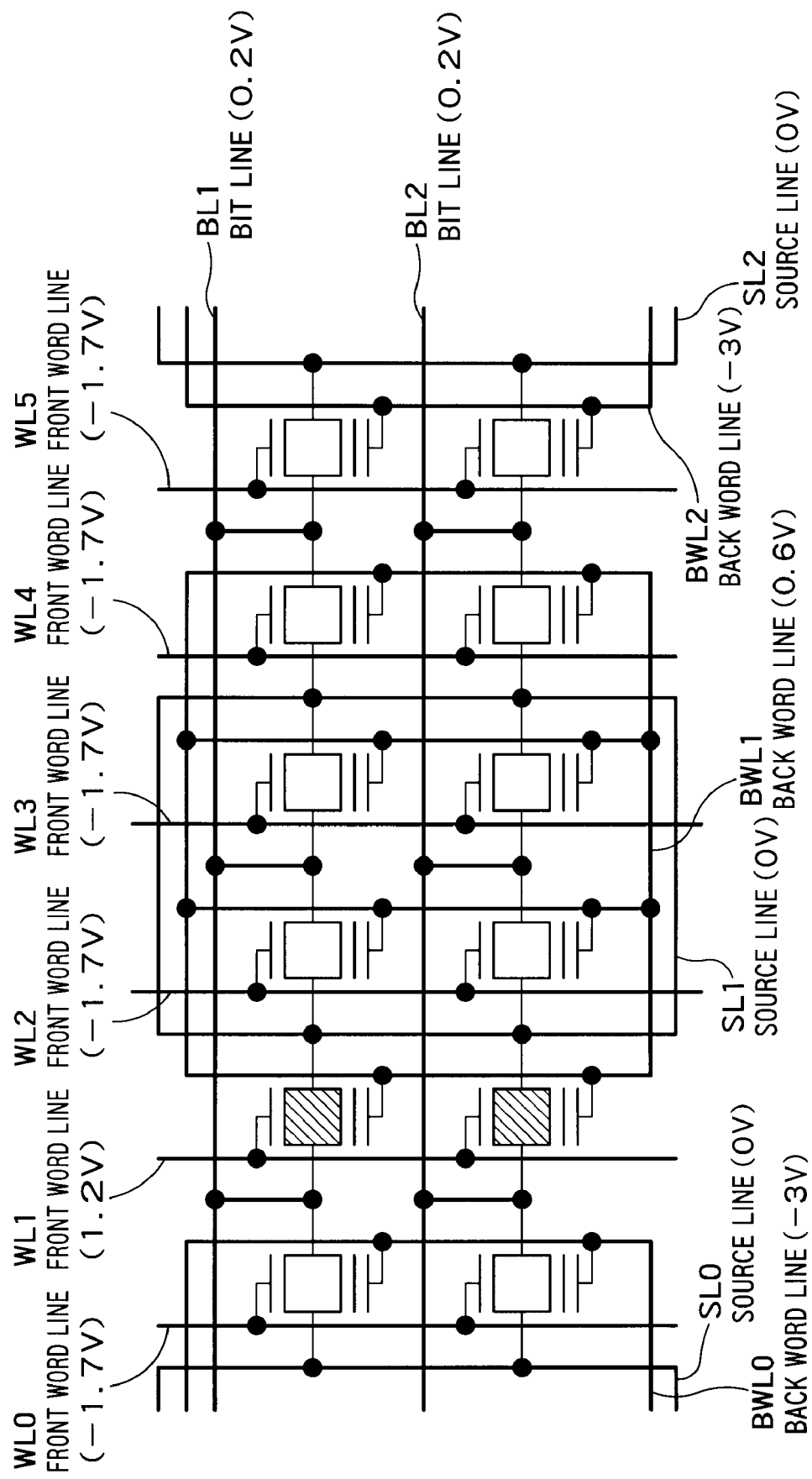
FIG. 75 is a diagram of the memory cell array showing the voltage relationship at the time of data reading operation in the sequential return mode.
Figure 76:
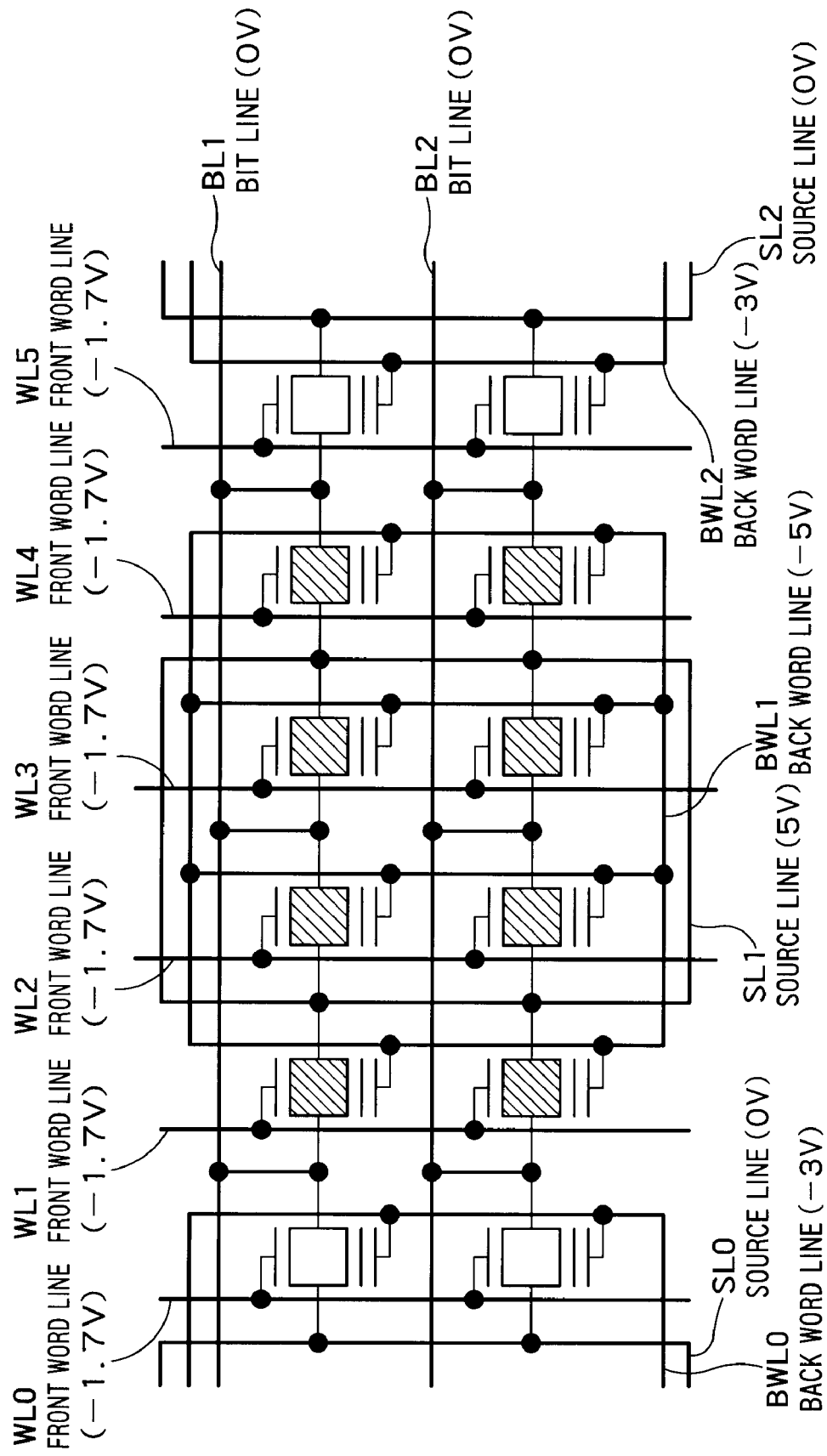
FIG. 76 is a diagram of the memory cell array showing the voltage relationship at the time of the erase mode.

With reference to FIGS. 74 to 76, a modified example of the eleventh embodiment is shown that the back word line is provided so as to correspond to four front word lines. This modified example is a combination of the third embodiment and the modified example of the tenth embodiment. The time required for the erase mode is further reduced. FIG. 74 shows the voltage relationship during the sequential save mode, FIG. 75 the voltage relationship during the sequential return mode, and FIG. 76 the voltage relationship during the erase mode.

Because the eleventh embodiment is conceived easily from the third embodiment and the modified example of the tenth embodiment shown in FIGS. 73 to 76, its detailed description will be omitted. Shaded memory cells shown in FIGS. 74 to 76 are selected memory cells.

Twelfth Embodiment

While the above description have been made by taking a planar transistor manufactured by a simple method as an example, the charge trapping film is applied to FBCs utilizing, e.g., a FIN transistor (i.e., transistor that has side channels and horizontal current flows) and a vertical transistor (transistor that has side channels and vertical current flows).

Figure 77:
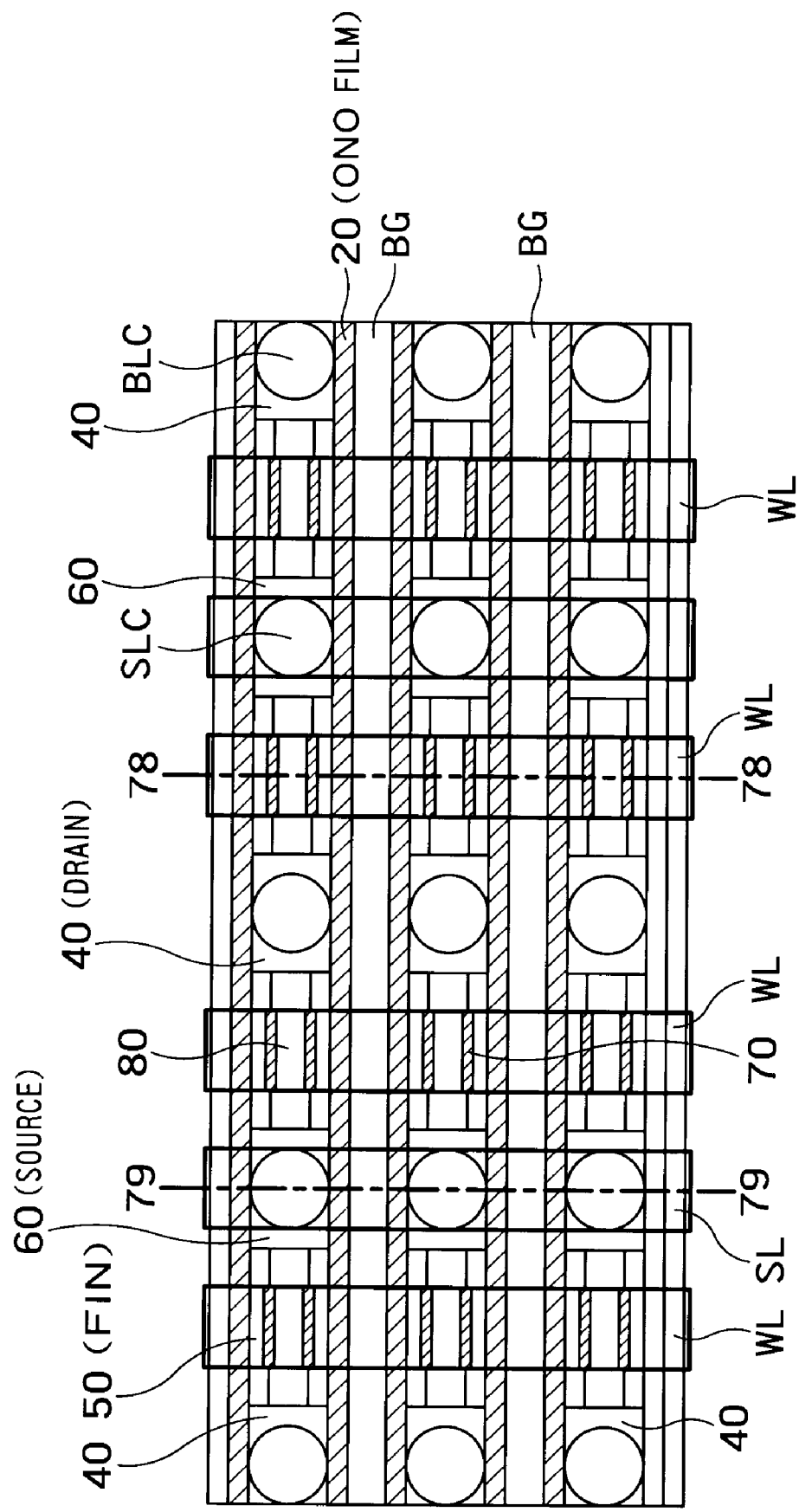
FIG. 77 is a plan view of an FBC memory utilizing FIN transistors.
Figure 78:
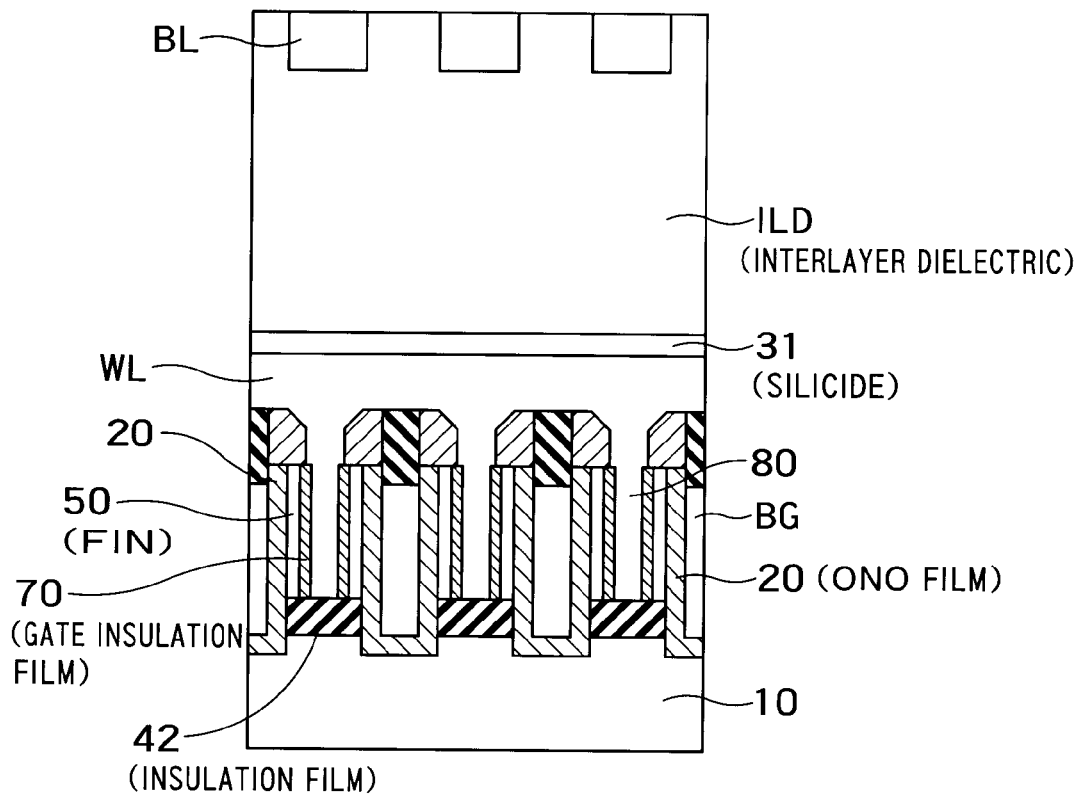
FIGS. 78 and 79 are cross-sectional views along the lines 78-78 and 79-79 shown in FIG. 77.
Figure 79:
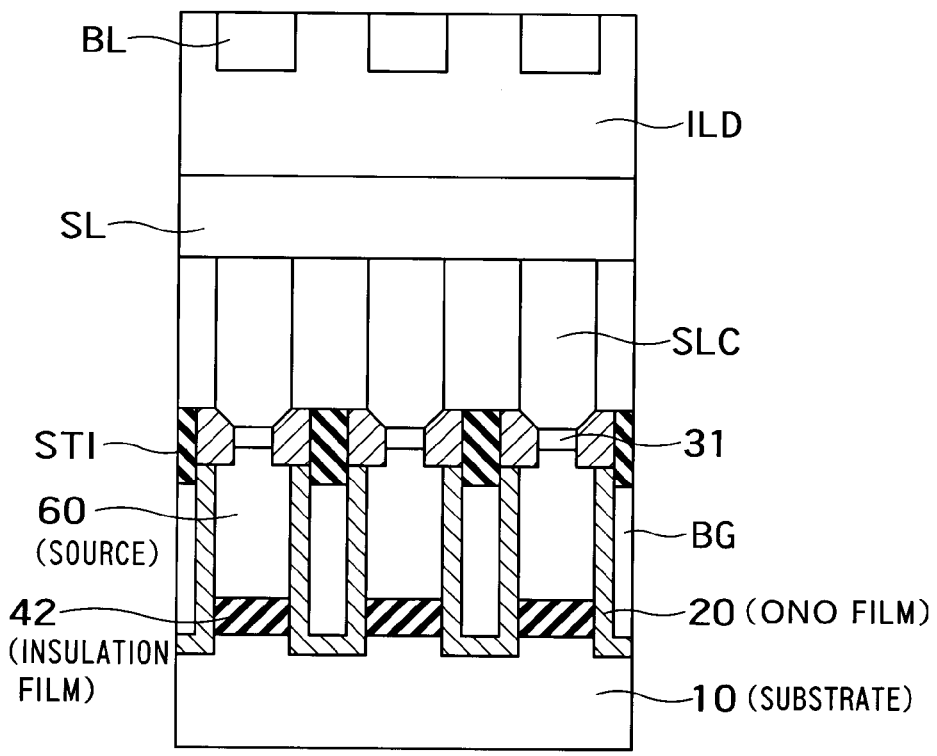

FIG. 77 is a plan view of an FBC memory utilizing FIN transistors. FIGS. 78 and 79 are cross-sectional views along the lines 78-78 and 79-79 shown in FIG. 77, respectively.

The FIN transistor includes a semiconductor substrate 10, a FIN body 50 provided on the semiconductor substrate 10, an ONO film 20 serving as the charge trapping film in contact with a first surface of the FIN body 50, a gate insulating film 70 contacting a second surface of the FIN body 50, a back gate BG in contact with the ONO film 20, a word line WL in contact with the gate insulating film 70, and the source 60 and the drain 40 formed in the FIN body 50. The FIN body 50 is placed between the drain 40 and the source 60 and in an electrically floating state.

The FBC memory shown in FIG. 77 has the same back gate. For example, the operation described in the third embodiment is thus implemented. The back gate can be provided for each front word line or for a plurality of front word lines. The above embodiments are accomplished by using the FIN FBC.

The FIN FBC memory of the twelfth embodiment performs the save mode, the return mode, and the erase mode described in the above embodiments. The twelfth embodiment thus achieves the same effects as in the above embodiments.

The invention claimed is:

1. A semiconductor memory device comprising:
a semiconductor layer;
a charge trapping film provided on a first surface of the semiconductor layer;
a gate insulating film provided on a second surface opposing the first surface of the semiconductor layer;
a back gate provided on the charge trapping film;
a front gate provided on the gate insulating film;
a source and a drain formed in the semiconductor layer; and
a body region which is provided between the drain and the source, the body region being in an electrically floating state, wherein
the semiconductor memory device includes a first storage state for storing data depending on the number of majority carriers in the body region and a second storage state for storing data depending on the amount of charges in the charge trapping film, and
the semiconductor memory device is shifted from the first storage state to the second storage state by converting the number of majority carriers in the body region into the amount of charges in the charge trapping film or from the second storage state to the first storage state by converting the amount of charges in the charge trapping film into the number of majority carriers in the body region.

2. The semiconductor memory device according to claim 1 further comprising:
a bit line connected to the drain; and
a source line connected to the source, wherein voltages are applied between the front gate and the back gate, the drain and the back gate, and the source and the back gate, so that the number of majority carriers in the body region of a memory cell is converted into the amount of charges in the charge trapping film, the memory cell including the source, the drain, the body region, the charge trapping film, the gate insulating film, the back gate, and the front gate.

3. The semiconductor memory device according to claim 1, wherein a plurality of memory cells are arranged in a matrix, each memory cell including the source, the drain, the body region, the charge trapping film, the gate insulating film, the back gate, and the front gate,
the semiconductor memory device further comprising:
a plurality of bit lines connected to the drains of the memory cells arranged in a column direction; and
a source line connected to the sources, wherein
a plurality of the front gates are arranged in a column direction,
voltages are applied to a first front gate of the plurality of front gates and to a first bit line of the plurality of bit lines, so that charges are injected in the charge trapping film of a first memory cell connected to the first front gate and the first bit line.

4. The semiconductor memory device according to claim 1, further comprising:
a plurality of memory cells arranged in a matrix, each memory cell including the source, the drain, the body region, the charge trapping film, the gate insulating film, the back gate, and the front gate,
a plurality of bit lines connected to the drains arranged in a column direction; and
a plurality of source lines connected to the sources arranged in a row direction,
wherein
voltages are applied to a first bit line of the plurality of bit lines and to a first source line of the plurality of source lines, so that charges are injected in the charge trapping film of a first memory cell connected to the first bit line and the first source line.

5. The semiconductor memory device according to claim 3 further comprising sense amplifiers provided for the bit lines, wherein
a first sense amplifier of the sense amplifiers connected to the first bit line identifies data of memory cells in the first storage state for each of the front gates and shifts the memory cells to the second storage state selectively based on the data,
or the first sense amplifier connected to the first bit line identifies data of the memory cells in the second storage state for each of the front gates and shifts the memory cells to the first storage state selectively based on the data.

6. The semiconductor memory device according to claim 1 further comprising:
a plurality of memory cells arranged in a matrix, each memory cell including the source, the drain, the body region, the charge trapping film, the gate insulating film, the back gate, and the front gate;
a plurality of bit lines connected to the drains arranged in a column direction;
a source line connected to the sources; and
sense amplifiers provided for the bit lines, wherein
a first sense amplifier of the sense amplifiers performs a charge injection operating injecting charges in the charge trapping film of a first memory cell of the memory cells, then the first sense amplifier performs a restore operation reading data based on the first storage state of a second memory cell, and writing the data back in the second memory cell.

7. The semiconductor memory device according to claim 6, wherein after injecting charges in the charge trapping film of the first memory cell, charges are injected again in the charge trapping film of the first memory cell, when a current flowing in the first memory cell at the time of data reading is smaller than a predetermined target value.

8. The semiconductor memory device according to claim 6, wherein the charge injection operation to the first memory cell is divided into a plurality of sub-injection operations, the restore operation to the second memory cell being performed between the sub-injection operations.

9. The semiconductor memory device of claim 1, wherein a plurality of memory cells are arranged in a matrix, each memory cell including the source, the drain, the body region, the charge trapping film, the gate insulating film, the back gate, and the front gate, the semiconductor memory device further comprising:
a plurality of bit lines connected to the drains of the memory cells arranged in a column direction; and
a source line connected to the sources,
wherein
a plurality of the front gates are arranged in a column direction,
a plurality of back gates are provided so as to correspond to the front gates,
voltages are applied to a first front gate of the plurality of front gates and to a first back gate of the plurality of back gates and to a first bit line of the plurality of bit lines to inject charges in the charge trapping films of a memory cell connected to the first front gate, the first back gate and the first bit line.

10. The semiconductor memory device according to claim 9 further comprising sense amplifiers provided for the bit lines, wherein a first sense amplifier of the sense amplifiers connected to the first bit line identifies data of memory cells in the first storage state for each of the front gates and shifts the memory cells to the second storage state selectively based on the data, or the first sense amplifier connected to the first bit line identifies data of memory cells in the second storage state for each of the front gates and shifts the memory cells to the first storage state selectively based on the data.

11. The semiconductor memory device according to claim 9 further comprising sense amplifiers provided for the bit lines, wherein a first sense amplifier of the sense amplifiers connected to the first bit line injects charges in the charge trapping film of a first memory cell of the memory cells connected to the first front gate, then read data based on the first storage state of a second memory cell of the memory cells which is connected to a second front gate different from the first front gate, and the first sense amplifier restores the data back in the second memory cell.

12. The semiconductor memory device of claim 1, wherein, when data of a memory cell in the first storage state is read, the back gate is biased to a polarity opposite to that of the majority carriers with respect to the source potential.

13. The semiconductor memory device according to claim 1, wherein, when data of a memory cell in the second storage state is read, a voltage is applied to the back gate so that the first surface of the body region is depleted.

14. The semiconductor memory device according to claim 1 wherein charges in the charge trapping film are placed near the junction between the source and the body region or near the junction between the drain and the body region in the second storage state.

15. A semiconductor memory device comprising:
a semiconductor layer;
a charge trapping film provided on a first surface of the semiconductor layer;
a gate insulating film provided on a second surface opposing the first surface of the semiconductor layer;
a back gate provided on the charge trapping film;
a front gate provided on the gate insulating film;
a source and a drain formed in the semiconductor layer; and
a body region which is provided between the drain and the source, the body region being in an electrically floating state, wherein
the semiconductor memory device includes a first storage state for storing data depending on the number of majority carriers in the body region and a second storage state for storing data depending on the amount of charges in the charge trapping film, and
the data is stored in both states of the first storage state and the second storage state.

16. The semiconductor memory device of claim 15, further comprising:
a plurality of memory cells arranged in a matrix, each memory cell including the source, the drain, the body region, the charge trapping film, the gate insulating film, the back gate, and the front gate,
a plurality of bit lines connected to the drains of the memory cells arranged in a column direction; and
a source line connected to the sources,
wherein
a plurality of the front gates are arranged in a column direction,
a plurality of back gates are provided so as to correspond to the front gates,
voltages are applied to a first front gate of the plurality of front gates and to a first back gate of the plurality of back gates and to a first bit line of the plurality of bit lines to inject charges in the charge trapping films of a memory cell connected to the first front gate, the first back gate and the first bit line.

17. The semiconductor memory device according to claim 15, wherein,
the semiconductor memory device converts the number of majority carriers in the body region into the amount of charges in the charge trapping film or converts the amount of charges in the charge trapping film into the number of majority carriers in the body region.

18. The semiconductor memory device of claim 15, wherein, when data of a memory cell in the first storage state is read, the back gate is biased to a polarity opposite to that of the majority carriers with respect to the source potential.

19. The semiconductor memory device according to claim 15, wherein, when data of a memory cell in the second storage state is read, a voltage is applied to the back gate so that the first surface of the body region is depleted.

20. The semiconductor memory device according to claim 15 wherein charges in the charge trapping film are placed near the junction between the source and the body region or near the junction between the drain and the body region in the second storage state.

* * * * *